(12) United States Patent
Williams et al.

(10) Patent No.: US 7,203,881 B1
(45) Date of Patent: Apr. 10, 2007

(54) SYSTEM AND METHOD FOR SIMULATING SYSTEM OPERATION

(75) Inventors: Emrys Williams, Milton Keynes (GB); Andrew Rudoff, Boulder, CO (US)

(73) Assignee: Sun Microsystems, Inc., Santa Clara, CA (US)

( * ) Notice: Subject to any disclaimer, the term of this patent is extended or adjusted under 35 U.S.C. 154(b) by 305 days.

(21) Appl. No.: 10/880,031

(22) Filed: Jun. 29, 2004

(51) Int. Cl.
*G06F 11/00* (2006.01)
*G06F 11/30* (2006.01)
*G06F 15/00* (2006.01)

(52) U.S. Cl. .................. 714/741; 714/33; 702/185

(58) Field of Classification Search ............. None
See application file for complete search history.

(56) References Cited

U.S. PATENT DOCUMENTS

| | | | |
|---|---|---|---|
| 5,544,308 | A | 8/1996 | Giordano et al. |
| 5,561,762 | A | 10/1996 | Smith et al. |
| 5,587,930 | A | 12/1996 | Hori et al. |
| 5,596,712 | A | 1/1997 | Tsuyama et al. |
| 5,926,621 | A | 7/1999 | Schwarz et al. |
| 5,950,183 | A | 9/1999 | Minobe et al. |
| 6,343,236 | B1 | 1/2002 | Gibson et al. |
| 6,643,592 | B1 | 11/2003 | Loman et al. |
| 6,813,634 | B1 | 11/2004 | Ahmed |
| 6,907,545 | B2 | 6/2005 | Ramadei et al. |
| 2004/0205681 | A1* | 10/2004 | Nozuyama ............. 716/4 |
| 2005/0102567 | A1 | 5/2005 | McGuire et al. |

OTHER PUBLICATIONS

W.G. Fenton, T.M. McGinnity, L.P. Maguire. Fault Diagnosis of Electronic Systems Using Intelligent Techniques: A Review. *IEEE Transactions on Systems, Man and Cybernetics*, vol. 31, No. 3, pp. 269-281, Aug. 2001

Armando Fox, et al., "Self-Repairing Computers," Scientific American.com, May 12, 2003, 6 pages.

James Carlin Becker, et al., "A Practical Approach to Failure Mode, Effects and Criticality Analysis (FMECA For Computer Systems," IEEE, 1997, pp. 228-236.

John B. Bowles, "The New SAE FMECA Standard," 1998 Proceedings Annual Reliability and Maintainability Symposium, 1998, IEEE, pp. 48-53.

(Continued)

*Primary Examiner*—Christine T. Tu
(74) *Attorney, Agent, or Firm*—Robert C. Kowert; Meyertons, Hood, Kivlin, Kowert & Goetzel, P.c.

(57) ABSTRACT

One embodiment of the invention provides a method for simulating the operation of a system. The method includes providing a fault tree representation of the system. The fault tree defines a set of problems that may occur in the system, and specifies propagations in the system whereby a problem may create one or more errors that may in turn be detected by error detectors to produce corresponding error reports. The fault tree representation allows the presence of a problem in the system to be simulated, and the set of error reports resulting from the simulated problem to be determined. This simulation can be repeated for different problems to compare the sets of error reports potentially produced by the different problems.

25 Claims, 31 Drawing Sheets

OTHER PUBLICATIONS

Charles F. Eubanks, et al., "Advanced Failure Modes and Effects Analysis Using Behavior Modeling," ASME, 1997, 10 pages.

"Failure Modes, Effects and Criticality Analysis," ReliaSoft, Quarter 3, 2002, vol. 3, Issue 2, 6 pages.

"Military Standard: Procedures for Performing a Failure Mode, Effects and Criticality Analysis," Nov. 1980, AMSC, 50 pages.

P.L. Clemens, "Fault Tree Analysis," Jacobs Sverdrup, Feb. 2002, $4^{th}$ Edition, 94 pages.

* cited by examiner

SYSTEM AND METHOD FOR SIMULATING SYSTEM OPERATION

RELATED CASES

The present application is related to the following applications, filed on the same day as the present application by the same inventors, and assigned to the same assignee:

"A System and Method for Providing a Data Structure representative of a Fault Tree" (Sun P5734)

"A System and Method for Generating a Data Structure Representative of a Fault Tree" (Sun P9147)

"A System and Method for Automated Problem Diagnosis" (Sun P9145)

"A System and Method for Performing Automated System Management" (Sun P9146)

The teachings of all the above applications are incorporated herein by reference.

FIELD OF THE INVENTION

The present invention relates to the fault trees, especially for use in complex systems such as computers.

BACKGROUND OF THE INVENTION

Reliability analysis is an important branch of engineering. Thus poor product reliability can lead to a variety of problems including customer dissatisfaction and excessive repair and service costs. These costs may of course fall to the manufacturer under various warranty provisions. On the other hand, having unnecessarily high reliability may also be unattractive. For example, consider a system that needs only one operable power supply in order to function correctly. Such a system may be provided with a secondary or backup power supply that can then be utilised should the original (primary) power supply fail. However, what if the secondary power supply were also to fail? One possibility is to include several backup power supplies, in case of multiple failure. However, the likelihood of such a multiple failure may be exceedingly small. The provision of more than one backup power supply may not be economically worthwhile. In other words, the increased cost of the additional backup components may not be justified by the marginal increase in reliability thereby obtained.

Of course, the trade-off between reliability and cost will vary according to the particular circumstances. In safety critical applications, such as aeroplanes, reliability is of the utmost importance. In contrast, for computing systems, reliability requirements typically vary according to the type of machine. Thus certain server machines may be vital to the operation of a business (such as to take orders, to process accounts, and so on), and are therefore expected to have 24×7 availability. In contrast, an organisation may well be prepared to tolerate the occasional failure of individual desktop machines.

Various methodologies have been developed for analysing and predicting reliability at the design stage. One known approach is known as Failure Modes Effects and Criticality Analysis (FMECA), which is the subject of various formal standards, such as British Standard BS 5760, and US military standard US MIL STD 1629. In FMECA, likelihood of occurrence is normally quantified by a failure rate value, and a numerical value is assigned to the severity of each failure. Combining these two values then gives an indication of criticality—i.e. those components that are both important to the correct operation of the system, and are also most likely to fail. Note that an individual component may have multiple failure modes, all of which need to be taken into consideration (for example, a tyre may burst, or its tread may become worn away).

FMECA includes studying the expected propagation of errors through the system. Thus following through the above example, continued vehicle operation with a worn tyre may be temporarily tolerated, albeit with reduced safety margin, whereas a burst tyre may render the whole vehicle unusable (i.e. has a high severity). This latter consideration therefore provides motivation for providing most vehicles with a spare tyre.

Another design tool that is sometimes used in reliability studies is fault tree analysis. Fault tree analysis generally starts with various system level observations of difficulties (known as consequences or events), and then tries to trace back to the underlying causes, potentially through a whole tree of such causes. For example, a failure of a lamp to operate may reflect a broken bulb, or a problem with the power supply to the lamp. The problem with the power supply may perhaps in turn be due to a broken flex, or may instead possibly reflect a human or operator failure, such as nobody having plugged the lamp into an electric power socket.

This sort of analysis allows a fault tree for a given device or system to be constructed. One formal, quantitative approach to this analysis uses Boolean algebra, in which a probability may be assigned to each underlying cause. This data then allows the likelihood of various system failures to be estimated.

Fault tree analysis and FMECA are generally regarded as complementing one another. Thus whereas FMECA may be considered as a "bottom-up" approach (starting at the component level and then determining the impact of component failures on the overall system), fault tree analysis is more of a "top-down" approach. Further details about FMECA and fault tree analysis are available in various textbooks such as: "Reliability Analysis for Engineers: An Introduction" by Roger D Leitch, Oxford Science Publications, 1995, ISBN 019 856371 X.

Although FMECA and fault tree analysis are well-established techniques, they are often seen purely as abstract design tools, somewhat disconnected from the real world development of a product itself. Sometimes reliability analysis is just performed as a "tick-in-the-box" type requirement during the development phase, with only marginal relevance to the actual product. The reliability analysis is often then filed and forgotten about during the subsequent operational lifetime of the product.

Nevertheless, system reliability remains extremely important. This is especially true in the computing field, where system crashes, freezes, bugs and other failures are worryingly common. In the article "Self-Repairing Computers" by Fox and Patterson, Scientific American, June 2003, pages 42–48, various strategies for combating this unreliability are discussed, particularly for software.

One approach discussed in the article is to monitor components involved in various operations on the system, and to determine on a statistical basis using data mining techniques those (sub)components that may be responsible for any observed failures. This approach eschews the use of any prior knowledge about the system architecture in order to maximise flexibility. On the other hand, such a philosophy also makes the diagnosis problem much harder (if not impossible), and certainly more time-consuming.

Another approach discussed in the article is the provision of an "Undo" command to restore the system to an earlier, presumably correct, status. Unfortunately, this strategy is not effective against (persistent) hardware faults. In many situations, it may be difficult to ascertain whether a particular failure is caused by a software or hardware malfunction.

Thus although there are a variety of known strategies to improve reliability for computer systems, both at run-time and also through the design process, to date these have met with only limited success and application.

SUMMARY OF THE INVENTION

Accordingly, one embodiment of the invention provides a system and a method for simulating the operation of a system. The method includes providing a fault tree representation of the system that defines a set of problems that may occur. The fault tree further specifies propagations in the system, whereby a problem may create one or more errors that may in turn be detected by error detectors to produce corresponding error reports. The fault tree representation allows the presence of a problem in the system to be simulated, and the set of error reports resulting from the simulated problem to be determined. This simulation can be repeated for different problems to compare the sets of error reports potentially produced by the different problems.

The sets of error reports for the various simulated problems can be compared directly, or can be input to a diagnosis algorithm. This can help to identify problems that can lead to the same set of detected problems, or the same diagnosis. This can then be used to determine whether and where to include additional error detectors in the system, in order to be able to distinguish better between different problems that may occur in the system.

BRIEF DESCRIPTION OF THE DRAWINGS

Various embodiments of the invention will now be described in detail by way of example only with reference to the following drawings in which like reference numerals pertain to like elements and in which.

DETAILED DESCRIPTION

1. Glossary and Fundamental Concepts

Figure 1A:
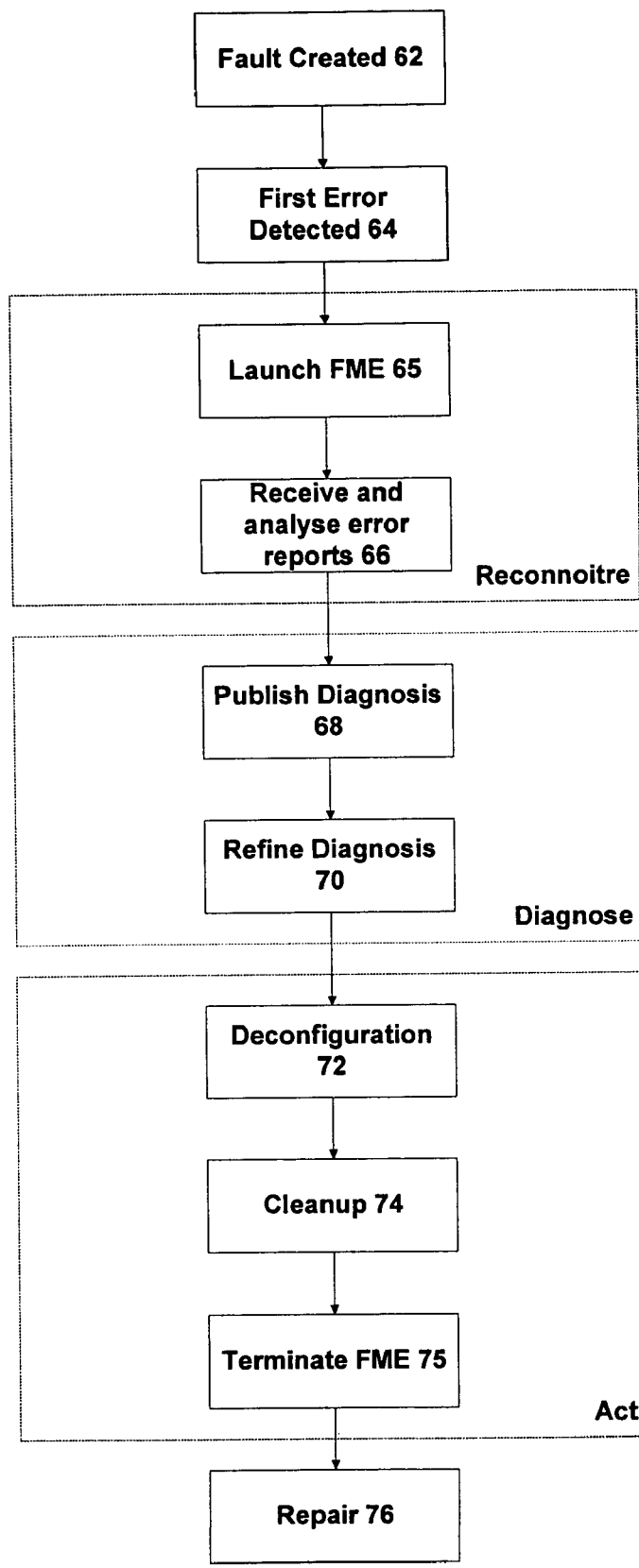
FIG. 1A provides a high-level flowchart depicting a fault management exercise in accordance with one embodiment of the invention.

There is no universally agreed set of terminology in the general field of reliability engineering or in the particular subject of fault management. The following glossary presents definitions reflecting the terminology adopted herein. Note that other authors may assign different meanings (or shades of meanings) to these terms.

In addition, the glossary also contains some discussion of the concepts underlying the various terms in accordance with one embodiment of the present invention. The definitions and concepts are introduced here primarily in the context of computer systems, although it will be appreciated that they apply more generally across a wide range of engineering technologies.

Defect: A defect represents a design flaw in a system that causes the system to behave in an unexpected manner. An example of a hardware defect might be two lines on a printed circuit board (PCB) that are too close together, so that they are subject to signal interference. A software bug may also be regarded as a defect, for example, a code routine that does not properly guard against divide-by-zero operations.

A defect may arise at the interaction of two or more components, even if each individual component is nominally within specification. For example, there may be a timing mismatch between two different modules on a PCB, or in software, one routine may pass arguments in a different order from that expected by a receiving routine. In such circumstances, the design mistake is in the manner in which the components have been put together, rather than in the individual components themselves.

Product testing is intended to locate and fix most defects. Any remaining defects that make it into the field tend to be exercised relatively rarely, or only in special circumstances, otherwise they would be found during product testing, although a particular customer application might perhaps cause a particular defect to be exercised frequently. The presence of a defect generally requires some level of re-design to fix.

Fault: A fault represents a hardware failure in the system that causes the system to behave in an unexpected manner, for example a broken wire or connection. A fault is assumed to arise at a particular point in time, which transitions a system from a correct operational condition (assuming no other faults or defects, etc) to an incorrect operational condition. The system then remains in this incorrect condition on a permanent basis until a repair is made to remedy the fault and to restore the system to proper operation. This repair is typically achieved by replacement of the faulty component with a corresponding non-faulty component. (Note that such a replacement would not correct a defect, since the same defect would also be present on the newly installed component). In some circumstances a faulty component can be rectified without replacement. For example, a fault caused by a loose connection might be remedied by simply engaging the connectors firmly.

A fault may arise because of a flaw in the manufacturing process, such as a cracked PCB line. In this case the system does not (in practice) start in a correct operational condition. Here the fault can be regarded as being present from the time when the component containing the fault was installed into the system. A fault may also be intermittent or temporary (perhaps due to a poorly soldered connection). In this case, the fault can be regarded as permanently present, but the effects of the fault are only experienced intermittently or transiently. In both cases, the presence of the fault indicates a need to perform a repair on the machine.

Software is not generally subject to faults, since it does not transition from a non-faulty to a faulty condition. Rather, software is either correct or incorrect from the beginning. The latter situation represents a defect in the software (although of course the presence of the defect may not be apparent until a particular set of circumstances arises).

Upset: An upset is an event that temporarily causes the system to behave in an unexpected manner. For a computer, a typical form of upset might be a cosmic ray strike, a nuclear decay, or a power supply surge that might perhaps alter the value of a memory bit. A very hot day or a failure of the room air conditioning system could also be regarded as a potential upset (although the latter might also be modeled as a fault). Nevertheless, despite the upset the underlying operation of the system is correct, and no specific repair is needed to the system hardware. However, the upset may cause certain software components (code or data) to become incorrect, implying a need for subsequent rectification. Note the difference between an upset and a temporary (or intermittent) fault—the latter implies that a repair is required, whereas the former does not.

One can also use an upset to model certain software difficulties that might reflect an underlying defect, but that can be tolerated if they do not occur too often. For example, a software daemon may sometimes terminate unexpectedly, and have to be restarted. We can model such occurrences as upsets that cause the daemon to terminate.

Problem: A problem is a generic term to cover defects, faults and upsets. A problem represents a root cause that makes a system behave in an unexpected manner.

Note that the different types of problem have different timing implications. A defect is assumed to be continuously present in a system from the beginning. A fault is assumed to be absent initially from a system, but to become present when the fault occurs, and then to remain present until the system is repaired (see below). An upset is assumed to be absent initially from a system, then to be present for a temporary period (potentially very brief, such as for a cosmic ray hit), and then to disappear again of its own accord (although the consequences of the upset having occurred may remain after the upset itself has gone).

It is possible to define additional types of problems beyond those specifically considered here, such as an erroneous human input, or an out-of-calibration component, although these are not incorporated into the embodiments described herein.

Error: A problem in a system generally produces errors. An error is a signal or datum that is wrong. The problem is the cause, and the error is the effect.

An error may be momentary, such as a voltage spike. Such an error is still significant if it propagates to another error or is reported (see below). Alternatively, an error may last for a significant period of time. For example, the software stored in a machine may become corrupted, perhaps due to an upset or a fault (e.g. in memory). The corrupt software is regarded as an error, since it was caused by an underlying problem, such as a memory fault. Such an error may then persist indefinitely as a stored error.

Error Detector: An error is only noticed after it has been observed by an error detector. Thus error detectors monitor data or signals, and are able to detect discrepant results—for example a temperature that goes out of range, or a data line that appears to be stuck permanently to zero. Many error detectors only observe and trigger upon the initial presence of an error. An error detector may be under the control of an error handler, which might be used, for example, to reset (re-enable) the error detector after it has detected the presence of an error.

Report: When an error detector observes an error, it generates a report. The report may be a terminal message to a human operator, a light illuminated on a control panel, etc. Note that the distinction between an error and a report has not hitherto been generally recognised (typically they have been lumped together as errors).

A report identifies the type of error that was generated, and may include additional information, such as the time of the error, the location of the error (if not implicit in the report name), the data values involved, and so on. A single instance of a report is termed an observation.

Soft Error: A soft error is an error caused by an upset. A soft error does not indicate that the system needs repair, although it may have major consequences for the ongoing operation of the machine—e.g. it may cause the system to reboot.

Systems such as computers are usually designed to tolerate a certain level of soft errors. For example, data may be stored in memory using an error correcting code (ECC). If a limited number of data bits in the memory are flipped by a cosmic ray hit or some other upset, then these may be rectified using the ECC. A soft error generally results in an error report, even if it is corrected automatically.

Soft Error Discrimination Engine (SEDE): This represents the process of determining whether or not the rate of soft errors is within design limits. If so, it is assumed that the soft errors are due to upsets as expected, and so the system is not in need of repair. However, if an excessive rate of soft errors is detected, then this is taken as indicating the presence of some other problem, such as a fault (i.e. the errors are not in fact "soft" errors). In this case a repair action is required in order to address the problem. One form of SEDE is a soft error rate discriminator (SERD), which triggers if more than N soft errors occur within any given time interval T.

A SEDE could also be used in the above example of an upset causing the termination of a daemon program. In this case, a certain level of restarts may be tolerated, but if the rate of program stopping and then restarting becomes too large, the overall throughput of the system may suffer. Accordingly, the SEDE engine could trigger to indicate that the program should now be regarded as having a defect, and that some redesign is required to reduce the error (restart) rate.

Hard Error: Any error caused by a fault or defect is regarded as a hard error, since the source of the error will generally remain until the system is repaired.

Event: Event is used as a general term to cover problems, errors and reports.

Propagation: Propagation is the process whereby one event leads to or causes another event. Thus problems propagate to errors; errors may propagate to other errors and also to reports (when observed by an error detector). Nothing ever propagates to a problem, while reports never propagate to anything (within the context of the fault tree representation).

Consider the situation where a processor power supply rail is at the wrong voltage, and this causes the processor to be unable to add up correctly. Assuming that the irregularity in power supply voltage does not cause permanent damage to electronic structures, the effect of the irregularity is an incorrect data value in the processor—i.e. an error. Thus this situation can be modeled by propagating a power supply fault through to a power supply error, and then through to an error in the processor.

If the irregularity in the power supply voltage does cause permanent damage to any electronic structures, this can be regarded as destructive error propagation, in which an error (a high voltage say) causes a problem (such as a blown component). In practice, this sort of propagation is rare in computer systems. Destructive error propagation is not included in the embodiments described herein, but could be added to other implementations if appropriate.

Propagations may be subject to one or more constraints. These can control the timing of the propagation, and whether the propagation occurs at all.

Diagnosis: This represents the inference of the presence of one or more problems in a system given the observed error reports. In other words, diagnosis involves working back from reports to try to find out what the problem is.

Upsets, faults and defects all have to be diagnosed. Usually, whether a particular problem is an upset (not requiring repair), a fault (requiring repair), or a defect (requiring a design change) only becomes known once diagnosis is complete. In practice, diagnosis may only be defined (i.e. available) for a subset of potential defects. This is because the complexity and variety of potential defects is so large, and the number of defects occurring is so small, that an all-encompassing approach is seldom cost-effective.

In complicated systems, such as large computers, the propagation of errors may be very complex and difficult to unravel. Consequently, the error reports obtained may not allow the diagnosis of a unique problem. Rather, the output from diagnosis may be a listing (a suspect list) of several possible problems that might potentially be present. Further testing can then be performed in order to identify precisely the problem that is causing the observed error reports. Diagnosis of intermittent faults is particularly difficult, since the fault may not reveal itself during such testing.

Diagnosis is followed where appropriate by some remedial action. If the problem is caused by a fault, then generally it is expected that the system will be repaired, usually by replacement of the faulty component. Such a repair restores the system to its correct operating state. However, various other measures can also be adopted, typically on a temporary basis, until a permanent repair can be effected. In particular:

a workaround involves using the system in such a way that the fault is not exercised to produce errors. For example, if there is a fault in a printer connection, then printing can be directed to a different printer;

a reconfiguration is the next step up from a workaround, and removes the fault from the running configuration, while leaving it present in the system. In the above example, such a reconfiguration would remove the faulty printer from the system (either at a software or hardware level, or both).

Note that some faults are, in practice, resolved by a reconfiguration, without ever performing a repair. For example if a disk drive sector goes bad, no-one attempts to repair the sector itself (e.g. by cleaning the relevant portion of the disk platter). Rather the sector is marked as faulty, and the disk drive is reconfigured to use some other sector instead.

Recovery: Any problem, whether due to an upset, fault or defect, may result in the system containing incorrect data (representing the presence of an error). Recovery (sometimes referred to as clean-up) is the process of restoring any incorrect data, in particular stored errors, to its proper (error-free) state, perhaps from a backup machine, or if this is not possible, performing the most appropriate corrective action. There may also be a requirement to delete or at least flag any potentially corrupted data. Recovery may also include restarting any software programs that have terminated as a result of the problem. Typically recovery is performed in conjunction with the provision of a workaround, a reconfiguration or a repair, at which point it is hoped that the system is now in (and will remain in) an error-free state.

The typical remedial strategies to return a system to its correct operating condition for different forms of problem can be summarised as follows:

(a) upset with soft errors—data clean-up if required (if errors are beyond the scope of any automatic correction system);

(b) fault—repair and data clean-up;

(c) defect—re-design, repair with re-designed component, and data clean-up.

In all cases it may be necessary to relaunch one or more software programs that might have terminated as a result of the problem. For a fault and a defect, there is usually an initial stage of a workaround and/or reconfiguration.

Automatic System Reconfiguration Unit (ASRU): an ASRU represents a portion of a system that can be brought into operation (configured) or taken out of operation (deconfigured) by some software action. The diagnosis procedure therefore tries to localise a problem to a particular ASRU, since if this unit can be removed from the system configuration, then the remainder of the system can be considered as operating correctly.

One ASRU may be dependent on another ASRU. For example, a system may have two communications networks, each forming its own ASRU. If a particular peripheral, assumed to be another ASRU, is attached to only one of these networks, then the peripheral ASRU is dependent upon the particular network ASRU to which it is attached.

Field Replaceable Unit (FRU): a FRU represents a unit that can be replaced in the field by a service engineer as part of a repair operation. A FRU can be either a hardware unit or a software unit, although the former is more common. Field service staff can only change complete FRUs. A common practice is to define pluggable units of convenient size as FRUs.

An important focus of the diagnosis procedure is therefore to localise any fault to a particular FRU, thereby enabling the repair to proceed. The smaller the FRUs that are defined for a system, the better the diagnosis needs to be to guide the field service technician to the correct FRU. Note that if the problem is a defect, then the FRU will generally require some level of re-design before the repair can be effected.

In some implementations, FRUs may have a hierarchical configuration. For example, a memory card may contain multiple dual inline memory modules (DIMMs), and both the individual DIMMs and the memory card itself may be FRUs. If a fault can be localised to a particular DIMM, then only this one DIMM needs to be replaced; in other circumstances, such as perhaps a memory bus problem, the whole memory card may need replacement.

FRU and ASRU boundaries are not generally coincident. Thus an ASRU may extend across FRU boundaries, for example because the ASRU includes interconnecting wires. Some problems seem to cross ASRU and/or FRU boundaries. In this case, the problems can be broken down into two or more separate problems, each localised to a single ASRU and FRU, and having the same overall effect on the system Failure in Time Rate (FIT rate): This represents the frequency with which a component is expected to fail. A FIT rate of 1 corresponds to the occurrence of 1 failure in one billion hours (i.e. 1 FIT=2.78 e–13 Hz). The FIT rate for a given component can be estimated, determined by experiment, or measured from actual field data (or any combination of these). Note that FIT rates relate to faults—it is not meaningful to try to assign a FIT rate to a defect, since a defect represents something that has gone wrong at the design level.

FIT rates are additive, so that if one component has a predicted FIT rate of 200 FITs, and a system is made of 10 such components, then the FIT rate of the system will be 2000 FITs. (This assumes that the component failures are independent of one another).

If a fault occurs across multiple FRUs (or ASRUs), and then is broken down into separate faults, one for each FRU and ASRU, the sum of the FIT rates for the separate faults must equal the FIT rate for the single original fault. The breakdown of the FIT rates then indicates how likely the fault is to appear in any given FRU and ASRU.

Outage: This indicates an interruption in machine operations that halts customer activities. An outage may be due to one or more problems in the system that result in the entire system falling over. An outage may also be caused by a service operation, for example the replacement of some key component that can only be performed when the machine is switched off. Note however that many systems are designed to continue operations even if certain problems are present, for example, there may be a back-up power supply in case the primary power supply unit fails. In addition, various components can be made hot-pluggable—i.e. they can be inserted and removed without interrupting normal machine operations.

1.1 Example

An example of a problem is "there is a leak in a car radiator". An example of the error produced by this problem is "there is too little water in the car radiator". The car may or may not have a sensor (i.e. error detector) to monitor water level in the radiator. If such a sensor is present, the error may result in illumination of a warning light on the car dashboard (i.e. a report).

The error of too little water in the car radiator may propagate to a further error, namely "the engine operating temperature is too high". This error may trigger a sensor, resulting in illumination of a further warning light on the car dashboard. Thus the original problem may generate multiple reports. A further report may be generated if the operator (i.e. the driver) notices steam escaping from the engine (in this context, the driver can be regarded as the error detector).

2. Faults and Diagnosis

The most straightforward type of fault to handle is something that occurs and then becomes permanent (e.g. a connection that breaks and remains open thereafter). After the system has broken, as indicated by the appropriate report(s), the diagnostic facility can try to exercise the system in various ways to try to reproduce the reported errors and to pinpoint the fault. Providing the fault is still present, the diagnostic facility should be able to deduce the nature of the fault.

It is more difficult to analyse faults that come and go, perhaps on power cycling or after running the test facility itself. One strategy for handling such a situation is known as first-fault diagnosis. This involves performing the diagnosis at the first appearance of a fault. Typically the diagnosis software responds to incoming error reports by examining the errors. The diagnosis facility may further attempt to exercise the fault again in order to generate and discover additional errors. First-fault analysis can help to identify those faults where the evidence for the fault might disappear if the system is disturbed by a reset or power cycle.

A variant of first-fault analysis is referred to herein as snapshot diagnosis. Here, the diagnosis algorithm works off the captured reports and observations of errors, without trying to re-exercise the fault.

The variety of diagnosis that can be used in a given system depends upon the capabilities of the error detectors implemented in the system. Snapshot diagnosis places the most stringent requirements on error detection, and typically demands that all error detectors should capture error status whenever an error first occurs. This captured status must be held and made available later to the diagnosis facility. This generally requires specifically designed error detection capability in hardware.

First-fault diagnosis needs slightly less sophisticated error detectors, in that it does not necessarily require the ongoing capture of details of errors. Rather, such details can be obtained by error detectors specific to the first-fault diagnosis procedure. However, first-fault diagnosis does require at least some error detectors that are operational during normal customer business use of the system in order to trigger diagnosis on the presence of an error.

The simplest error detectors are those that typically only produce an output or report when activated by the specific operations of the diagnostic test facility. This normally occurs after an error has already been found in the system.

Note that error detectors are relatively easy to design, while in contrast diagnosis is relatively hard. Consequently, it is sensible to architect a system from the beginning with error detectors for snapshot diagnosis, thereby providing the best possible support for fault diagnosis. The appropriate design of error detectors enables snapshot diagnosis. The diagnosis strategies described herein can be used in conjunction with all of the above diagnostic techniques, although they are most powerful when applied to snapshot diagnosis.

The diagnosis techniques discussed so far can be described as history-free, in that they assess the system as it appears at the moment, and do not depend upon any knowledge of past repair operations for this particular system. In contrast, it is possible to make inferences about the likely source of a fault knowing past history. For example, if a component was replaced last week in an attempt to repair a certain fault, and now the same errors have reappeared again, this might suggest that the replaced component was not actually to blame for the problem. A systematic approach to history-based diagnosis is very difficult, even if human experts are involved in the process, and so the approach described herein is primarily focussed on history free diagnosis. However, it is also described how the approach can be extended to include history-based diagnosis if so desired.

2.1 An Overview of Fault Management

A system is initially assumed to be fault free (in this context the term fault free also implies upset free and defect free). All is well, and no errors are being created. However, for some reason a defect is exercised, a fault develops or an upset occurs. This leads to the production of an error, which is observed in due course by an error detector. The error detector produces a report of the event (which may do no more than indicate the presence of the error). This report is the trigger for the fault management exercise (FME), since the detected error implies that the system is no longer fault free (if the system were still fault free, it would not be producing any errors).

A fault management exercise is now undertaken in order to understand what is wrong and to identify an appropriate action to make the system fault free again. The fault management exercise can be considered as having three parts: reconnoitre, diagnose, and act, although reconnoitre and diagnose might be regarded as two facets of a single operation. In one embodiment, there is a single fault management system that is responsible for performing the complete fault management exercise. In other embodiments however, this functionality may be split across two or more interacting programs.

It is important to note that in a complex system it is rare for a single report of an error to provide an adequate basis for diagnosis. Usually the system has to wait and see whether other reports arrive. The precise requirements for the reconnoitre phase of the fault management exercise depend in detail on the arrival of error reports. As individual error reports arrive, or perhaps as time passes without particular reports arriving, such events impact the reconnoitre process, and a determination can be made of when the reconnoitre phase should end and the diagnosis phase commence.

As already described, a single fault can cause multiple errors, and these errors can in turn propagate to cause more errors. All these errors may be detected by different error detectors at different times to produce reports. One fault can therefore create a large number of reports, all of which are relevant to the same fault management exercise. Note that these reports may arrive throughout the reconnoitre phase. Furthermore, the reports may also arrive subsequently through the diagnosis phase, and then even through the act phase, after diagnosis is complete. The fault management exercise must assimilate these reports, and ensure that they are all associated with the specific fault(s) being managed.

The diagnosis phase of the fault management exercise produces as its output a published suspect list containing all the problems that may be present. In one embodiment, associated with each entry on the list is the chance or probability that the corresponding problem is actually the cause of the observed error(s).

In producing the suspect list, the diagnosis facility tries to understand the details of every problem that the system can suffer. This data is entered as part of the creation of the fault tree for the specific system in question by the system design team. Associated with each problem is a set of proposed recovery, reconfiguration and repair mechanisms, also entered by the system design team.

FIG. 1A presents a flowchart representing a high-level overview of the fault management exercise. The system is assumed initially to be in a fault free condition, so that no errors or error reports are produced. A fault now occurs (62), although this event could also represent an upset or the exercise of a defect. The fault (or other form of problem) propagates to one or more errors, and at least one of these errors is detected and reported (64). The first error report then initiates the fault management exercise (65), which tries to diagnose the problem that originally occurred at operation 62. At this point the system is no longer in a fault-free condition.

The system is now in the reconnoitre phase, where it receives and analyses further error reports (66). During the reconnoitre phase, the system tries to determine the nature of the problem(s) in the system from the received error reports. This results in the generation of one or more interim (provisional) suspect lists. As further error reports are received, a more complete analysis is possible, and this allows the size of the suspect list(s) to be reduced.

The reconnoitre phase may comprise running certain test procedures to obtain more information (these are sometimes referred to as diagnostic tests). As described in more detail below, the tests can be represented in a fault tree as pollers, and selected for running by an examination of the tree.

At some point, the system decides to terminate the reconnoitre phase and to start the diagnosis phase. The appropriate time to wait depends upon the complexity and duration of propagations within the system, and may in some embodiments be dependent on the particular error report initially received. As part of the diagnosis, the fault management system publishes a suspect list (68), which is then used in future handling of the fault management exercise.

In some implementations the diagnosis may be subsequently refined (70) based on extrinsic information (i.e. information not generated by the fault management exercise itself). For example, one possibility is that historical data about previous system faults may be used to supplement the diagnosis. (Depending upon the particular implementation, diagnostic testing may also be incorporated into the refinement of the diagnosis, rather than the diagnosis itself).

Once diagnosis has been completed, the system now transitions to the act phase. Typically this involves deconfiguration (72) of the component (an ASRU) identified as the location of the fault, followed by clean-up of any erroneous data caused by the fault (74). These actions should restore the operational parts of the system to a fault-free condition. As part of the clean-up therefore, the error detectors that triggered the reports received at operations 64 and 66 are re-enabled, so that they are sensitive to any further errors. This then represents the conclusion of the fault management exercise within the system itself (75). However, it is expected that in due course a repair will be made (76) of the faulty (deconfigured) portion of the system, typically by a human service engineer replacing the relevant FRU, thereby restoring the system to its initial fault-free condition.

Although FIG. 1A depicts a fault management exercise as being launched (operation 65) immediately upon receipt of an error report, in one embodiment, a check is first made to see whether the error report can be explained by any other fault management exercise that is already in existence. This check may be performed as part of the analysis of the error reports (operation 66). In this case, a new fault management exercise would only be launched in respect of the received error report after it had been confirmed that the error could not be explained as part of an existing fault management exercise.

2.2 System Overview

Figure 1B:
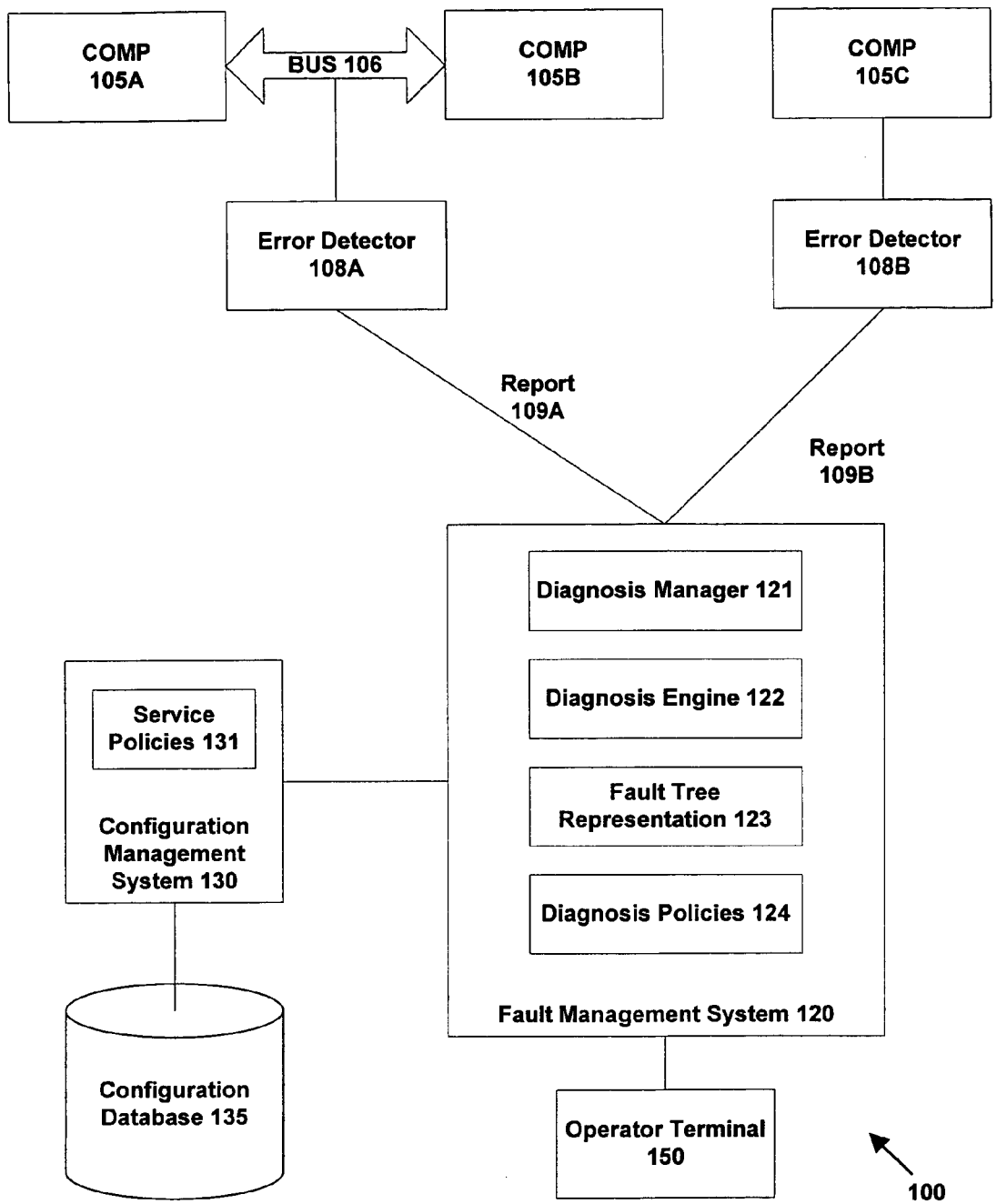
FIG. 1B provides a high-level schematic depiction of a computer system incorporating a diagnosis facility in accordance with one embodiment of the invention.

FIG. 1B is a schematic illustration of an example system 100 including a fault management system 120 in accordance with one embodiment of the invention. The system 100 includes various components 105A, 105B, 105C, with components 105A and 105B being connected by bus 106. These components are monitored by error detectors 108A and 108B, which generate error reports 109A, 109B respectively for transmission to diagnosis facility 120. More particularly, error detector 108A monitors bus 106 for errors, while error detector 108B monitors component 105C for errors. Consequently, errors within components 105A and 105B are not detected until or unless they appear on bus 106.

(It will be appreciated that for simplicity FIG. 1B depicts only a few components 105 and error detectors 108, although an actual system will have a very large number of these. Furthermore, an operational system may have many other subsystems and connections, terminals, etc, that are not shown in FIG. 1B).

System 100 further includes a configuration management system 130 which is used to control the configuration of system 100. Details about the configuration are stored in database 135, which is updated by configuration management system 130 as appropriate. It will be appreciated that existing systems often already include such a configuration management system 130 and configuration database 135 for general system administration purposes.

Fault management system 120 includes two main operational components, a diagnosis manager 121 and a diagnosis engine 122. In addition, the fault management system includes or has access to a representation 123 of the fault tree for the system being monitored, and may also have one or more policy modules 124.

The fault tree representation 123 describes how problems in the system can propagate to errors and then to reports (and/or further errors). The diagnosis engine analyses a set of error reports 109A, 109B to identify one or more problems that may be present in the system. This diagnosis or inference is performed using the information contained in the fault tree representation 123.

The fault tree representation 123 may be in a configuration-independent format. The fault management system 120 can then access the information in configuration database 135 to produce a configuration-dependent version of the fault tree, for use in interpreting the received error reports 109A, 109B. The diagnosis facility may go through the configuration management system 130 to access the database 135, or it may be able to access the database directly. In some systems, the fault management system may generate a configuration-dependent version of the fault tree at the start of each fault management exercise. Alternatively, the fault management system may maintain the configuration-dependent version on an ongoing basis, updated at each configuration change.

The policy modules 124 can be used to refine the diagnosis produced by the diagnosis engine. For example, a policy module may be included to convert a history-free diagnosis from diagnosis engine 122 into a history-based diagnosis. (Certain implementations may do without such policy modules 124, and rely instead directly upon the output from diagnosis engine 122).

The diagnosis manager 121 coordinates the flow of error reports into the diagnosis engine, and also determines what action to take in response to the resulting diagnosis. For example, the diagnosis manager may decide to act upon the diagnosis, such as by performing a reconfiguration, or it may decide to delay any action to allow further time for one or more additional error reports to arrive.

Once the diagnosis is complete, the results may be presented to a human operator via terminal 150, or via any other appropriate mechanism. The fault management system 120 may, as a consequence of the diagnosis, instruct the configuration management system 130 to deconfigure a component 105 that has been identified as faulty. The configuration management system 130 then decides whether to give effect to this instruction, and updates the configuration database 135 as appropriate.

The configuration management system 130 may contain service policies 131. These can be used to specify whether or not a given component 105 should be deconfigured, based upon information about the types of errors any problems in the component are producing, the importance of the component 105 for overall machine operations, and so on. Note that although the service policies 131 are shown in FIG. 1B as part of the configuration management system 130, they may also be incorporated, at least in part, into fault management system 120, or any other appropriate part of the system.

3. Fault Tree Diagrams

Fault trees provide a powerful method for expressing how problems and errors affect systems. (N.B. the term fault tree diagram is standard in the art, although the diagrams herein are not limited to faults, and are not always configured in the shape of a tree). The fault tree scheme described in detail herein provides a precise model representation that involves relatively few basic building blocks, which makes it relatively easy to understand and to compute. It is accepted that this fault tree scheme may not cover every single possible eventuality, either because: (i) inherent limitations in the particular fault tree model adopted make it difficult to represent certain outcomes; and/or (ii) it is difficult (arguably impossible) or simply too time-consuming for a designer to predict all aspects and circumstances of system behaviour. Nevertheless, the model has been found to be useful in practice for representing complex large-scale computer server systems. It will be appreciated that other embodiments may adopt somewhat different fault tree schemes.

Fault trees describe cause and effect. The causes of events are the problems that must be diagnosed, and the ultimate effects are the reports that are available for observation. A fault tree shows how the problems cause the reports. It is generally the responsibility of the diagnosis architect to create a proper fault tree description of a system.

Figure 2A:
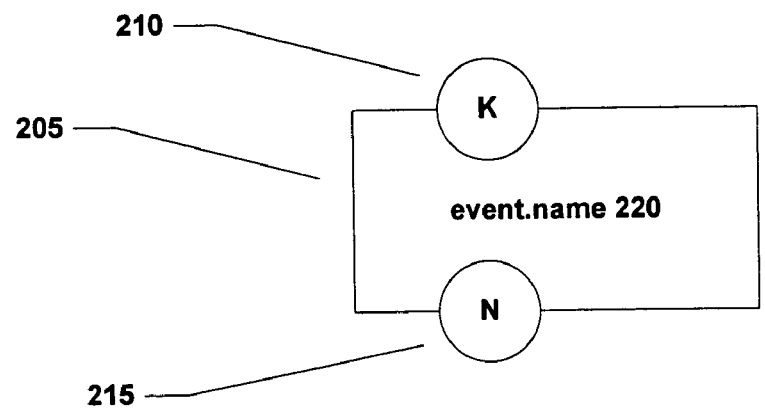
FIG. 2A provides a fault tree diagram representation for an error in accordance with one embodiment of the invention.

FIG. 2A illustrates a graphical representation of an event as used in a fault tree diagram in accordance with one embodiment of the invention. The representation includes a box 205 incorporating the name 220 of the event with a circle or bubble at the bottom and/or the top of the box. The name of the event has two portions separated by a period (full stop). The first portion of the event name represents the type of event, and may be one of "defect", "fault", "upset", "error" and "ereport" ("ereport" is used for a report event). It will be appreciated that these five terms correspond to the various possible classifications of an event. The second portion of the event name represents an identifier for the event, and may be further subdivided into additional portions, for example to indicate the location of an event.

The event bubbles are used for connecting propagations to and from an event. The bubble at the top of the event 210 is referred to herein as a "cause" bubble. Propagations into this bubble cause (or potentially cause) the occurrence of the event 205. The bubble at the bottom of the event 215 is referred to herein as an "effect" bubble. Propagations from this bubble produce the effects of the event 205. It will be appreciated that if event 205 represents a problem, then cause bubble 210 is omitted, since nothing propagates to a problem. Conversely, effect bubble 215 is omitted if event 205 is a report, since nothing propagates from a report. (A report does of course propagate to the fault management system, but this is outside the scope of the fault tree diagrams per se).

Note that multiple propagations can arrive at a single cause bubble, and likewise multiple propagations can emanate from a single effect bubble. In addition, a single event may have multiple cause bubbles and/or multiple effect bubbles.

A propagation in a fault tree denotes a cause and effect linkage, so that if a problem causes an error, then a propagation joins the effect bubble of the problem event to the cause bubble of the error event. A propagation is directional, from cause to effect, and can be marked with an arrow accordingly. (It should be noted that there is an effect bubble at the cause end of a propagation, and a cause bubble at the effect end of a propagation, since the bubble nomenclature is defined with respect to an event, as in FIG. 2A, rather than a propagation).

In practice, the directionality of a propagation is implicit in the overall configuration of the fault tree diagram. Arrows are omitted from the fault tree diagrams herein in order to reduce clutter. If a first event causes a second event, then the propagation is drawn coming from the effect bubble at the bottom of the first event and arriving at the cause bubble at the top of the second event. The cause-effect direction is therefore from the bubble-at-the-bottom, to the bubble-at-the-top. This applies even if the effect is drawn higher up the page than the cause, so that the line representing the propagation has to curve around and up.

As shown in FIG. 2A, the cause bubble 210 includes a qualifier "K" while the effect bubble 215 includes a qualifier "N". The role of "K" in a cause bubble is discussed in more detail below. The value of N in an effect bubble is defined as follows: "at least N of the propagations out of this effect bubble must occur, if the event including the effect bubble is present". (As described below, this definition is refined if there are constraints on any of the propagations). Note that even if a propagation does occur, this does not necessarily imply that the event caused by the propagation occurs. Thus it is possible for a propagation to occur but for the event including the cause bubble at the end of the propagation not to occur. This is due to the behaviour of a cause bubble, as discussed in more detail below. Any given propagation can be specified as an (n)→(k) propagation, where n is specified in the effect bubble at the start of the propagation, and k is specified in the cause bubble at the end of the propagation.

May Propagations: A value of N=0 in the effect bubble indicates that "at least 0 of the propagations out of this bubble must occur". This is called a "may" propagation, since it is in effect saying that any number of propagations may (or may not) occur if the relevant cause is present.

Must Propagations: A "must" propagation is indicated by a value of N>0 in the effect bubble, and denotes a situation where at least one propagation must occur.

Figure 2B:
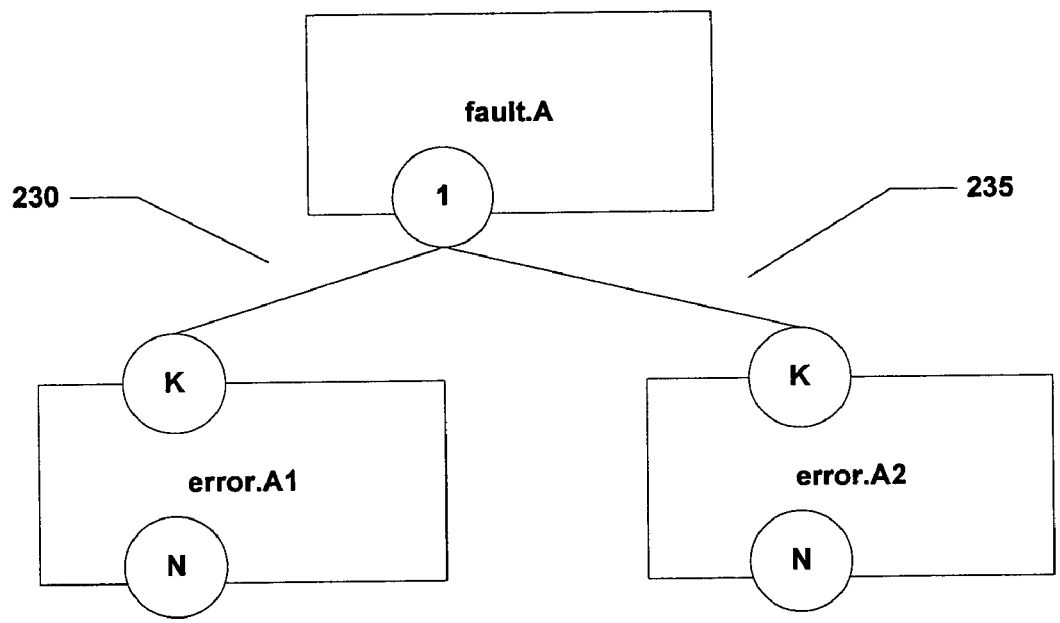
FIG. 2B illustrates the propagation of a problem to an error in a fault tree diagram in accordance with one embodiment of the invention.

FIG. 2B illustrates a fault event named fault.A. Note that since this event represents a problem, there is no cause bubble. There are two propagations 230, 235 from fault.A to two error events, namely error.A1 and error.A2 respectively.

The effect bubble of fault.A has a value of N=1, denoting that if the event fault.A occurs, then there must be a propagation to at least one of events error.A1 and error.A2 (possibly both). In the fault tree diagrams presented herein, it is possible to use numbers larger than 1 in the bubble at the top of a propagation. For example, if the effect bubble of fault.A has the value of N=2, then both of the propagations to error.A1 and to error.A2 must occur if event fault.A occurs. In practice however, it is found that multiple propagations are rarely needed (if at all) to describe system behaviour. The one exception to this is the special case where all of the propagations from the effect bubble must occur if the event occurs, which may be indicated in a fault tree diagram by specifying "A" in the effect bubble (i.e. setting N=A). In other words, values of N intermediate 1 and A are not generally employed in the fault tree diagrams described herein (although this may depend on the type of system being modelled). In the case of FIG. 2B, setting the effect bubble of fault.A to N=A is the same as setting to N=2, although the former would more typically be utilised.

Note that in one particular embodiment, there is no specific mechanism to indicate that "precisely one of the propagations out of this bubble must occur, if a fault is present" (or, more generally, precisely "n" propagations must occur, where "n" is less than the total number of propagations from the bubble). Such a representation could be added to the fault tree diagrams if so desired, although hitherto it has generally been found possible to describe the behaviour of large computer systems without such a facility.

In some circumstances, an error may exist without propagating to a report or to another error. Such an error can be considered as undetectable (within the parameters of the system). For example, a program with a bug might produce an incorrect data value in a file, without there being any error detection (i.e. report) associated with this. Nevertheless, the fault tree diagrams herein always depict an error as having an effect bubble underneath, even if there are no propagations from this bubble. This then ensures that an error that does not propagate to another error (or to a report) is still clearly distinguished from a report. Note, it may in fact be valuable for the diagnosis algorithm to determine whether or not the error in question might potentially have occurred (based on its knowledge of other events in the system). For example, this information might be helpful for a human operator who may want to use a (potentially corrupted) file.

If there are no propagations out of an effect bubble, the value of the N in the effect bubble is set to zero, indicating that at least zero (out of the zero possible) effect propagations occur. More generally, the different types of event box can be recognised as follows:

Problem—effect bubble but no cause bubble
Error—cause bubble and effect bubble
Report—cause bubble but no effect bubble In some cases, it is helpful to think of an error as propagating all the way from a problem event (which generates it) through the associated error event, to the report event, where it is detected. Note that with this interpretation, the propagations on a fault tree can be regarded as corresponding to the progress of errors through the system.

3.1 Cache Example

Figure 3A:
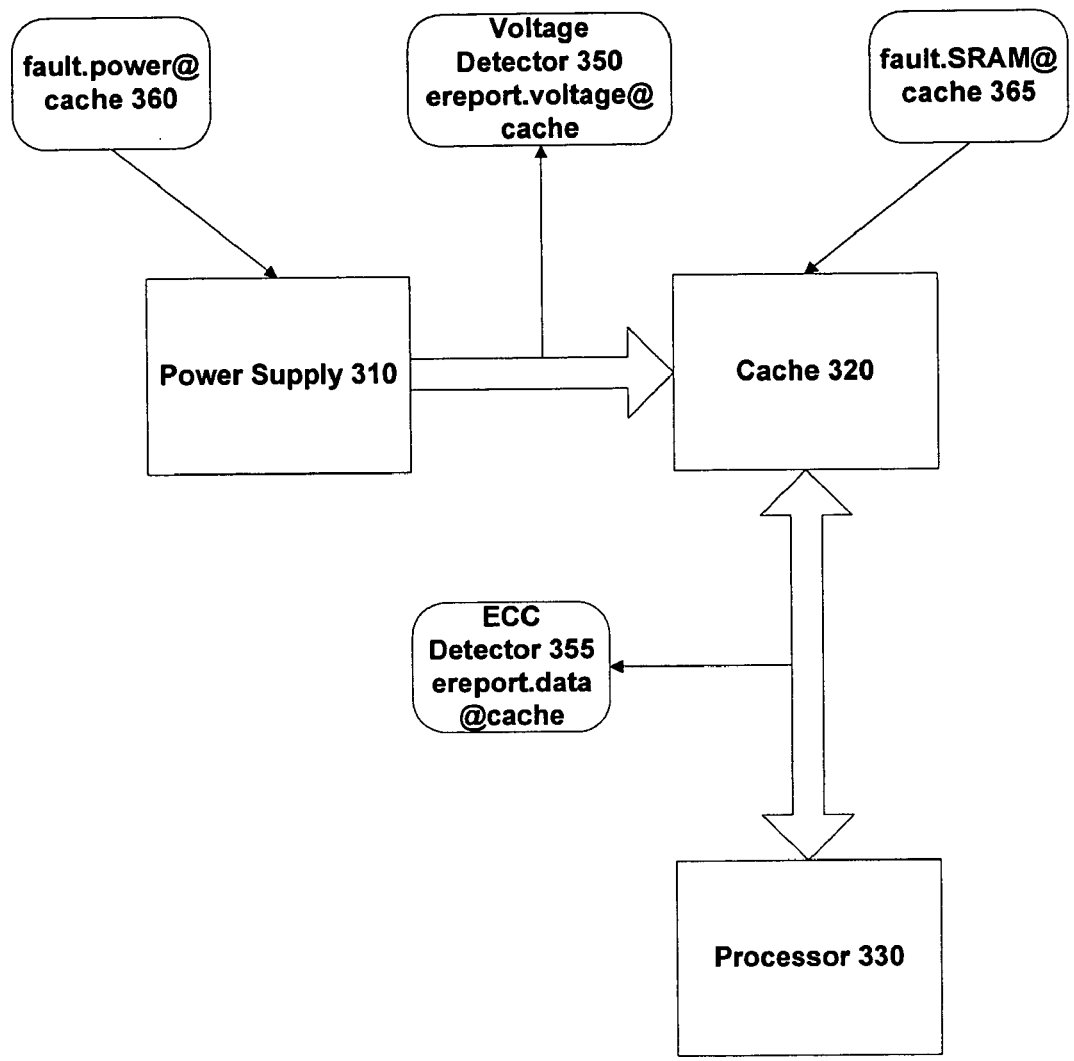
FIG. 3A is a schematic diagram of a cache circuit for a processor, including error detectors and potential faults.

FIG. 3A is a schematic diagram illustrating a cache circuit comprising a processor 330 and a cache unit 320 with its own power supply 310. FIG. 3A also illustrates two potential faults within the circuit, namely a power supply fault 360 and a cache SRAM fault 365. These will be denoted as fault.power@cache and fault.SRAM@cache respectively.

The circuit of FIG. 3A further includes two error detectors, namely voltage detector 350 and ECC detector 355. The former detects a drop in the supply voltage from power supply 310 to cache unit 320, while the latter detects an (uncorrectable) error in data read out from cache 320 to processor 330. The outputs of these detectors will be denoted as ereport.voltage@cache and ereport.data@cache respectively.

It will be appreciated that there may be other error detectors in the circuit, and there are other potential faults that might occur in the circuit. However, for simplicity these are omitted from FIG. 3A. Note also that although the faults 360, 365 are shown in FIG. 3A as being associated with particular areas of the circuit, faults are not always localised in this way. Similarly, although the detectors 350 are shown in specific positions, they may stationed at any suitable location (e.g. ECC detector 355 might be incorporated into cache unit 320).

Figure 3B:
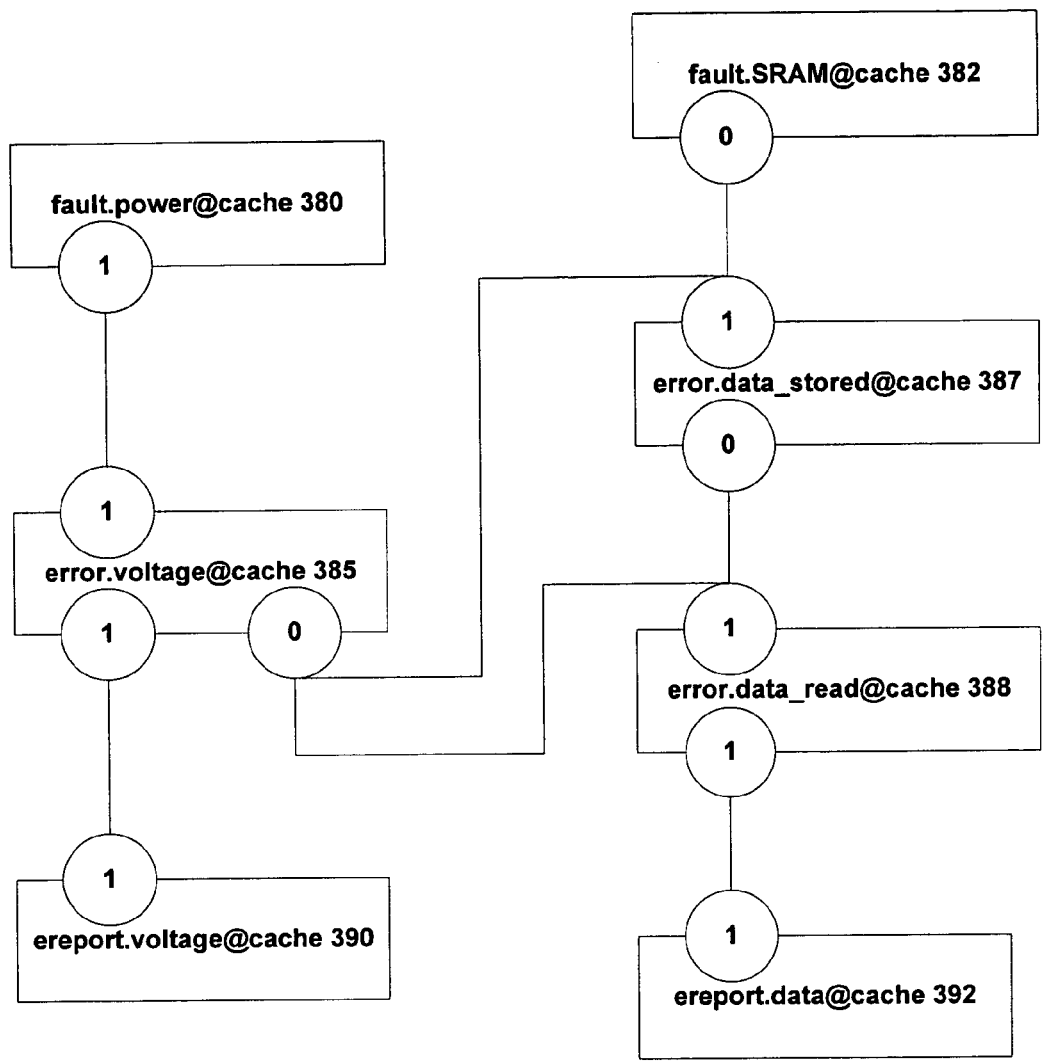
FIG. 3B is a fault tree diagram corresponding to the circuit of FIG. 3A in accordance with one embodiment of the invention.

FIG. 3B represents the fault tree diagram corresponding to the circuit of FIG. 3A. According to this diagram, a fault.power@cache 380 must propagate to an error.voltage@cache 385. This is because at least one of the propagations from the effect bubble of fault 380 must occur, and since there is only one propagation from this bubble, namely to error 385, it must be this propagation that occurs.

(In a complete system there may of course be faults in the cache power supply that do not automatically cause a cache voltage error. For example, a decrease in efficiency of the power supply convertor might not necessarily cause the voltage to be in error, but the input current would be higher than expected. In such a situation, a cache power fault would be present, but would not always cause a voltage error. This could either be modelled separately, or the propagation from the fault.power@cache 380 to error.voltage@cache 385 could be changed to a may propagation by setting the effect bubble of fault 380 to N=0. However, for simplicity, such considerations are omitted from FIG. 3B).

FIG. 3B also shows that an error.voltage@cache 385 must propagate to an ereport.voltage@cache 390. This reflects the fact that the voltage detector circuit 350 is generally calibrated so that when the detector does not raise any alarm, the voltage is considered not to be in error. In addition, voltage detector 350 is always operational (in a well-designed system), and so will detect even a transient error in the cache voltage. In other words, the voltage from the power supply 310 is being continually watched to confirm that it is error-free.

The net effect of this chain of events is that if there is a fault.power@cache 380, then this must propagate to an error.voltage@cache 385, which must in turn propagate to an ereport.voltage@cache 390. The converse of this is that if no ereport.voltage@cache 390 is observed, then there cannot have been a fault.power@cache 380. It will be appreciated from this that must propagations are very useful for the purposes of diagnosis.

Note that there are two effect bubbles at the bottom of the error.voltage@cache event box 385. Problems and errors can have any number of separate effects, and this implies drawing the corresponding number of separate effect bubbles. In this particular case, there is a further propagation from the error.voltage@cache 385 to the error.data_stored@cache 387 and to error.data_read@cache 388. These propagations are marked with a "0", and hence represent a may propagation. In other words, an error.voltage@cache does not necessarily propagate to an error.data_stored@cache 387 or to an error.data_read@cache 388. In addition, an error.data_stored@cache 387 may itself propagate to an error.data_read@cache 388, while there is a must propagation from error.data_read@cache 388 to an ereport.data@cache 392.

The reason why the propagations from error.voltage@cache 385 to error.data_stored@cache 387 and to error.data_read@cache 388 are only may propagations (and not must propagations) centres on the good design of the voltage error detector, in that the motivation for including a voltage error detector 350 within the system is (presumably) to separate out cache power faults from cache SRAM faults. In other words, the voltage error detector 350 would fail in its task if there were some voltage that caused the cache to deliver an error.data_stored@cache 387 but did not first signal an ereport.voltage@cache 390. In such circumstances, the fault would lie in the power supply, but the diagnosis might try to blame the SRAM.

The propagation from fault.SRAM@cache 382 through to error.data_stored@cache 387 is shown in FIG. 3B as a may propagation, although depending upon the nature of the defined fault, it might be a must propagation. An example of a may propagation would be if we consider that fault.SRAM@cache 382 represents a stuck bit, say at zero. It will be appreciated that this will only lead to an error.data_stored@cache 387 if an attempt is made to store a one into this bit (since any attempt to store zero will, in effect, be successful).

The may propagation in FIG. 3B from an error.data_stored@cache 387 to an error.data_read@cache 388 arises from the way in which a cache 320 operates. Thus the cache output may be changing or is tri-stated for much of the time. In such circumstances, the cache may (in theory) present an error, but this has no implications for correctness, since the processor 320 is carefully designed not to use this unstable data. Rather, an error.data_stored@cache 387 only propagates to an error.data_read@cache 388 when the processor is carrying out a valid cache read access. Cache read accesses depend upon processor operation. If the processor is in an idle loop, or is doing something else that does not require any cache reads, then this propagation does not occur. This state of affairs can continue indefinitely, and the diagnosis architect cannot predict what the processor 330 will be doing when a propagation occurs into error.data_stored@cache 387. Accordingly, the propagation in FIG. 3B into error.data_read@cache 388 from error.data_stored@cache 388 is set as a may propagation, since its impact will depend upon processor activity when the propagation (nominally) occurs.

A further reason why the propagation into error.data_read@cache 388 from error.data_stored@cache 388 is set as a may propagation is that the (incorrect) stored data in cache may be over-written by some new (correct) data. In this case, the fact that the cache previously stored incorrect data has no bearing on future system behaviour.

3.2 Cause Bubbles and Majority Logic Gates

An error or report is caused when a propagation occurs into a cause bubble at the top of the box representing the event. If there is a single propagation into a cause bubble, and this propagation occurs, then the event containing the cause bubble will also occur (subject to any appropriate propagation delay). Thus if event A is linked to event B by a must propagation, and this must propagation is the only propagation into the cause bubble of event B, then event A will inevitably trigger event B.

The situation is more complicated however if there are multiple propagations arriving at a single effect bubble. Thus systems often include measures to limit error propagation, such as by using error correction, retry and/or redundancy. The fault tree diagrams disclosed herein are able to accommodate such measures by the use of a gating function that provides K-out-of-M majority logic gates.

Figure 4A:
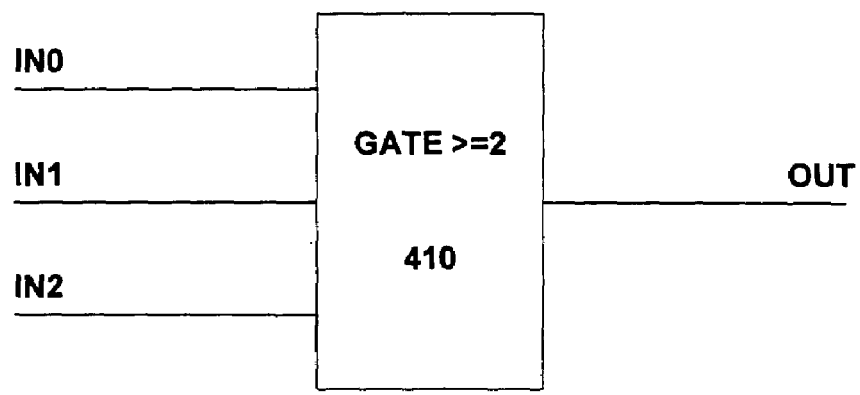
FIG. 4A is a diagram of a majority logic gate.

FIG. 4A illustrates a majority logic gate 410. This particular gate has three inputs, designated IN0, IN1, and IN2, and a single output (OUT), and is a 2-out-of-3 majority logic gate. In other words, if any two (or more) of the three inputs IN0, IN1 and IN2 are TRUE, then the output OUT becomes TRUE. Note that such majority logic gates can be constructed using conventional AND-OR-INVERT logic gates, although this is not particularly efficient. The functionality can also be implemented as a software component.

Figure 4B:
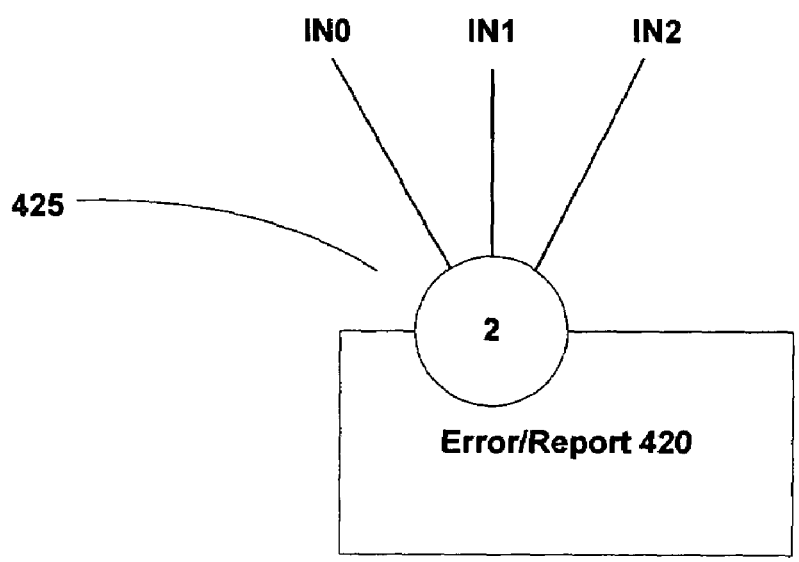
FIG. 4B illustrates how a majority logic gate is represented in a fault tree diagram in accordance with one embodiment of the invention.

FIG. 4B represents the depiction in a fault tree diagram of the majority logic gate of FIG. 4A. Thus cause bubble 425 of event 420 receives three input propagations, IN0, IN1, and IN2, and is specified as having a value of K=2. This indicates that whenever cause bubble 425 receives at least two positive inputs, then event 420 will be generated. More generally, if a cause bubble 425 contains a number K then this implies that the corresponding event will be caused if, and only if, at least K of the propagations coming into this cause bubble occur.

It will be appreciated that if a cause bubble has k incoming propagations, then K is generally restricted to the range from 1 to k—i.e. $1 \leq K \leq k$. In contrast, for an effect bubble having n outgoing propagations, $0 \leq N \leq n$. Of course, as previously indicated, if N or K is to be set equal to n (the actual number of propagations), then this can be done generically by specifying N=A or K=A as appropriate, irrespective of the particular value of n.

If the fault tree specifies K=A, then it can be meaningful to consider the situation where K=0 for a particular configuration, in other words where there are no propagations into a K=A cause bubble, and hence no incoming propagations are required to trigger the event. This can be useful for example where the absence of a first component may cause a second component to malfunction. In such a situation, there is no error that propagates from the first component to the second component, but the second component still experiences its own error event.

3.3 Power Module Example

Figure 5A:
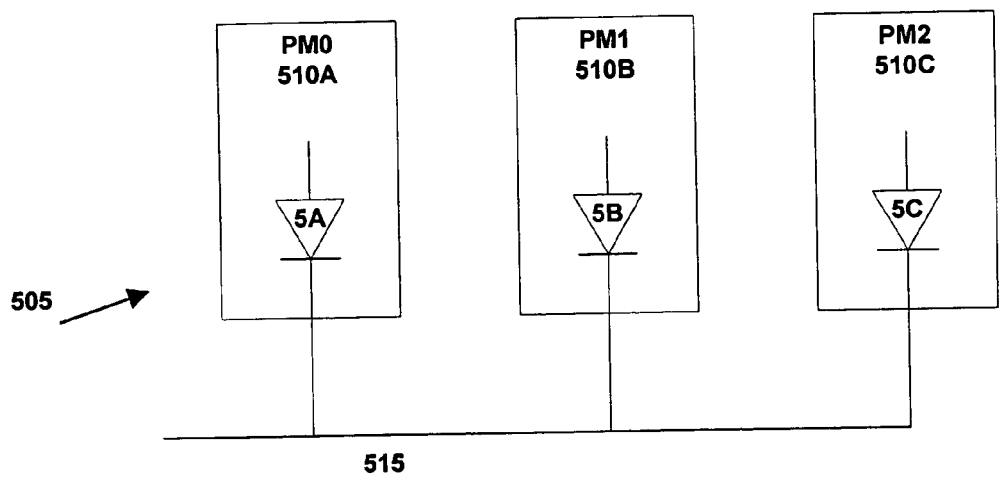
FIG. 5A is a schematic diagram of a power supply circuit having multiple modules.

FIG. 5A illustrates a 2+1 redundant power supply 505 having three separate power modules, PM0 510A, PM1 510B and PM2 510C. Each power module 510 produces a voltage through a respective diode 5A, 5B, and 5C to a single common output bus 515. It is assumed that at least two of the power modules 510A, 510B, 510C are needed in order to provide enough power to drive the load. Accordingly, if only one power module is faulty, then there is still enough power available to drive the system. However, if two of the power modules are faulty (or they are all faulty), then this leads to a voltage error on the output bus 515.

Figure 5B:
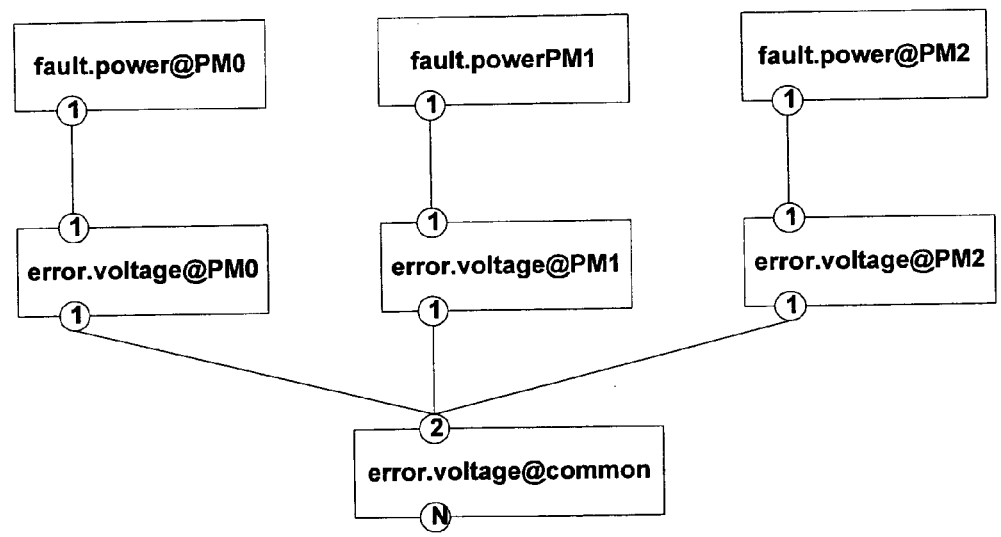
FIG. 5B is a fault tree diagram corresponding to the circuit of FIG. 5A in accordance with one embodiment of the invention.

The fault tree of FIG. 5B provides a depiction of the power supply configuration of FIG. 5A (for clarity, reporting events have been omitted from FIG. 5B). Each of the individual power modules may suffer a fault, denoted as fault.power@PMX, which has a must propagation to a corresponding error, denoted as error.voltage@PMX (where PMX represents PM0, PM1, PM2, as appropriate). Since the cause bubble for error.voltage@PMX has a value of 1, this event is triggered whenever the incoming propagation occurs, in other words, it is "1-out-of-1" logic.

Each error.voltage@PMX is linked to error.voltage@common, which represents a voltage error on common bus 515. This common voltage error only occurs if two or more of the power modules 510A, 510B, 510C are faulty. For example, assume that power module PM0 510A develops a fault, fault.power@PM0, but that the other power modules are operating correctly. The fault in PM0 propagates to error.voltage@PM0, and this in turn propagates to error.voltage@common, since the effect bubble of error.voltage@PM0 is for a must propagation (N=1). However, this propagation, in itself, is not enough to trigger an error on the common bus, i.e. error.voltage@common. Rather, the "2" in the cause bubble of error.voltage@common implies that at least one more propagation must occur from an error in another power module before error.voltage@common is generated.

Figure 5C:
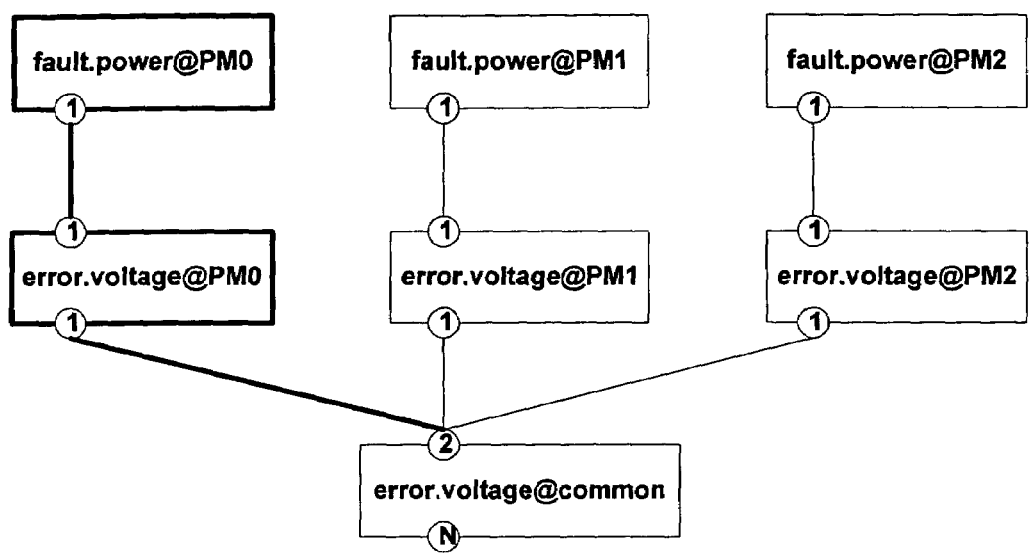
FIG. 5C is the same fault tree diagram as FIG. 5B, but with certain propagations highlighted to show that the propagations have been exercised.

There is an important distinction here between a propagation "occurring" and the corresponding event being "caused". Thus a propagation may occur, but the cause bubble will only trigger dependent upon the K-out-of-M majority logic gate. One way of illustrating this is to highlight an occurring propagation. This is shown in FIG. 5C, where it is assumed that a fault.power@PM0 has occurred. As mentioned above, this propagates to an error.voltage@PM0, and this in turn propagates to error.voltage@common. Both of these propagations are shown highlighted in FIG. 5C in order to show that they are occurring. Likewise, the events corresponding to fault.power@PM0 and error.voltage@PM0 are also highlighted, in order to show that they too are occurring. However, since an error from a single power module is insufficient to trigger an error in the common voltage itself, given the 2-out-3 logic, error.voltage@common does not occur, and hence is not shown as highlighted in FIG. 5C.

3.4 Inhibitors

An inhibit bubble is represented as a second bubble at the top of an event, and can be regarded as the opposite of a cause bubble. Thus instead of causing the associated event, the inhibit bubble inhibits or suppresses the event. An inhibit bubble may be used for any event that has a cause bubble—i.e. for errors and reports, but not for problems. The inhibit bubble has the same majority logic capabilities as a cause bubble. In other words, if an inhibit bubble contains a number "K", then at least "K" of the incoming propagations have to occur in order for the inhibit bubble to act.

Figure 6:
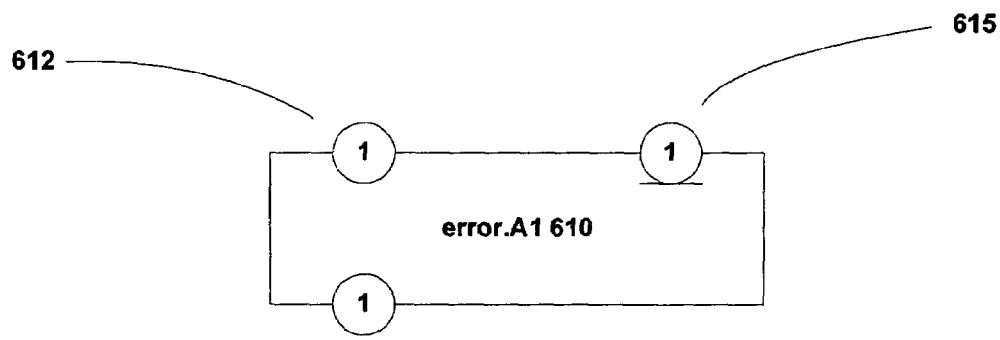
FIG. 6 illustrates an event with an inhibit bubble in accordance with one embodiment of the invention.

FIG. 6 illustrates an inhibit bubble 615 for an event 610 (identified as error.A1). The event also includes a cause bubble 612. (N.B. Propagations are omitted from FIG. 6 for clarity). The inhibit bubble 615 is depicted in a fault tree diagram in some appropriate manner to show that it represents the inverse or negative of a cause bubble 612. For example, in the particular convention of FIG. 6, an inhibit bubble is shown underlined and at the top right an event, but it might also be shown in a different colour, etc. Note that since inhibit bubbles are relatively rare, they are generally omitted from the fault tree diagrams herein unless specifically required. A given event may potentially have more than one inhibit bubble (although logically these could then be combined into a single inhibit bubble as will become clear below).

An inhibit bubble is useful for modelling "error masking" and "report masking", in which the presence of one event can mask the presence of another. A simple example of such masking occurs if there is a communications error which might typically prevent certain error reports from arriving at a diagnostic facility. In other words, an error on a communications link could mask out reports of any other errors in the system that would otherwise travel along that link.

Inhibit bubbles override cause bubbles. Thus if both the cause bubble and also the inhibit bubble of an event are activated, the event is inhibited. For an event to be caused therefore:

(i) a sufficient number of propagations have to occur to trigger a cause bubble; AND (ii) an insufficient number of propagations have to occur to trigger any inhibit bubble.

Propagations to inhibit bubbles are often may propagations. This stems primarily from the model of a fault used herein, in which the events are largely based upon the initial appearance of a fault or error. In contrast, there is less concern as to whether or not such faults and errors persist. Consequently, although the presence of a first error may initially inhibit a second error, this may not continue to be the case indefinitely.

Another reason why many propagations to inhibit bubbles are may propagations is due to the timing of the initial inhibition. Thus sometimes a single fault can both inhibit and cause the same event, via different paths. In this case, the precise outcome in any given situation depends upon relative timing of these different paths, which often cannot be predicted fully in advance.

Nevertheless, it is also possible to have must propagations to an inhibit bubble. For example, a voltage error may be detected not only by a voltage error detector, but also by a reset generator that resets the circuit automatically if the voltage is in error. The reset generator could be designed to inhibit other error detectors (which may not be relevant once the circuit is reset). This might be achieved in one embodiment by having a must propagation from the voltage error (as received by the reset generator) to the reports created by those other error detectors.

Having a must propagation to an inhibit bubble in this manner can provide a useful restriction on the propagation of errors and reports within a system. This in turn can aid diagnosability. Accordingly, such restrictions on propagations may be deliberately designed into a system.

3.5 Fault Tree Diagram Manipulations

Various manipulations may be performed on fault tree diagrams in order to reduce a diagram to a simpler form.

Effect Bubble Coalescing: Any number of individual effect bubbles having one or more may propagations (i.e. N=0) can be combined into a single effect bubble having may propagations (N=0). Likewise any number of individual effect bubbles having N=A can be coalesced into a single effect bubble having N=A with all the propagations emanating from it. (This applies to any bubble that could be regarded as an A bubble, irrespective of whether specifically marked as such: for example, an N=1 bubble having just a single propagation, and more generally, an N=n bubble having n propagations).

Figure 7A:
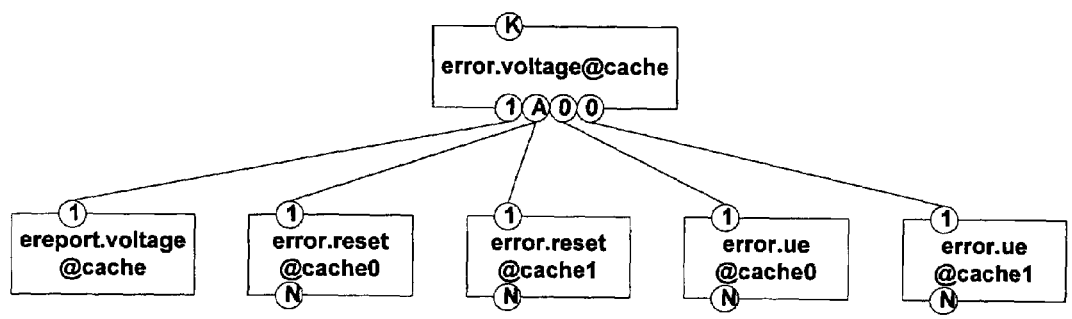
FIGS. 7A and 7B are two fault tree diagrams in accordance with one embodiment of the invention both representing the same behaviour (derived from the cache circuit of FIG. 3A), and more particularly illustrating how fault tree diagrams may be converted from one form to another.
Figure 7B:
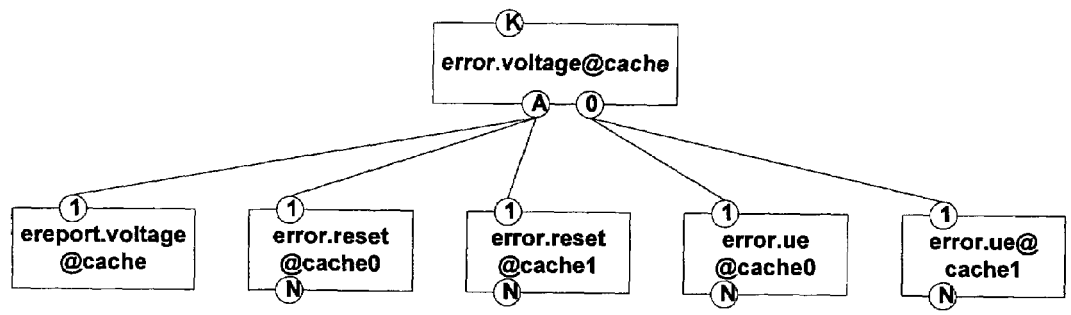

FIGS. 7A and 7B illustrate effect bubble coalescing in a system having a single cache power supply feeding two separate caches, cache0 and cache1. An error.voltage@cache is presumed to cause not only an ereport.voltage@cache but also an error.reset@cache0 and an error.reset@cache1. Furthermore, the error.voltage@cache may cause an ECC error in either (or both) of cache0 and cache1 (broadly analogous to FIGS. 3A and 3B above).

FIG. 7A provides one representation of a fault tree diagram corresponding to such a configuration. FIG. 7B provides an equivalent representation of this configuration following effect bubble coalescing in accordance with the above rules. In particular, the N=1 effect bubble from FIG. 7A can be regarded as an N=A effect bubble (since it has only one propagation), and so can be merged with the N=A effect bubble to give a new N=A bubble where all propagations must occur. Similarly, the may effect bubbles have also been combined into a single effect bubble having N=0.

Cause Bubble Coalescing: Any number of individual K=1 cause bubbles, which in effect OR together all incoming propagations, can be combined to form a single K=1 cause bubble. The same contraction applies to multiple inhibit bubbles.

Figure 8A:
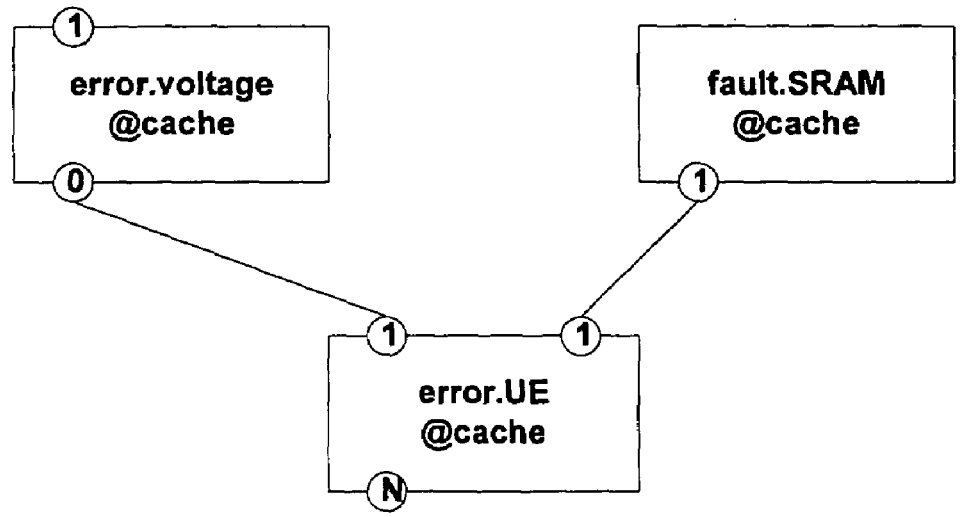
FIGS. 8A and 8B are two further fault tree diagrams in accordance with one embodiment of the invention both representing the same behaviour (again derived from the cache circuit of FIG. 3A), and more particularly illustrating how fault tree diagrams may be converted from one form to another.
Figure 8B:
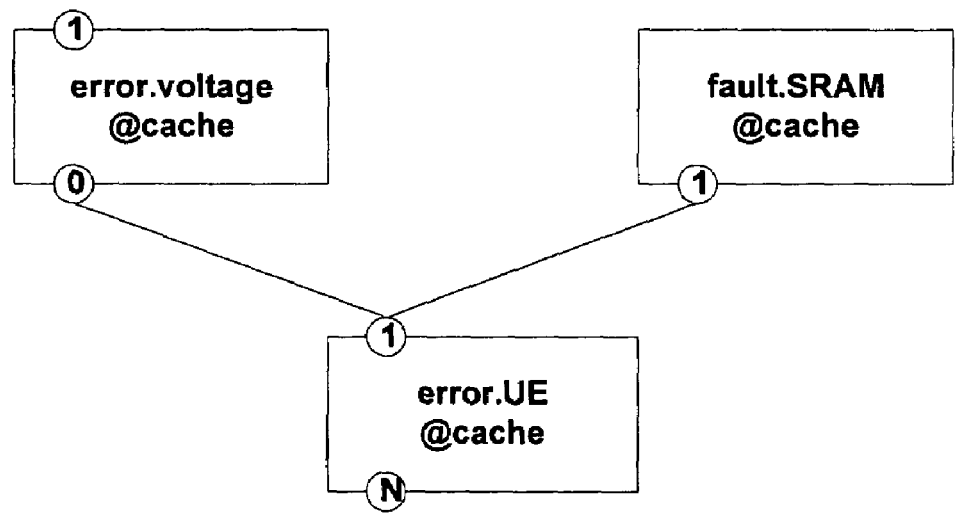

Cause bubble coalescing is illustrated in FIGS. 8A and 8B, which can be regarded as representing a detail from the fault tree diagram of FIG. 3B. In FIG. 8A the error.UE@cache has two separate cause bubbles, one to receive a may propagation from error.voltage@cache, and the other to receive a must propagation from fault.SRAM@cache. In FIG. 8B, these two separate cause bubbles have been combined into a single cause bubble. Again, this combination does not impact the overall behaviour of the fault tree (i.e. the behaviour of FIG. 8A is the same as that of FIG. 8B).

Cause Bubble Expanding: From a logical perspective, a single event may have multiple cause bubbles, such as error.UE@cache in FIG. 8A, which has two cause bubbles. However, it may be easier to process a fault tree diagram if events have a single cause bubble and a single inhibit bubble (at most). This can be accommodated by automatically inserting dummy errors into the fault tree. These dummy errors do not modify the overall behaviour of the fault tree, but they do allow the fault tree to be constructed in a form in which each event has at most one cause bubble (plus inhibit bubble).

Figure 9A:
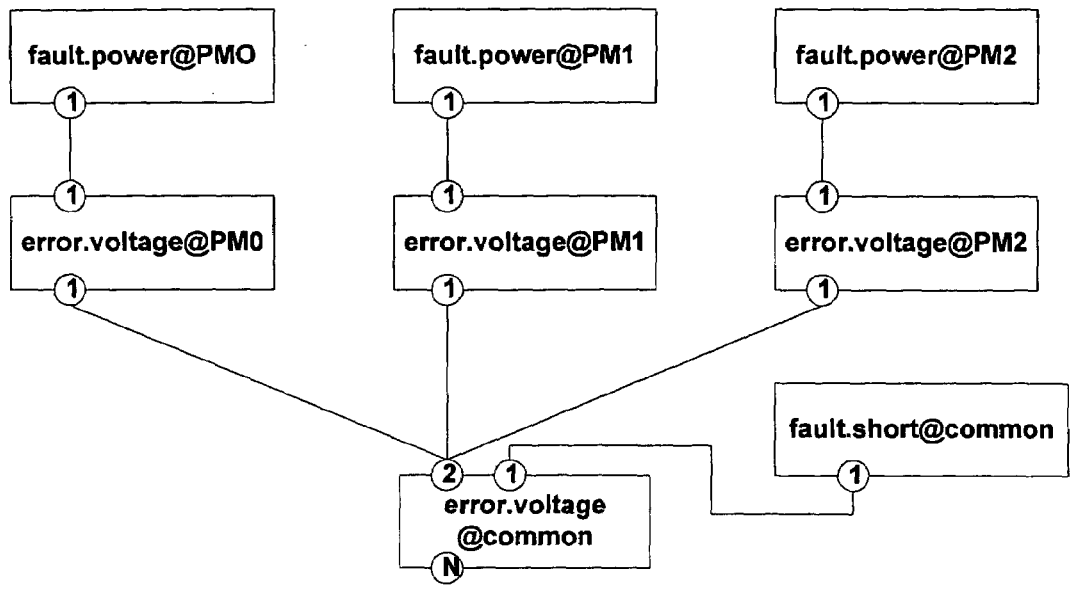
FIGS. 9A and 9B are two fault tree diagrams in accordance with one embodiment of the invention both representing the same behaviour (derived from the power supply circuit of FIG. 5A), and more particularly illustrating how fault tree diagrams may be converted to remove an event having multiple cause bubbles.
Figure 9B:
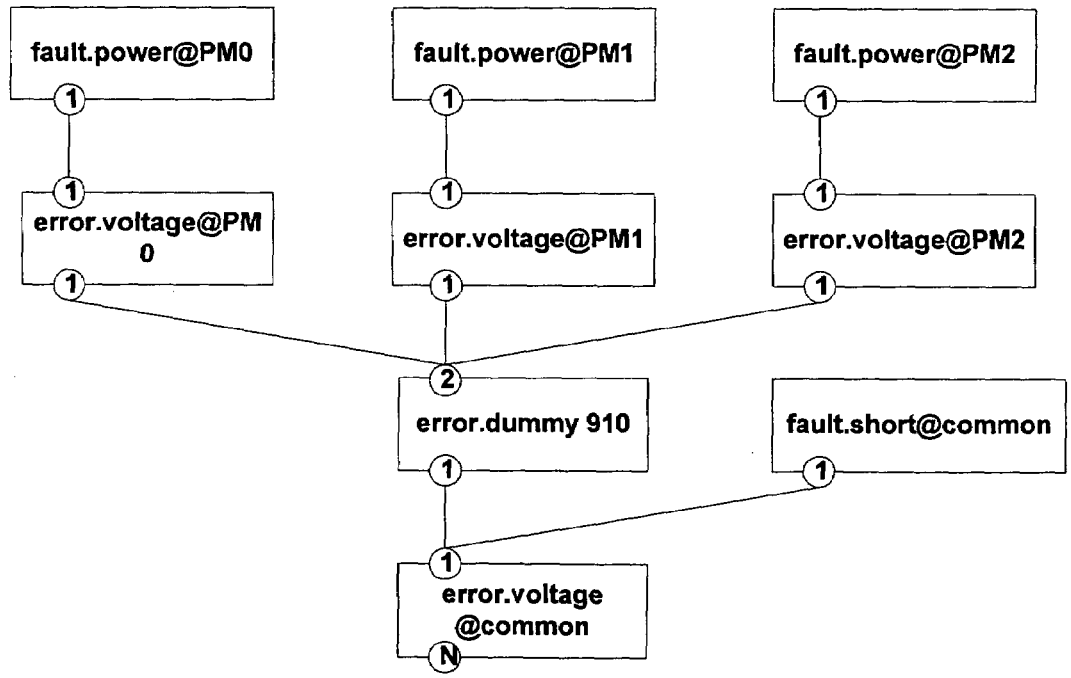

An example of the insertion of a dummy error is shown in FIGS. 9A and 9B. These are based on the fault diagram of FIG. 5B (corresponding to the circuit of FIG. 5A), but with the inclusion of an additional fault on common output bus 515 (fault.short@common). As shown in FIG. 9A, this fault has a must propagation to a corresponding cause bubble on the error.voltage@common event. Consequently, a voltage.error@common is triggered by either: (a) an error in at least two of the power modules; or (b) a short fault on the common bus. Note that the two cause bubbles of error.voltage@common do not both contain K=1, and so cannot be combined directly into a single cause bubble.

However, as shown in FIG. 9B, a dummy error 910 can be inserted into the fault tree diagram. This dummy error does not change the overall functionality of the system—i.e. an error.voltage@common is still triggered by either: (a) an error in at least two of the power modules; or (b) a short fault on the common bus. The fault tree diagrams of FIGS. 9A and 9B are therefore functionally the same. Nevertheless, the inclusion of the dummy error 910 does avoid any event in the fault tree diagram having more than one cause bubble. Tools can be used to add dummy errors 910 automatically if required to derive a form of fault diagram such as illustrated in FIG. 9B.

3.6 Constraints

Figure 10A:
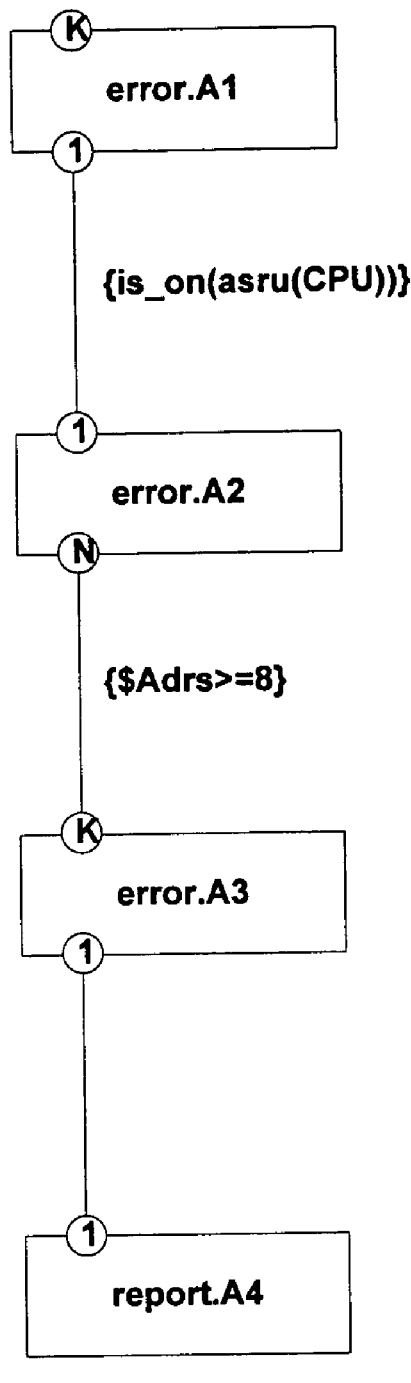
FIG. 10A illustrates a fault tree diagram including constrained propagations in accordance with one embodiment of the invention.

Constraints define in more detail whether a particular error can travel along a propagation, and how much time it takes to go from one end to the other. Constraints are represented graphically in a fault tree as shown in FIG. 10A. By convention, constraints are placed to the right of the relevant propagation in a fault tree diagram. Note that although in FIG. 10A the two different constraints are on different propagations, it is possible to have multiple constraints on the same propagation.

3.6.1 Parametric Constraints

Parametric constraints allow the fault tree to specify how propagation of a particular error can depend on some internal detail, such as the address of a transaction. A parametric constraint evaluates to TRUE, which allows the propagation to occur, or FALSE, which does not. Parameters are associated with individual errors travelling through the tree. An error created at a problem, travelling along propagations, and causing a report, is considered to have the same value for its parameters along its whole journey, unless a constraint specifies an assignment (see below).

FIG. 10A illustrates a parametric constraint, in which propagation from error.A2 to error.A3 can only occur if the parametric constraint {$ adrs >=8} evaluates to TRUE. (In fault tree diagrams, parameters involved in constraints begin with $, like $adrs). In FIG. 10A, $adrs is some internal detail of the particular error being propagated, not otherwise visible on the fault tree. When it comes to making inferences from observations for diagnosis, the value of $adrs may or may not be known. Nevertheless, it is possible to make useful inferences in either case. For example, if a further propagation from error.A3 (say to error.B1—not shown in FIG. 10)) included the constraint {$adrs <5}, then it would be known that no possible value of $adrs could cause an error to propagate from error.A2 through error.A3 to error.B1, since the two constraints are mutually exclusive in terms of their specified range of $adrs.

Assignments, expressed like {$adrs=8} can also be included in parametric constraints on propagations. Such an assignment implies: "This propagation may occur, irrespective of the value of the incoming value of $adrs, but the outgoing value on the propagation will be $adrs=8".

A report into the diagnosis system may provide information on the value of parameters associated with the particular error detected. This can then be used in inferring possible causes of the error. For example, the observed parameter value may exclude one or more propagations that lead to the error. FIG. 10A illustrates the association of parameters with a report, in which AFAR represents a property in the report, and the value of the property represents an address (corresponding to $adrs). Only an error with a value of the parameter $adrs equal to the AFAR property value can have caused this report.

In some cases, limit values may be derived from the report. For example, the declaration of a report from a voltage detector might include:

{($voltage > (getprop("VOLTAGE") − 0.3))

&& ($voltage < (getprop("VOLTAGE") + 0.3))}

This would be appropriate if it was known that the actual voltage could be up to 300 mV either side of a detected value because of shortcomings in the measurement.

3.6.2 Configuration Constraints

A configuration constraint allows a propagation to occur only if the system configuration, at the time the error could propagate, satisfies the requirement(s) specified in the constraint. For example, in FIG. 10A, {is_on (asru(cpu))} is a configuration constraint. If the configuration is set so that asru(cpu) is "on", then the propagation from fault.A1 to error.A2 can occur, but if asru(cpu) is off, the propagation cannot occur. To evaluate configuration constraints, the fault management system obtains the relevant information from the configuration management system 130 (see FIG. 1B) for the time period when the propagation might have occurred.

3.7 Propagation Timing

In a real system, propagations do not all happen instantaneously. Some propagations take a specific (predictable) time to occur, while other propagation times may be dependent upon system activity.

Figure 10B:
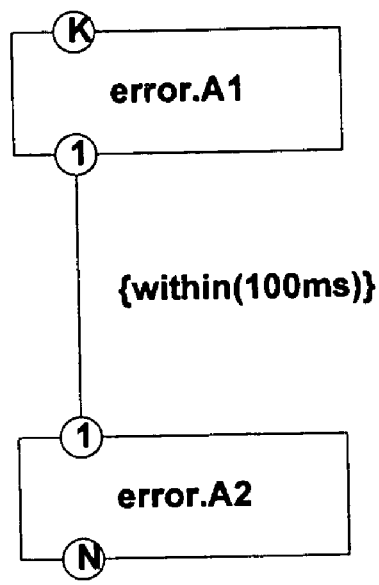
FIGS. 10B and 10C illustrate fault tree diagrams including timed propagations in accordance with one embodiment of the invention.

Timed propagations: Timed propagations occur within a specific delay, independent of the operation of the system. FIG. 10B illustrates a situation where if error.A1 is present, then it must cause error.A2, but error.A2 may not be present until 100 ms after error.A1 is present. The time specified for a propagation delay may vary from zero through any fixed time (or, possibly, a time dependent only on the configuration) up to infinity. Of course, propagation times of zero or infinity are not physically realisable per se; nevertheless, they may represent a sufficiently accurate indication of the true propagation time for diagnosis purposes.

An example of when a (relatively) slow propagation between two errors may occur is loss of AC power to a computer system. Thus most computer systems include a power module that receives AC power as input, and then outputs DC power to the rest of the system. If AC power into the power module is suddenly switched off, the power module output does not immediately disappear. This is because a typical power module includes energy storage elements (capacitors) that are capable of delivering power for (at least) one cycle of the alternating current. Consequently, an error in the AC input voltage does not immediately cause an error in the power module output voltage. Rather, the latter error appears some time later, once the stored energy from the capacitors has been dissipated.

Slow propagation to reports may also occur because an error detector takes or uses time to detect errors. For example, an error detector may signal a report when two heartbeat packets have failed to appear within a timeout period on a network. If the expected heartbeat interval is 7 s, then the maximum propagation time to the report is 14 s. Propagation delays can also be caused by the nature of system operations. For example, a system might guarantee to read all memory every twelve hours. It can then take up to twelve hours for an error stored in memory to propagate to an error visible on an IO bus.

An event that causes a may propagation arises and continues to be active until eliminated by some action in the system. Throughout this time when the causative event is present, the propagation may, or may not, proceed (depending upon the precise circumstances at the time). Thus the time period during which the propagation can actually occur extends from the time the causative event first becomes present to the time that some specific action, typically triggered by diagnosis of the problem, removes the causative event. The maximum effective propagation delay may therefore be longer than any time that can influence the diagnosis or subsequent action (and so for present purposes can be regarded as indefinite). In some circumstances, a may propagation can be considered as a must propagation with an infinite maximum propagation delay. This might be the case for example if there is an error at a certain storage location, perhaps on a disk unit, but there is no guarantee that the system will ever access this particular location within any arbitrary (predefined) time period.

Figure 10C:
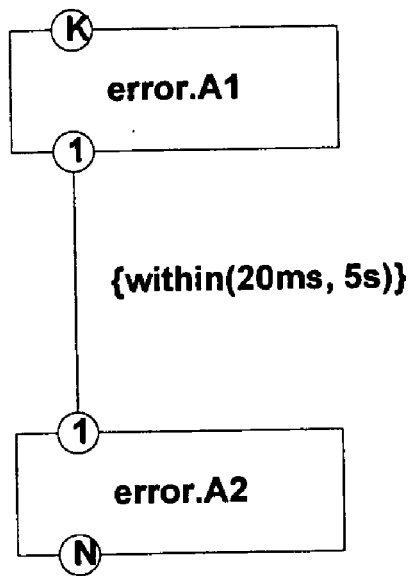

Min and Max time: the usual assumption is that a specified propagation delay (such as shown in FIG. 10B) is a maximum. The actual propagation delay observed in a system can be anything from zero up to this maximum time. This modelling of delays from zero up to a specified maximum is adopted in many aspects of system design other than fault trees (such as simple models of logic gate delay). However, in some circumstances it may be desired to specify not only a maximum propagation time period, but also a minimum propagation time period (perhaps a clock cycle, or a retry period). This is illustrated in FIG. 10C, where a propagation is indicated as having a minimum propagation time of 20 ms, and a maximum propagation time of 5 s.

3.8 Polling

In some situations a polling routine may be used to enable the propagation of an error to an error detector, and hence to generate a report. Indeed, any propagation in a fault tree may be controlled by a polling operation, and such a polling operation may be incorporated into the fault tree diagram.

A polled propagation does not happen within a defined time, but happens instead when a defined operation takes place, typically under the control of the diagnosis system. In this case, the diagnosis procedure may be used to determine which polling routines need to be run and at what time(s) in order to progress the diagnosis.

Figure 11A:
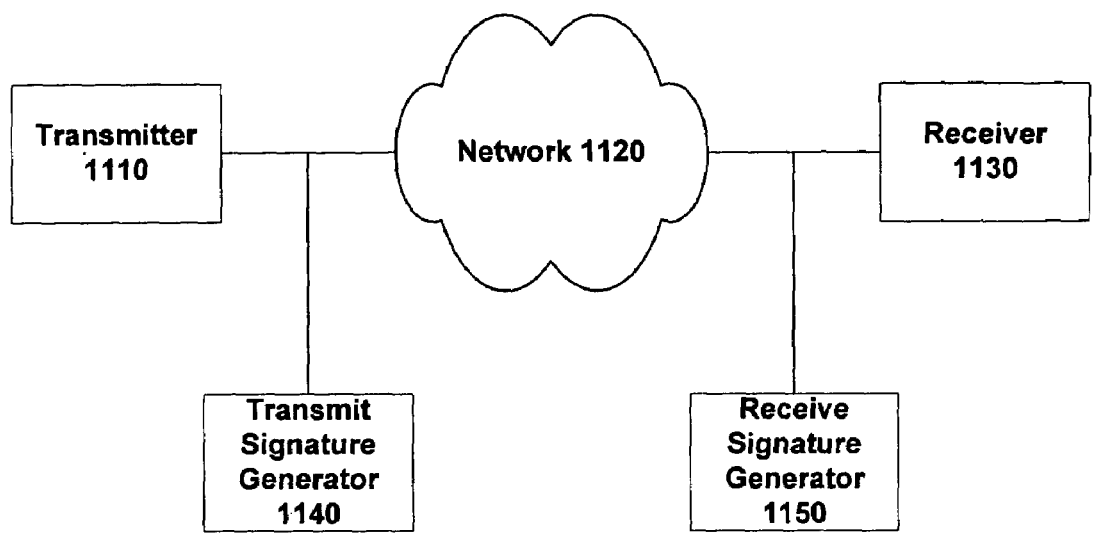
FIG. 11A is a schematic diagram of a transmitter/receiver circuit having signature generators.

FIG. 11A illustrates the use of polling in a communications system that includes a transmitter 1110 and a receiver 1130 connected by a network 1120 (which may represent a line on a PCB, a bus, an Ethernet, or any other appropriate form of data link). Attached to the transmitter is a unit 1140 that generates a first signature of an outgoing message, while attached to the receiver is a unit 1150 that generates a second signature of the incoming message. All being well, the first and second signatures should be the same (for a given message). However, if an error occurs over network 1120 then the two signatures will differ. (This is a good technique for locating errors without adding to communications overhead).

In general the comparison between the two signatures is performed using a separate channel from network 1120 (this separate channel is not shown in FIG. 11A). One mechanism is to broadcast a signal to cause signatures to be captured at each end of the link. The signatures can then be read out via a maintenance bus (for example) and the two values compared in software. If the values differ, i.e. the two signatures are not the same, the software creates a report for the error.

Figure 11B:
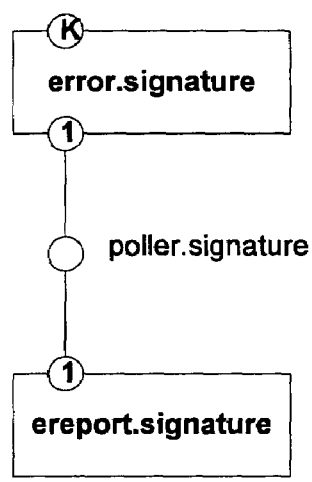
FIG. 11B is a fault tree illustrating the use of polled propagations to perform signature testing in the circuit of FIG. 11A in accordance with one embodiment of the invention.

FIG. 11B illustrates how this polling action is represented in a fault tree diagram. Note that a polled propagation has a circled embedded in it, and is marked with the name of the associated poller. In the configuration shown in FIG. 11B, if the diagnosis system wishes to discover if error.signature is present, it must run poller.signature, and then see if ereport-.signature has been observed. If so, this implies the existence of error.signature.

Note that timing plays a part in running polling routines. For example, in FIG. 11B, poller.signature must be run after error.signature has appeared in order to produce report.signature. A diagnosis system can generally determine the relevant timings from the propagation delays in the fault tree diagram. Accordingly, the diagnosis system can hold off running a polling routine until the causative event has had time to appear.

A polling routine may also be able to constrain the earliest appearance of a fault. For example, if a polling routine is run and an error is not present, then this may demonstrate that no fault was present at the time of the polling. Some embodiments may use polling routines on a regular basis to provide this sort of information.

In some situations, the diagnosis system may have to run a polling routine more than once. This might be the case, for example, if the causative event of the propagation enabled by the polling routine may potentially occur at more than one time, so that the system cannot be sure of the timing of the propagation.

Note that polling routines are often configured to do more work than might be associated with just a single propagation. Thus one polling routine might enable multiple polled propagations. For example, with the signature checking arrangement of FIG. 11A, it may be that one broadcast command captures all signatures throughout the machine. This implies that it is not normally attractive to run such a polling routine time and time again on an automatic basis, given the amount of work that this involves. Rather such polling can occur as and when required by the diagnosis system (to the extent that this is feasible), for example in response to receipt of a particular error report, or if a certain suspect fault has been identified.

The present implementation does not support a propagation being marked as both timed and polled. If this is in fact how the system works, then a dummy error can be inserted as previously described to split the propagation into a polled propagation and a timed propagation as appropriate.

3.9 Integrating Tests into Fault Trees

Although tests have traditionally been quite separate from fault trees, as taught herein they can in fact be represented with advantage in fault tree diagrams. In particular, a test can be modelled as a polled propagation in the fault tree diagram. For a test routine that provides no new error detection capability, this propagation parallels the propagation representing exercise of the problem in normal operation.

Figure 12A:
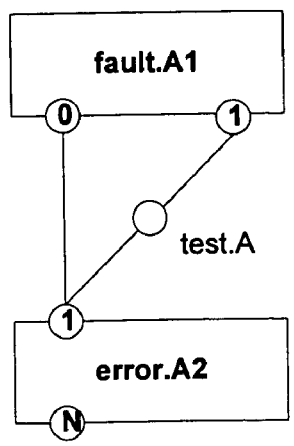
FIGS. 12A, 12B and 12C are fault tree diagrams illustrating the use of polled propagations for testing purposes in accordance with one embodiment of the invention.

This situation is illustrated in FIG. 12A, in which the problem fault.A1 may propagate in normal operation to error.A2. As usual for may propagations, no time limit is specified (in practice the time would depend on how the system exercised the fault). There is also a second propagation between fault.A1 and error.A2, with a propagation time determined by the polling routine test.A. This is a must propagation. Consequently, if test.A is executed after fault.A1 appears, a propagation from fault.A1 to error.A2 must occur. Note that the cause bubble at the top of error.A2 shows that if either one of the two propagations from fault.A1 occurs then this will cause error.A2.

Figure 12B:
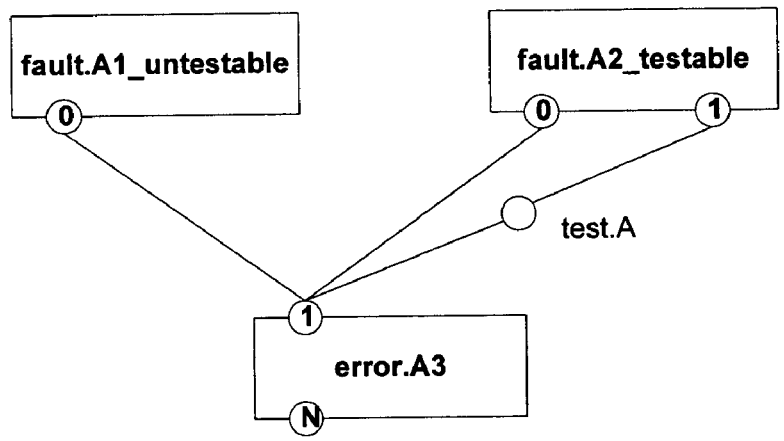

In some situations, the test may not have complete coverage of the fault. In this case we can separate the fault into two different faults, as illustrated in FIG. 12B. One of these faults is testable, and the other untestable. Note that the sum of the FIT rates for fault.A1_untestable plus fault.A2_testable should equal the original FIT rate of fault.A1 in FIG. 12A (the circuit has not become less reliable just because it has been represented differently in the fault tree diagram). With the configuration of FIG. 12B, whenever either fault.A1_untestable or fault.A2_testable appears, then both will appear in a suspect list from diagnosis. Running test.A can then be used to differentiate between these two possibilities.

A more problematic issue is when a fault is intermittent. For example, a cracked circuit trace may or may not function properly, depending on temperature, humidity, etc, or any other environmental parameter that affects the mechanical arrangement of the board. Likewise, a circuit with insufficient noise margin may or may not function properly, depending upon other activities at the relevant time (such as signal flow in other lines). In such circumstances, a test routine when run may or may not generate an error. One possibility is therefore to model such situations using a polled may propagation in order to represent the test routine.

Figure 12C:
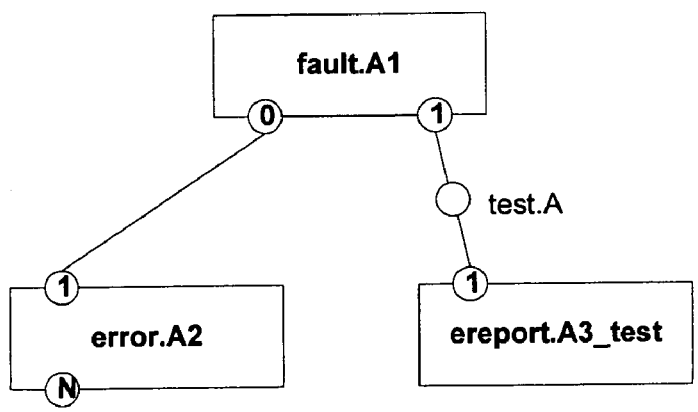

In some cases, a test may produce an entirely new report of an error. This report is only available when the test is running, and represents the specific result of the additional error detection capabilities of the test itself. FIG. 12C provides an example of how this can be modelled in a fault tree diagram, by using a polled propagation from the fault to a test report. Note that in this case there is a direct propagation from the fault (fault.A1) to the resultant report generated by the test (ereport.A3_test).

It will be appreciated that the features of FIGS. 12A, 12B, and 12C can be combined as appropriate. For example, this might be used to describe tests that not only include their own error detectors but that also cause propagation to runtime detectors.

3.10 Stored Errors

Figure 13:
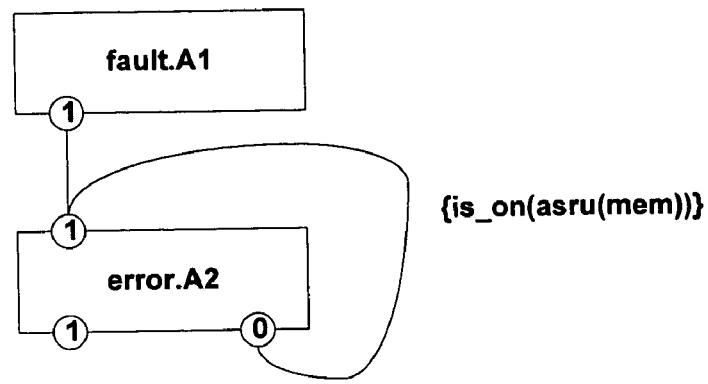
FIG. 13 illustrates a fault tree diagram incorporating stored errors in accordance with one embodiment of the invention.

Errors can be stored in the system, for example in memories and latches. Such stored errors can be represented in a fault tree diagram as shown in FIG. 13 by the use of a feedback loop from the effect bubble of an error event to the cause bubble of the same event. A momentary error may propagate to become a continuously present error by being stored. Stored errors are considered to retain all the parameters which describe them while they are stored, and after they are read out from the store.

Most reports on fault trees represent implicit error stores, in that when a hardware error detector detects an error, status about the event is usually captured in a register, which acts as an error store. It is common to clear out some captured status as soon as the report has been delivered, although this isn't normally represented on a fault tree diagram. (Error detectors that sample rather than latch errors can be represented in fault tree diagrams by a may propagation or a suitably polled propagation).

If a feedback loop around a stored error opens, the error ceases to be stored. The feedback loop can be given a constraint, typically based on configuration, to represent this, as shown in FIG. 13. In this diagram, the constraint is_on (asru(mem)) indicates that the memory is automatically cleared of all errors by the system if the memory is turned off, for example by rebooting. (Constraints on propagations are discussed in more detail below).

A must propagation on a feedback loop indicates that the error must remain stored once it has appeared, until it has been cleared out either by the feedback loop opening, or by a propagation to any inhibit bubble of the error event. This is appropriate where the error cannot be overwritten by correct data, for example in a FIFO buffer. A may propagation on a feedback loop indicates that a stored error may disappear at any time, when the feedback loop happens not to propagate. This is appropriate when new, correct data could overwrite a previously stored error, such as in conventional RAM.

Stored errors may be cleared by a propagation to the inhibit bubble of the feedback loop. The inhibit bubble overrides the cause bubble, so this clears out an error irrespective of what is happening to the feedback loop. One possibility is that the propagation to the inhibit bubble represents a reset signal, that is specifically intended to remove stored errors. If the signal propagating to the inhibit bubble has no parametric constraints, it is presumed to clear all errors from the store. However, if the signal has a constraint such as {$adrs:=0x1234} then only a stored error which has a constraint {$adrs==0x1234} will be cleared out.

In one implementation, an error can be defined as a stored error. This then avoids formally having to include the feedback propagation of FIG. 13. (Any constraint associated with the feedback propagation, such as the is_on (asru (mem)) of FIG. 13, can be included in the definition of the stored error).

3.11 False Positive and False Negative Reports

Error detectors in real systems suffer problems that create either false positive reports or false negative reports. A false positive report is a report that appears when the error supposedly being detected is not in fact present. In contrast, a false negative report represents the absence of a report, despite the fact that the error actually is present. These events can be modelled in a fault tree with specific faults that propagate directly to the reports involved. Note that the diagnosis of a false negative fault requires a diagnosis algorithm that can handle two simultaneous problems, since a false negative fault is only exposed when some other problem should have created the report in question.

Figure 14:
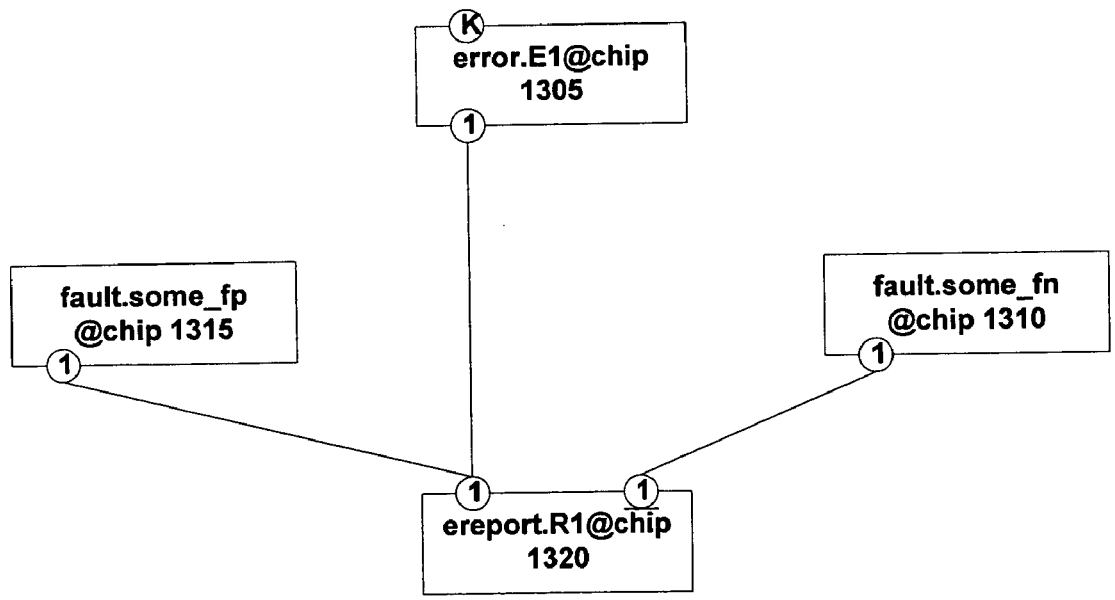
FIG. 14 illustrates a fault tree diagram illustrating false positive and false negative reports in accordance with one embodiment of the invention.

FIG. 14 illustrates a situation where a chip error report 1320 is normally generated by the detection of some error on the chip 1305. However, this same report may also be generated by a false-positive report 1315. (Note the must propagation from the fault 1315 to the error report). FIG. 14 also illustrates a fault 1310 that represents a false negative. This fault is connected to the inhibit bubble of report 1320 and prevents a report being generated, irrespective of whether or not error 1305 is present.

3.12 Propagations to Diagnostic System

The model presented so far does not incorporate the transfer of reports into the diagnostic system. Reports represent the end of event propagation, and do not cause any further effects; rather, the diagnosis system is assumed to automatically acquire reports by some appropriate mechanism. This is a reasonable assumption in principle, since if the transfer of reports into the diagnostic system were subject to significant failure, then one could reasonably regard the diagnostic system as broken.

Nevertheless, in practice the transfer of a report into the diagnosis system may occasionally be subject to loss or delay. This is particularly the case if the transfer involves multiple stages, or is over some complex form of communications link. It is desirable to be able to accommodate such loss or delay of a report in the diagnosis.

The loss of a report may be modelled by appropriate use of an inhibit bubble. Note that an inhibited or masked report may potentially become visible at some later time. For example, if the diagnosis system cannot initially access a report due to a failed communications link, the report may nevertheless become subsequently accessible if the failure on the communications link is later cleared.

One strategy to compensate for any delay in receiving a report into a diagnostic system is for a detector to include a facility to timestamp recorded errors. The resulting report can then specify the time at which the error was detected, or possibly an (earliest, latest) timestamp pair. Assuming that there is some knowledge of the propagation time from the event that caused the error detection, this allows the diagnosis to place earliest and latest feasible time limits on the appearance of the causative event concerned. This can be done using the timestamp information, and is independent of any delay in transfer of the report from the error detector into a diagnosis system.

Propagation delays are also relevant to determining how long the diagnosis system should wait for a report to appear. Thus it is not practicable for the diagnosis system to wait indefinitely for all error reports to be collected, rather a diagnosis has to be produced after some appropriate (finite) time. Propagation delays within the fault tree limit how short this time can reasonably be. In addition, the time provided for diagnosis must allow for any delay needed to capture reports into the diagnosis system (as opposed to just the creation of the report by an error detector).

The delay between an error being detected and the report becoming visible to the diagnosis system may vary significantly. A precise exception in software might deliver the report to the diagnosis system in microseconds. At the other end of the scale, a report might have to be sent down a congested network and take seconds or longer to arrive. One possibility is simply to set a single maximum reporting time for the whole system, although this over-estimates the reporting time for some reports. A more accurate approach is to set different maximum delays for different reports, based on a knowledge of system architecture.

3.13 Report Names

Information about a detected error can be transmitted to the diagnosis system in part by the name of the report created, and in part by the values of named properties attached to the report by the error handler. Most hardware error detectors monitor one or more signals, and capture information in a register when they detect an error. The register is then full, and further errors of the same type, or using the same status registers, will not be captured until the registers have been emptied. Clearing out the status register for the next error is usually a software function performed later.

The fault management system 120 (see FIG. 1B) assumes that each separate named report corresponds to a separate error status. When a report appears, the error status is assumed full, leading to possible information loss, until that status is cleared and the error detector re-enabled. Error handlers provide details specifying when an error detector is re-enabled (or if the detector is never disabled in the first place). The diagnosis system assumes that later instances ("observations") of reports with the same name might be missing (if the detector has not been re-enabled).

Reports should therefore be named such that reports that are disabled by the arrival of one error are named in the same way. Thus if two different errors are detected by the same detector, which then becomes disabled, the reports should have the same name, so that the diagnosis engine can recognise the loss of report information concerning both errors after detection of just one of the errors. Even if the detector can in fact distinguish between the two different errors, this additional information should be transmitted as an extra property of the report. Conversely, it is not appropriate to give the same name to reports of two different errors, if disabling one error detector will not temporarily inhibit reporting of detection of the other error.

4. Fault Tree Language

It is desirable to generate as accurate a fault tree representation of a system as possible. In practice, this is a fairly length process to do by hand for a complex system. Therefore, a language has been developed to allow a formal (textual) specification of a fault tree. It is generally easier to create (and then utilise) a complex fault tree using this language than to work directly with the fault tree diagrams so far described. Nevertheless, it will be recognised that the graphical diagrams and the language listings are alternative representations of the same underlying fault tree, and either representation can be used according to the particular circumstances. A tool can be provided to convert by machine from one representation to another.

In one embodiment, a special language named eversholt has been developed for representing fault trees. Note that eversholt is not a general purpose programming language—there are no loops or if-then-else statements, and compiling eversholt does not produce executable code. Instead, eversholt is a special-purpose language for concisely describing fault trees. An eversholt fault tree is written for a given platform and is independent of the particular configuration of any given system. In other words, the eversholt fault tree can be regarded as a class file that is generic to the platform. On any given machine, this class file or configuration-independent fault tree representation 123 is then combined with the configuration data 135 for that machine (see FIG. 1B) in order to generate an instance of the fault tree that is applicable to that particular machine.

In one particular embodiment, a fault tree description is initially written as an eversholt source file, having a ".esc" file extension, and then converted into a binary representation of the fault tree, having a ".eft" extension. The conversion of eversholt source files into a binary fault tree can be considered as a form of compilation, and hence this action can be referred to as compile-time. Compilation is generally performed by the system manufacturer prior to customer shipment of a machine. We can also speak of run-time, when the fault tree is used together with configuration information on a particular machine, such as for diagnosis, as well as load-time, which can be regarded as the initiation of run-time. Load-time and run-time typically occur on a machine at a customer location, but may also be performed by the system manufacturer (e.g. for testing purposes).

In one embodiment, a machine implements a directory structure for holding various .eft files. Multiple sets of binary .eft files can then be installed onto each machine, and grouped by instruction set, platform, OS type, and so on. Tools that use the .eft files can then search for the appropriate .eft binaries for that particular machine on start-up (this is analogous to the way various device drivers are loaded by the kernel of the Solaris operating system from Sun Microsystems Inc.).

4.1 Eversholt Source Files

The eversholt source code for a specific platform may be organized as a single file, any number of files, or as a hierarchy of #include files. The eversholt compiler takes whatever files are presented and produces a single binary file as output each time it is run. The fault management architect for a platform can decide if many eversholt source files should be compiled individually, delivering many separate binary files, or if they should be compiled together into a single binary file. The resulting system behavior will be no different provided the same set of eversholt rules are loaded via one file or via many files.

All eversholt source files are run through the C preprocessor, cpp before compilation. This allows directives like #include and #ifdef to be used as they would be in a C language file. All C preprocessor directives must start with a pound sign # in the first column of a line. When eversholt source is run through cpp, the compiler provides the appropriate options to cpp so that there are no pre-defined symbols or include directories (this is different from the typical situation with C source code). In one embodiment, the eversholt compiler does allow the definition of cpp variables with the -D command-line option just like standard C compilers, but this should still be used with great care. In particular, a directive such as #ifdef gets expanded at compile-time, so it does not necessarily reflect information about the platform that the eversholt binary ends up running on.

4.2 Language Constructs

Each construct of the eversholt language will now be described.

4.2.1 Statements

Eversholt statements always terminate with a semicolon. There are two classes of eversholt statements: declarations and propagation relationships. In general, the order in which the statements appear in the file is insignificant, although an event must be declared before it is used.

4.2.2 Constants

Eversholt supports three types of constants:
1. Numbers (integers)
2. Timevals (integers with accompanying time units)
3. Strings Numbers follow the C language syntax, including octal and hex formats. For example, the numbers 123, 0173, and 0x7b all mean the same thing: decimal 123.

Timevals are integers followed by a word showing the time units being used. For example, 1day, 24hours, and 86400s all mean the same thing: a period of time equal to a full day. The following words are supported as time units:
    us microsecond microseconds
    ms millisecond milliseconds
    s second seconds
    min mins minute minutes
    hour hours
    day days
    week weeks
    month months
    year years In addition, the integer zero and the word infinity are allowed as timevals by themselves. These are the only times a timeval is not a number/name pair. The value infinity is intended for use with the within statement to provide a way to specify infinite propagation delays (as described in more detail below). Note that timeval units are not considered reserved words in the eversholt language, so that they may be used in event names. The special meaning of these words only applies when they follow a number to create a timeval.

Strings are arbitrary text surrounded by double quotes. The use of strings in eversholt is rare, since eversholt itself is more or less a string manipulation language, where the strings are in the form of an event class or component path. Typically strings are used as arguments to externally supplied functions (as described in more detail below).

4.2.3 Expressions

The term expression in eversholt is used broadly to cover a range of things, as set out below, although the particular context of any given expression may disallow some of the variations. For example, a declaration may define property=value pairs where the value is broadly defined as being an expression, but specific properties may require specific types, such as the N and T properties on a SERD engine, which are required to be an integer and a time value respectively, so that any other type of expression will generate a compile-time error. When there is this sort of restriction on what types of expressions are allowed in a given context, those restrictions are described herein in conjunction with description of the specific context. For example, the restrictions on what types of expressions may be used for the fault event properties appear in the section on fault events The following items are valid expressions:

Constants—(as Discussed Above)

Variables or Iterators—the terms variable and iterator are used interchangeably herein. A statement scoped variable applies only to a single semicolon-terminated statement. Any mention of the same variable in another statement refers to a completely unrelated variable whose scope is limited to that (other) statement. A statement scoped variable starts with a letter and then contains any combination of letters, numbers, or underscores. A statement scoped variable looks like a C variable name.

A parameter variable describes some parameter (property value) of a propagating error, and looks just like a statement scoped variable, except that it begins with a dollar sign ($). The scope of a parameter variable corresponds to the path along which the relevant error is propagating.

Functions—the term function in eversholt refers more to the syntax than the semantics. Although eversholt function calls look similar to C function calls, there are important differences. Thus all functions in eversholt are built-in, defined by the language. The eversholt functions are:

call—calls an externally-provided function.

getprop—looks up a property in the payload of a report and returns that value.

confprop—looks up the value of a configuration variable from the configuration database.

is_on—configuration condition: true if the given ASRU is on (this is a short-cut compared to using the confprop function to access the "on" configuration variable).

is_connected—configuration condition: true if two components are connected.

within—specifies propagation delays.

Boolean Expressions—like the C language, an expression is considered false when it evaluates to zero, true otherwise (but unlike C, assignment statements don't quite follow this model, see below). Expressions may be assembled with parenthesis, and the operators ==, !=, &&, ||, and !. All of these operators have the same meaning as in the C language.

Assignment Statements—assignment statements in eversholt are used to capture values in variables for later use. However, they do not evaluate to the value assigned like they do in C. Instead, assignment statements are always true. In other words, even if the result of an assignment is zero, the assignment statement is evaluated as true so that the event is not elided from the prop statement.

Events and Component Paths—events and component paths (as described below) are valid eversholt expressions although they typically are not combined with other subexpressions. For example, adding an integer to an event would make no sense and would thus produce a compile-time error.

4.2.4 Events

An event name is typically made up of several parts as set out below.

| Fault.power.output_short @ | acside/pm | { is_on(acside/pm) } |
|---|---|---|
| Event class | component path | Constraints |

Only the event class is a required part, but most hardware related events contain a component path as well. The constraint part is not allowed in all the places where an event may appear. N.B. The "at sign" (@) is not used anywhere else in the eversholt language—it always separates an event class name from a component path name. Likewise, curly braces { } always surround constraints and are not used for anything else in eversholt.

When an event is defined in eversholt, it always has an event class. It may or may not have a component path. For example an event representing a fatal software bug in a sendmail program might be named:

defect.sendmail.fatal

In a system where only a single sendmail program may be running at any given time, the above definition doesn't require a component path because it is clear which sendmail is meant. However, in a system where many sendmail programs may be running, more information is necessary to qualify which event is meant:

defect.sendmail.fatal@sendmail_daemon

Here, eversholt will fill in the instance number after sendmail_daemon when diagnosing that defect.

In practice, eversholt events almost always have both event class names and component path names. Since the event declaration contains both names it follows that eversholt considers two declarations with the same event class and different component paths as different declarations. Likewise, two declarations with different event class names but the same component paths are also considered different declarations. In this context, having different declarations implies that the events are unrelated as far as eversholt in concerned. For example, they may be used in prop statements as if they were completely separate events.

The event class is a name containing dots that join the most general class name (leftmost) to more and more specific class names (moving left to right) in a hierarchical manner. The top-level (leftmost) class name is the only component interpreted by eversholt, and must be one of the following:

fault
   upset
   defect
   error
   ereport

Note that an event class is the name of an event, not the name of any hardware or software components. The event class does not contain slashes or instance numbers, unlike like component paths.

A component path is a slash-separated path similar to the device tree used in the Solaris operating system (available from Sun Microsystems Inc), except that instance numbers are omitted in eversholt. This allows eversholt files to be configuration independent. Instance numbers are only filled in when needed at run-time, when they can be gleaned from the machine configuration (this is normally performed by the diagnosis system at the time of a fault management exercise).

Thus a component path representing a CPU on a system board might look like this:

sb/cpu

In some contexts, components may contain iterators (described in more detail below), for example:

sb[sbn]/cpu[cpun] /* vertical iterators */
sb<sbn>/cpu<cpun> /* horizontal iterators */

4.3 Declarations

All eversholt declarations follow the same general pattern:

reserved-word name-being-declared [ property = value [, property = value . . . ]] ;

The reserved-word is asru, event, engine, or fru. The name-being-declared is a component path when declaring a FRU or ASRU, and it is an event for all other types. After the name the syntax allows for an arbitrary number of property=value pairs. These are not random property names, however. Rather, each type of declaration has a specific list of required properties and a specific list of optional properties, as described in more detail below. Note that the names of these properties are case-sensitive.

4.3.1 event Statements

An event statement declares an event. This serves three purposes in eversholt:

1. It adds the event to the list of known events

Declaring an event allows that event to be used in other eversholt statements. Using an event before it is declared is not allowed. However, the declaration may be repeated later in the source file to add additional properties to the event (see below). This allows event names to be declared via #include files, enables checking against typos in event names, but still allows eversholt source files to add properties to events.

2. It associates properties with events

The name/value pairs in an event statement allow properties to be associated with an event. Note that each type of event requires certain properties to be defined and allows for certain optional properties. Although events may be declared multiple times in a single eversholt source file, declarations may not change the value of a property from a previous declaration of the same event. Declarations may only add or re-state property values associated with an event.

3. It associates global constraints with events

An event statement must name an event, but the constraint part of the event is optional. When a constraint appears, it is evaluated at run time, such as during an eversholt fault management exercise, as if that constraint were present in every place that the event is present. In this way, a constraint specified in the event declaration applies globally. Consequently, if the constraint evaluates to false, every place that event is mentioned is elided, as if the declaration and all uses of that event did not exist (this elision is discussed in more detail below). Note that this is different from when a constraint appears on an event in a prop or mask statement, in which case the constraint is only used to elide the event from that particular statement.

All event declarations must use one of the top-level events mentioned above (namely for a fault, defect, upset, error or ereport). Hence:

event fault.fan.dead@tray/fan, /* allowed */
FITrate=500, FRU=tray/fan;

event alarm.fan.dead@tray/fan, /* NOT allowed */
FITrate=500, FRU=tray/fan;

The type of event also determines how it may be used in prop and mask statements. Nothing is allowed to propagate to a problem, and nothing is allowed to propagate from an error report (ereport).

Fault Events—fault event declarations consist of the reserved word event, followed by an event class that begins with fault., followed by any component path and constraint information, followed by a property=value list. Using a constraint on a fault event declaration will cause that constraint to apply to that event every time it is used in a prop or mask statement. The following properties are used with fault event declarations:

| Property | Required or Optional | Allowed Types |
|---|---|---|
| FITrate | Required | Integer, Function |
| ASRU | Optional | Previously declared ASRU |
| FRU | Optional | Previously declared FRU |

```
/* Example fault event declaration */
event fault.cpu.ultrasparcIII.overtemp@sb/cpu,
FITrate=20,
ASRU=sb/cpu,
FRU=sb;
```

Upset Events—upset event declarations consist of the reserved word event, followed by an event class that begins with upset., followed by any component path and constraint information, followed by a property=value list. Using a constraint on an upset event declaration will cause that constraint to apply to that event every time it is used in a prop or mask statement. The following properties are used with upset event declarations:

| Property | Required or Optional | Allowed Types |
|---|---|---|
| Engine | Required | Previously declared engine name |

```
/* Example upset event declaration */
event upset.mem.bitflip@sb/dimm/chip,
engine=sede.mem.bitflip@sb/dimm/chip;
```

Defect Events—defect event declarations consist of the reserved word event, followed by an event class that begins with defect., followed by any component path and constraint information, followed by a property=value list. Using a constraint on a defect event declaration will cause that constraint to apply to that event every time it is used in a prop or mask statement. The following properties are used with defect event declarations:

| Property | Required or Optional | Allowed Types |
|---|---|---|
| No properties | | |

```
/* Example defect event declaration */
event defect.OS.datacorruption@os;
```

Error Events—error event declarations consist of the reserved word event, followed by an event class that begins with error., followed by any component path and constraint information, followed by a property=value list. Using a constraint on an error event declaration will cause that constraint to apply to that event every time it is used in a prop or mask statement. The following properties are used with error event declarations:

| Property | Required or Optional | Allowed Types |
|---|---|---|
| ASRU | Optional | Previously declared ASRU |

/* Example error event declaration */
event error.power.overcurrent@acside/pm;

Error Report Events—error report (ereport) event declarations consist of the reserved word event, followed by an event class that begins with ereport., followed by any component path and constraint information, followed by a property=value list. Using a constraint on an error report event declaration will cause that constraint to apply to that event every time it is used in a prop or mask statement. The following properties are used with error report event declarations:

| Property | Required or Optional | Allowed Types |
|---|---|---|
| Poller | Optional | Name of external poller program |
| Delivery | Optional | Timeval |

/* Example error report event declaration */
event ereport.cpu.ultrasparcIII.ce@sb/cpu;

4.3.2 fru Statements

FRU declarations consist of the reserved word fru, followed by a component path, followed by a property=value list. The following properties are used with FRU declarations:

| Property | Required or Optional | Allowed Types |
|---|---|---|
| No properties | | |

/* Example fru declaration */
fru sb/cpu;

4.3.3 asru Statements

ASRU declarations consist of the reserved word asru, followed by a component path, followed by a property=value list. The following properties are used with ASRU declarations:

| Property | Required or Optional | Allowed Types |
|---|---|---|
| No properties | | |

/* Example asru declaration */
asru sb/cpu;

4.3.4 engine Statements

Engine declarations consist of the reserved word engine, followed by an engine name, followed by a property=value list. Engine names look very much like event names. They consist of a dot-separated engine class name, which must have a top-level name that is recognized by eversholt (these are specified below). The engine name also may contain a component path, appended to the engine class name with an "at" sign (@), in a similar manner to how events are formed.

SERD Engines—a Soft Error Rate Discrimination (SERD) is represented by the top-level engine class name serd. The following properties are used with SERD declarations:

| Property | Required or Optional | Allowed Types |
|---|---|---|
| N | Required | Integer, Function |
| T | Required | Timeval, Function |
| Method | Optional | Volatile (by default) or persistent |
| Trip | Required | Event |

The SERD algorithm is a thresholding algorithm which uses the above properties to decide when to "trip" and issue the event specified. The properties N and T describe the threshold as a density of events in time (N events within time T). The method property tells the SERD used by the eversholt diagnosis engine whether the SERD state should be stored persistently or not. The trip property says which event to issue when the SERD detects that the events exceed the threshold.

/* Example SERD engine declaration */
engine serd.cpu.ultrasparcIII.ce@sb/cpu,
N=10,
T=12 hours,
method=persistent,
trip=ereport.cpu.ultrasparcIII.too_many_ce@sb/cpu;

Note that at present eversholt supports only one form of SEDE, namely a SERD engine. However, other implementations could support multiple SEDEs, which could require different properties, as appropriate.

4.4 Propagation Relationships

There are two ways to specify propagation relationships: prop statements and mask statements. Since the focus of the eversholt language is to describe fault propagation, the prop statement is probably the most important portion of the language (and perhaps also the most complex). Nothing is expected to propagate to a problem (i.e an upset, to a defect, or to a fault). Likewise, nothing is expected to propagate from an ereport. These propagation restrictions are enforced by the eversholt compiler.

Other than the first word of the statement, the syntax of the prop statement is the same as the syntax of the mask statement, although the semantics of course are different. As the name implies, a prop statement defines a relationship in which the events on the left of the arrow ("→") may cause the events on the right side. The mask statement defines an inhibit relationship where the events on the left side of the arrow may mask (i.e. prevent the observation of) the events on the right side. It will be appreciated that in general prop statements are far more commonly used than mask statements.

4.4.1 prop Statements

The syntax of a prop statement is built around the arrow "→" which shows cause and effect. Events on the left side of the arrow cause events on the right side of the arrow as depicted in the following example.

| prop | fault.something | -> | error.something | ; |
|---|---|---|---|---|
| | Cause | | Effect | |
| | event list | | event list | |

Consider a simple fault tree in which a fault "a" propagates to an error "b", which in turn propagates to an error report "c". There are two ways to represent this fault tree in the eversholt language. The first is to use two prop statements:

prop fault.a → error.b;
prop error.b → ereport.c;

An alternative approach is to write this in eversholt by using a cascading prop statement:

prop fault.a → error.b → ereport.c;

The above two examples are functionally the same. Using separate prop statements or a single cascading prop statement produces identical results for this particular set of propagations. However, this is not generally true, owing to the way iterator scoping works.

In the following example, a prop statement is shown where the event on the left side and the event on the right side have the same component paths:

| prop | fault.a@x/y | -> | error.b@x/y | ; |
|---|---|---|---|---|
| | Cause | | effect | |
| | event list | | event list | |

Component paths do not contain instance numbers in eversholt in order to allow the propagation rules to be configuration independent. At run-time therefore, a diagnosis engine (or other user of the fault tree) can detect the same component names on the left and right sides of the above prop statement, and match up their instance numbers. This inference process happens with each word in the component path individually, so if the left side contains x/y/z and the right side contains x/foo/z, eversholt matches the instance numbers associated with x and z since these words match. More complex relationships can be specified if so desired using explicit iterators, as shown in the following example:

| prop | fault.a@x[xnum]/y[ynum] | -> | error.b@x[xnum]/y[ynum] | ; |
|---|---|---|---|---|
| | Cause | | Effect | |
| | event list | | event list | |

Since the iterators in the above example match up between the left side and the right side, the statement is functionally equivalent to the one shown in the previous example, which used implicit iterators instead of explicit iterators.

When the iterators do not match up, we have the situation shown in the following example:

| prop | fault.a@x/y[iterleft] | -> | error.b@x/y[iterright] | ; |
|---|---|---|---|---|
| | Cause | | effect | |
| | event list | | event list | |

This example shows a propagation relationship between fault.a@x/y and error.b@x/y where the instance number for x must match but the instance number for y need not match. The fact that the iterators iterleft and iterright are different means they will not be matched up by eversholt at run-time and the result will be the cross product of all instance numbers for y found in the current configuration, where the x instance numbers match up. For example, if the following components were in the configuration database:

x0/y0
x0/y1
x1/y0 then the run-time expansion of the above propagation statement would lead to the following propagation relationships:

fault.a@x0/y0 → error.b@x0/y0
fault.a@x0/y0 → error.b@x0/y1
fault.a@x0/y1 → error.b@x0/y0
fault.a@x0/y1 → error.b@x0/y1
fault.a@x1/y0 → error.b@x1/y0

The above expansion is called vertical expansion because propagation relationships are expanded vertically as if individual prop statements were added for each matching instance in the configuration database. Vertical expansion is like copying the eversholt prop statement and replicating it once for each match in the current configuration. Iterators surrounded by the square brackets [ ] denote vertical expansion iterators. (The implicit iterators discussed above also denote vertical expansion).

In some circumstances it is useful to expand an event into a list based on the current configuration. This is called horizontal expansion. Instead of replicating the entire prop statement for each match in the configuration, a horizontally-expanded event is turned into a list of events that match. This list is then inserted back into the same prop statement. The following shows a prop statement with both vertical and horizontal expansion:

| prop | fault.a@x< >/y < > | -> | error.b@x[0]/y[0] | ; |
|---|---|---|---|---|
| | Cause | | Effect | |
| | event list | | event list | |

The right side of the above statement illustrates another feature of the eversholt syntax: explicit instance numbers. Since the square brackets contain integers instead of iterator names, at run-time the component path will only be matched to instance numbers in the configuration database with corresponding instance numbers. Thus going back to our earlier example where the configuration database contains:

x0/y0
x0/y1
x1/y0 the run-time expansion of the preceding propagation statement leads to the following propagation relationships:

fault.a@x0/y0, fault.a@x0/y1, fault.a@x1/y0 → error.b@x0/y0

Note that the vertical expansion in this example only results in a single prop statement, because the explicit instance numbers on the right side only match x0/y0 in the configuration. In contrast, the angle brackets <> on the left side of the initial propagation statement expand to all three lines in the configuration database, and since angle brackets mean horizontal expansion, the result is a list of events. Finally, note that the angle brackets in the initial propagation statement do not contain iterator names; explicit names are allowed but there is no use for them in this example since the iterator names were not needed elsewhere in the statement. Nevertheless, even with implicit iterator names, the empty angle brackets are required to show that horizontal expansion is desired (since vertical expansion is the default).

As previously discussed, the fault trees described herein include effect bubbles (represented by a value N) and cause bubbles (represented by a value K). In the example below, the N and K values are written in the eversholt language at the head and tail of the arrow, just as they would be in a graphic representation of the tree propagation. Parentheses ( ) are required around the N and K values. Note that a default value of 1 is assumed when an N or K value is omitted.

| prop | fault.power.output_short<br>@acside/pm< ><br>Cause<br>event<br>list | (0) -> (1)<br><br><br>N | <br><br><br>K | error.power.overcurrent<br>@acside/dcbus<br>Effect<br>event<br>list | ; |

Propagation relationships often have constraints associated with them, so that the propagation is only possible when the constraints evaluate as true. Constraints are a very powerful part of eversholt. The most common constraint used in writing eversholt is the within clause that is used to specify a propagation delay. This constraint typically appears on events on the right side of a prop statement. For example:

prop error.power.output_overcurrent@acside/pm
→ ereport.power.output_overcurrent@acside/pm{within (10 ms)};

A common method for writing eversholt is to first draw a fault tree graphically (e.g on a white-board) and then to translate that drawing into the eversholt language. The next few examples show how to translate some of the various patterns that show up in fault trees from time to time.

An example of a situation where a fault tree has N greater than 1 produces the following eversholt:

prop fault.a (2)→ error.b, error.c;

or, alternatively, this could be represented as:

prop fault.a (A)→ error.b, error.c;

In the above case, the letter A is a special expression used to specify all events. A similar example, but this time with K greater than 1, is as follows:

prop fault.a, fault.b → (2) error.c; or, alternatively:
prop fault.a, fault.b →(A) error.c;

In some situations it is difficult (or not directly possible) to translate a graphical fault tree representation into eversholt. Typically this is the case where there are multiple propagations into a cause bubble. For example, consider a fault tree in which fault A propagates to error C and to error D, while fault B propagates to error D, and where the value of K in the cause bubble of error D is set to 2 (or A). It is tempting to try a direct representation of this fault tree in the eversholt language as follows:

/* WRONG! No K Value Given . . . */
prop fault.a → error.c, error.d;
prop fault.b → error.d;

However, this straightforward translation comes up short, because the K value is not specified, since a list containing fault.a and fault.b does not appear anywhere in the eversholt code. This limitation can be overcome by introducing an intermediate event in the eversholt code (in the same way as already discussed in relation to FIGS. 9A and 9B). In particular, error "i" can be inserted on the propagation path between fault A and error D, as in the following example:

prop fault.a →error.c, error.i;
prop error.i, fault.b →(2) error.d;

4.4.2 mask Statements

The syntax for mask statements matches the syntax for prop statements described in the previous section (except for the first word, of course). Mask statements express the relationship that the event(s) on the left side of the arrow mask (i.e. inhibit) the event(s) on the right side.

4.5 Constraints

Constraints are lists of boolean expressions contained in curly braces { }, and they follow the name of the event they are constraining. Constraints can appear in two contexts: events mentioned in declarations and events mentioned in prop and mask statements. When a constraint is placed on an event mentioned in a declaration, at run-time (e.g. in a diagnosis engine) the constraint is evaluated whenever that event is encountered (i.e. in any propagation relationship). The event is then elided if the evaluation is false. When a constraint is placed on an event mentioned in a prop or mask statement, there is a run-time evaluation of the constraint for just that particular event in that particular statement, and again the event is elided if the constraint evaluates to false. When constraints appear in both contexts (i.e. in a declaration and in a prop statement) both constraints are applied as if they were joined by a logical AND operator.

Constraints cause prop and mask statements to get smaller at run-time, as constraints evaluating to false remove events from those statements. If the resulting statement has no events on either the left or right side of the arrow ("→"), the entire statement becomes ignored.

The following example of a constraint states that error.a can only have propagated to cause ereport.b if the value of the parameter $address of the propagating error compared equal to the value of the property AFAR that was captured by the error detector at the time the error arrived.

prop error.a@x/y → ereport.b@x/y{$address == getprop ("AFAR")}

It can thus be inferred that, given the observation of a report with a particular value of AFAR, the value of the parameter $address of the error that caused the report must have been equal to this particular value of AFAR. (N.B. it is important to distinguish this parametric constraint from an assignment).

When a constraint contains a list of expressions, those expressions are logically ANDed together, as if they were each surrounded by parentheses and connected with &&. For example, the following two constraints are identical:

{i == j, is_on(x/y)}
{i == j && is_on(x/y)}

4.5.1 Boolean Expression Constraints

Constraints may contain boolean expressions containing variable names, constants, functions, and the logical operations ==, !=, &&, ||, and !. (N.B. not all C language operations are supported in constraints). As an example, the following propagation relationship only holds true when x and y have different instance numbers:

prop error.a@x[xn]/y[yn]→ error.b@x[xn]/y[yn]{xn != yn};

4.5.2 Propagation Delay Constraints

The most commonly used constraint in eversholt is typically a propagation delay constraint, specified using the within function. This function takes either one or two arguments, both of which must be timevals. In the single argument form, as in the following examples, the timeval given specifies an at latest by relationship. In other words, the propagation to the event happens at the latest by the time period given.
    within(10 ms);
    within(5 hours);
    within(0); /* i.e. propagates immediately */
    within(infinity); /* i.e. might never propagate */
The at latest by value shown above is often called the maximum propagation delay.

The two argument form of the within function allows one to specify a minimum propagation delay, which is the at earliest by relationship.
    within(2 ms, 10 ms);
    within(1 minute, infinity);
If no minimum propagation delay is given, the default is zero (i.e. no minimum). When both arguments are given, the minimum must be less than or equal to the maximum. The infinity value may only be used for a maximum propagation delay value.

When no propagation delay constraints are placed on a propagation, zero (i.e. immediately) is assumed. However, if the N value given specifies that the propagation may happen (rather than must happen), then the propagation delay is in effect infinite. For example:
    prop fault.a@x/y (0)→ error.b@x/y; /* "may" propagation */

4.5.3 Configuration Constraints

Configuration constraints include conditions based on functions such as confprop that look up information in the configuration database. Configuration constraints take component paths as arguments. Particular configuration conditions supported by eversholt are:
is_on takes a single argument, and returns the value of the configuration variable "on" for the relevant ASRU
is_connected takes two arguments, returns true if they are connected.

Note that the exact semantics of configuration conditions can depend upon the semantics of the properties looked for in the configuration database, which can in turn be platform specific.

4.5.4 External Function Constraints

The constraint function call may be used to call out to externally provided functions. The syntax is:
    call (external-function, args . . . )
where external-function is the name of a function provided at run-time (e.g. to the eversholt diagnosis engine). The arguments, if any, are given to the external function along with some global context information. The return value from the function is taken as a boolean constraint unless assigned to a variable as described above. Note that the formal interface definition for external functions is platform-specific and is defined by the framework that runs the eversholt diagnosis engine or other run-time facility on a given platform.

4.6 config Statements

The config statement is normally not used in a typical eversholt application; rather run-time configuration information is obtained from the platform configuration database. However, a config statement allows one to overcome any shortcomings of a platform configuration database by forcing some component paths permanently into the configuration. In other words, the eversholt diagnosis engine or other run-time user of the fault tree can use the information provided in a config statement as if it had come from a platform configuration database.

The syntax of the config statement is:
    config instanced-path [property=value [,property=value . . . ]];

Thus after the reserved word config comes the name of the component (including instance numbers) and then any number of properties. The following is an example:
    config sb0/cpu0 is_on=1;

It will be appreciated that the config statement has limited usefulness in many embodiments, since the configuration information provided is static and will override anything obtained from the platform configuration database.

Nevertheless, it may be useful in some situations—e.g. for systems that are predetermined to have a particular fixed configuration.

4.7 if Statements

Although the word "if" is a reserved word in eversholt, an "if statement" is not currently defined as part of the language. Typically a constraint as described above provides any conditionals needed. Nevertheless, the word is reserved for potential future use.

4.8 Pragmas

Pragmas are flags to the eversholt compiler that enable or disable specific features. Pragmas are embedded in the eversholt source using the following syntax:
    #pragma option-name The pound sign character in the pragma statement must be the first character of a line.

Although pragmas look like cpp directives, the C preprocessor simply passes the line through to the eversholt compiler. Any pragma which is unrecognized by the eversholt compiler is ignored, to provide compatibility between newer eversholt source files and older compilers. Care must therefore be used to spell the option names correctly.

The following pragmas are defined:

pragma ident version-string

The version-string (typically an SCCS or RCS revision string) is embedded in the header of the resulting .eft (eversholt fault tree) binary file. This allows programs to access the versions of the eversholt source files that went into constructing a particular .eft file.

4.9 Syntax Summary

This section contains a brief summary of the eversholt language syntax.

4.9.1 Reserved Words

The following words are reserved in eversholt and are not allowed as iterator names, event classes, component paths, etc. They can, of course, be used freely in literal strings and comments.

| Word | Described in |
| --- | --- |
| Asru | §4.3.3 |
| Config | §4.6 |
| Div | §4.2.3 |
| Engine | §4.3.4 |
| Event | §4.3.1 |
| Fru | §4.3.2 |
| if | §4.7 |
| Infinity | §4.2.3 |
| Mask | §4.4.2 |
| Prop | §4.4.1 |

In addition to the above reserved words, some partially reserved words, which only have a special meaning when following a number, are defined. These words allow the specification of a timeval. The use of these words in event class names or component path names is allowed, but discouraged.

day days hour hours microsecond microseconds millisecond milliseconds min mins minute minutes month months ms s second seconds us week weeks year years Theoretically, the class name of an event can be anything. However, several top-level class names are in common use and the eversholt compiler expects those class names and assigns very specific semantics to them. For example, when an event class name begins with the string fault, eversholt requires the property FITrate in the declaration. The following is a list of top-level class names recognized by eversholt:

defect ereport error fault upset

Any line starting with # is either a C preprocessor statement (described in a cpp manual) or a #pragma statement.

4.9.2 Grammar

This summary of the eversholt language is intended primarily for aiding comprehension rather than as an exact statement of the language. For example, there is no formal definition of an id or a number since these follow common C language practice.

```
statement:
    event decl-body ;
    engine decl-body ;
    asru decl-body ;
    fru decl-body ;
    prop prop-body ;
    mask prop-body ;
    config config-body ;
decl-body:
    fullevent nvpairlist
fullevent:
    event-class
    event-class @ component-path constraint
event-class:
    id
    event-class . event-class
component-path:
    id
    id [ expression ]
    id < expression >
    component-path / component-path
constraint:
    empty
    { expression }
nvpairlist
    id = expression
    nvpairlist , id = expression
prop-body:
    eventlist nork -> nork eventlist
    prop-body nork -> nork eventlist
eventlist:
    fullevent
    eventlist , eventlist
nork:
    empty
    ( number )
    ( A )
expression:
    id
    fullevent
    component-path
    ( expression )
    expression − expression
    expression + expression
    expression * expression
```

-continued

```
    expression div expression
    expression % expression
    id = expression
    function
    timeval
function:
    id ( exprlist )
exprlist:
    empty
    expression
    exprlist , exprlist
timeval:
    number timeunits
timeunits:
    day
    days
    hour
    hours
    . . .
config-body:
    instanced-component-path nvpairlist
instanced-component-path:
    id number
    instanced-component-path / instanced-component-path
```

4.10 Example

The following sample eversholt source file contains many of the common constructs in the language and provides a quick example of how to use eversholt. The comments (indicated as in C) also discuss various general aspects of the eversholt language.

```
/*
 * sample.esc: Sample eversholt source code
 *
 */
/*
 * The common way to embed SCCS information in .esc files
 * (and therefore the resulting .eft files) is to use the
 * following line (tabs shown as \t for readability) :
 *      #pragma ident\t"%Z%%M%\t%I%\t%E% SMI"
 */
#pragma ident    "@(#)sample.esc 1.1    03/07/31 SMI"
/*
 * FRUs and ASRUs are written as component-paths (slash separated
 * component names without instance numbers) . They must be declared
 * before use.
 *
 */
asru acside;
fru acside/pm;
fru acside/pdb;
/*
 * Events are written as:
 *      <event-class> @ <componentpath> { <constraint> }
 * where <event-class> is a dot-separated FMA event class string:
 *      fault.something . . .
 *      upset.something . . .
 *      defect.something . . .
 *      error.something . . .
 *      ereport.something . . .
 * and <component-path> is a slash separated path without instance
numbers:
 *      somethingA/somethingB . . .
 * and <constraint> is an expression.
 * When constraint is false, that event is elided from the statement.
 * For declarations, elided events mean the declaration goes away and
 * all uses of that event elsewhere are also elided. For prop
statements,
 * elided events mean the list of events gets smaller and if no
events
 * remain on one or both sides of the propagation arrow −>, then
 * the prop statement itself goes away.
 *
```

-continued

```
* See examples of events in the following declarations.
*/
/*
*Declare faults
*       "FITrate" property is required, value is an integer
*       "FRU" is optional, value is a component path
*       "ASRU" is optional, value is a component path
*/
event fault.power.output_short@acside/pm,
        FITrate=10, ASRU=acside, FRU=acside/pm;
event fault.power.input_short@acside/pdb,
        FITrate=10, ASRU=acside, FRU=acside/pdb;
/*
* Declare upsets
*       "engine" property is required, value is a SEDE engine name
*/
event upset.power.glitch@acside/pm,
        engine=serd.glitch@acside/pm;
/*
* Declare defects
*       no required properties
*/
event defect.powermgmt.configbug@acside/pm;
/*
* Declare errors
*       no required properties
*/
event error.power.overcurrent@acside/dcbus;
event error.power.output_overcurrent@acside/pm;
/*
* Declare ereports
*       no required properties
*       "poller" is optional, value is name of external poller
*       "delivery" is optional, value is timeval
*/
event ereport.power.output_overcurrent@acside/pm;
event ereport.power.output_undervoltage@acside/pm;
event ereport.power.fluctuating@acside/pm;
/* Declare SEDE engines
*       "N" is required, value is integer
*       "T" is required, value is timeval
*       "method" is optional, value is "volatile" or "persistent"
*       "trip" is required, value is event
*/
engine serd.glitch@acside/pm,
        N=3, T=1day,
        trip=ereport.power.fluctuating@acside/pm;
/*
* Propagations
*       <list-of-events> (N) -> (K) <list-of-events>
*       default N is 1, default K is 1, so the arrow
*            ->
*       is short for
*            (1) -> (1)
*       the letter A may be used to stand for "all".
*
* Nothing propagates to a problem (fault, upset, or defect) .
* Nothing propagates from an ereport.
* Errors may propagate to errors, but cycles in the
* propagation tree are currently not allowed.
*
* Iterators can be explicit, like "sidenum" and "pmnum":
*       prop error.power.output_overcurrent@acside[sidenum]/
pm[pmnum]
*            ->
ereport.power.output_undervoltage@acside[sidenum]/pm[pmnum];
*
* or they can be implicit, the following statement means the same
thing:
*
*       prop error.power.output_overcurrent@acside/pm
*            -> ereport.power.output_undervoltage@acside/pm;
*
* Normally iterators are expanded vertically, so each matching
instance
  implies another complete prop statement. Iterators surrounded by
<>
* are expanded horizontally, so each matching instance expands the
list
```

-continued

```
* in the current prop statement:
*
*       prop fault.power.output_short@acside/pm<>
*            -> error.power.overcurrent@acside/dcbus{within(1us) };
*
* In the following list of propagations, only propagations from the
declared faults are considered (not from the upset or defect)
*/
prop fault.power.output_short@acside/pm<>,
    fault.power.input_short@acside/pdb
            -> error.power.overcurrent@acside/dcbus{within(1us) };
    prop error.power.overcurrent@acside/dcbus
            (A) -> error.power.output_overcurrent@acside/pm<>;
    prop error.power.output_overcurrent@acside/pm
            ->
ereport.power.output_overcurrent@acside/pm{within (10ms) };
    prop error.power.output_overcurrent@acside/pm
            ->
ereport.power.output_undervoltage@acside/pm{within(1ms) };
/* end of Sample    */
```

Figure 15:
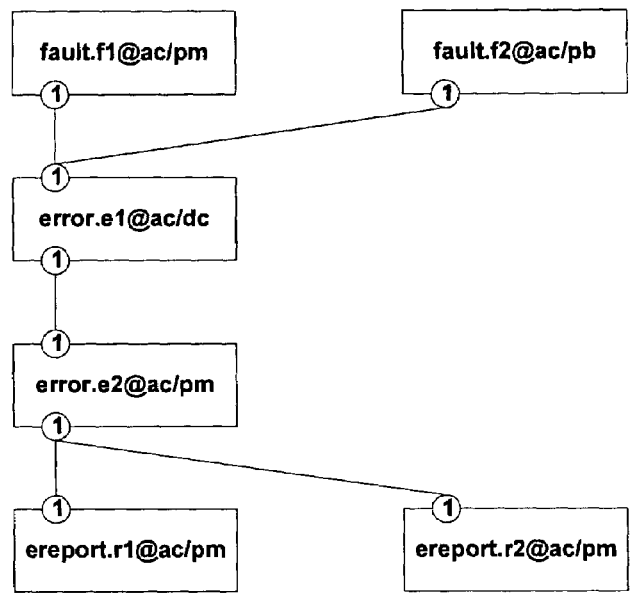
FIG. 15 is an example of a configuration-independent fault tree in accordance with one embodiment of the invention.

FIG. 15 illustrates a fault tree approximating the above Eversholt code. Note that for simplicity, event names are shortened as follows:

f1@ac/pm =fault.power.output_short@acside/pm
f2@ac/pb =fault.power.input_short@acside/pdb
e1@ac/dc =error.power.overcurrent@acside/dcbus
e2@ac/pm =error.power.output_overcurrent@acside/pm
r1@ac/pm   =ereport.power.output_overcurrent@acside/pm
r2@ac/pm =ereport.power.output_undervoltage@acside/pm (Events that are not involved in propagations are omitted from FIG. 15). Since none of the propagations in the sample code specifies a value for N or K, the default values of N=1 and K=1 are assumed.

(Note that FIG. 15 is not an exact fault tree depiction of the above eversholt code, since it does not include the iteration properties associated with the propagations).

4.11 Integration of Fault Tree and Configuration

The fault tree of FIG. 15 is independent of configuration and would typically be created at compile-time. As previously discussed, at run-time this fault tree is then be extended with configuration information. This does not change the underlying nature of the fault tree (in terms of a mapping of events and propagations), but in effect extends or modifies the fault tree to reflect the current specific configuration, rather than the generic configuration utilised at compile-time. In general terms, this involves replicating events (and consequently propagations) as appropriate across multiple configuration instances of the various system components.

Figure 16:
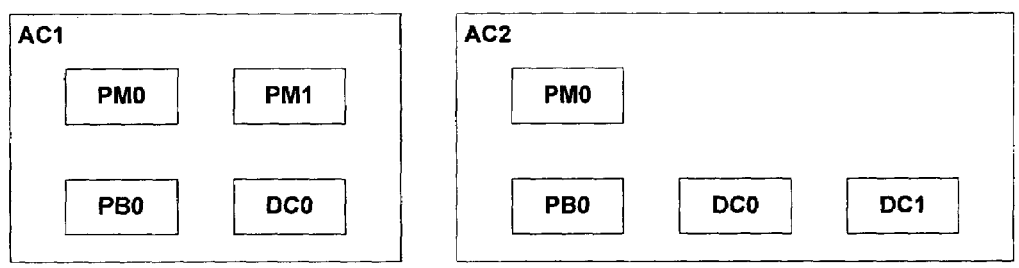
FIG. 16 is an example of a configuration to which the fault tree of FIG. 15 may be applied.

For example, we assume that a system has the configuration shown in FIG. 16. In particular, there are two "acside" units denoted AC1 and AC2. Unit AC1 contains two "pm" units, labelled PM0 and PM1, as well as one "pbd" unit labelled PB0 and one "dcbus" unit labelled DC0. Unit AC2 contains one "pm" unit, labelled PM0, as well as one "pbd" unit labelled PB0 and two "dcbus" units labelled DC0 and DC1.

Figure 17:
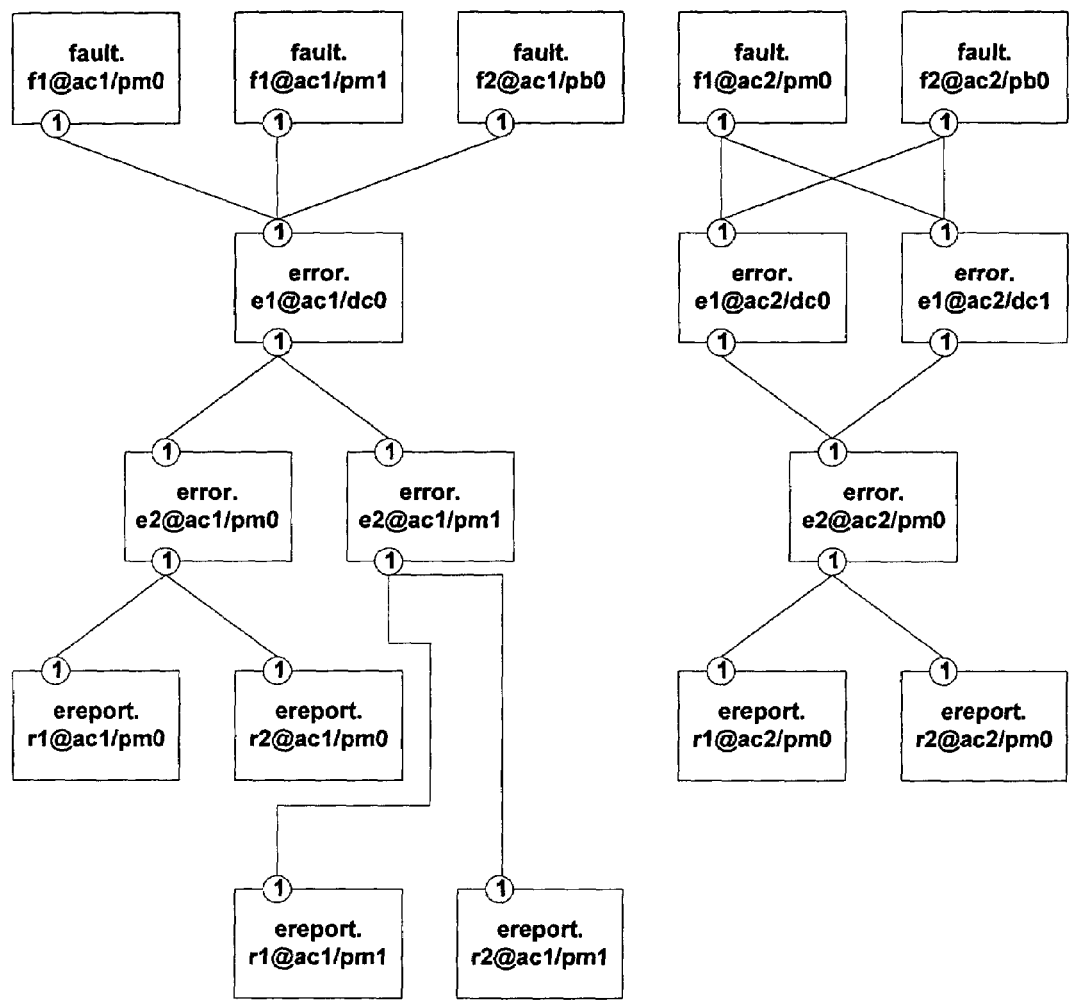
FIG. 17 is an example of the fault tree of FIG. 15 expanded for the particular configuration of FIG. 16 in accordance with one embodiment of the invention.

FIG. 17 illustrates an expansion of the fault tree of FIG. 15 to accommodate the configuration of FIG. 16. Each event is replicated for each relevant configuration component. For example, the fault f1@ac/pm is shown as three separate events corresponding to PM0, PM1 in AC1 and PM0 in AC2, labelled in FIG. 17 as ac1/pm0, ac1/pm1, and ac2/pm0 respectively. Fault f2@ac/pm is shown as two separate events corresponding to PB0 in AC1 and PB0 in AC2, labelled as ac1/pb0 and ac2/pb0 respectively. The error and report events are also replicated in FIG. 17 in accordance with the particular configuration of FIG. 16. It will be appreciated that such replication can be performed automatically by the fault management system at run-time to obtain the fault tree of FIG. 17.

Thus considering the first propagation from faults f1@ac/pm and f2@ac/pb to error e1@ac/dc, which is specified as follows:

prop fault.power.output_short@acside/pm<>, fault.power.input_short@acside/pdb
→error.power.overcurrent@acside/dcbus{within(1us)};

It is noted that "acside" is present on both sides of this propagation. This represents a vertical expansion, in which the propagation is limited to occurring within the same "acside" module. In other words, an f1@ac/pm fault in AC1 does not propagate to an error in AC2 (or from an f1@ac/pm fault in AC2 to an error in AC1).

In contrast, horizontal expansion is indicated for f1@ac/pm with regard to "pm". We therefore expand the left-side of this propagation to incorporate all values of "pm" (i.e. PM0 and PM1 for AC1). As a result, f1@ac/pm faults from both of these "pm" units in AC1 propagate to the e1@ac/dc error (in unit AC1).

In fact, the same result would be achieved even without the horizontal expansion, since "pm" is not present on the right-hand side of the propagation. Similarly, "dcbus" is not present on the left-hand side of the propagation. It is therefore assumed that an event in any "pm" propagates to an event in any "dcbus" (within the same "acside" unit). This can be seen for example with respect to AC2, where the fault f1@ac2/pm0 propagates both to e1@ac2/dc0 and also to e1@ac2/dc1.

Consider now the error propagation:

prop error.power.overcurrent@acside/dcbus
  (A)→ error.power.output_overcurrent@acside/pm<>;

Here again we have vertical expansion with respect to the "acside" unit. This identifier is on both sides of the propagation, and so this propagation does not cross from one "acside" unit to another. The horizontal expansion of "pm" in this module is then represented in FIG. 17 by the propagation from e1@ac1/dc0 to both e2@ac1/pm0 and also to e2@ac1/pm1.

Finally, considering the propagations to reports:

prop error.power.output_overcurrent@acside/pm
  → ereport.power.output_overcurrent@acside/pm{within (10ms)};

prop error.power.output_overcurrent@acside/pm
  → ereport.power.output_undervoltage@acside/pm{within (1ms)};

It will be noted that both of these propagations specify vertical propagation with respect to both "acside" and also "pm". Hence the error e1@ac/dc in PM0 in AC1 propagates to a report in this same location (i.e. PM0 in AC1) but nowhere else. The same applies for the other propagations to reports illustrated in FIG. 17.

Looking at the fault tree of FIG. 17, it can be seen that it is in fact two separate fault trees, one for AC1 and one for AC2. This helps diagnosis, in that if an error report is received from AC1, then it is immediately known that the original fault must be in AC1, not AC2. On the other hand, there is nothing in the fault tree propagations (including the timings specified in the sample code) that allows any distinction to be made between fault f1@ac/pm and f2@ac/pb (within a given "acside" unit). Thus both of these faults may (or may not) generate error reports r1@ac/pm and/or r2@ac/pm, and so it is not possible, given an observed pattern of error reports, to say for certain whether fault f1@ac/pm or fault f2@ac/pb is present. Hence a suspect list produced by diagnosis would include both f1@ac/pm and also f2@ac/pb.

5. Compilation

Figure 18A:
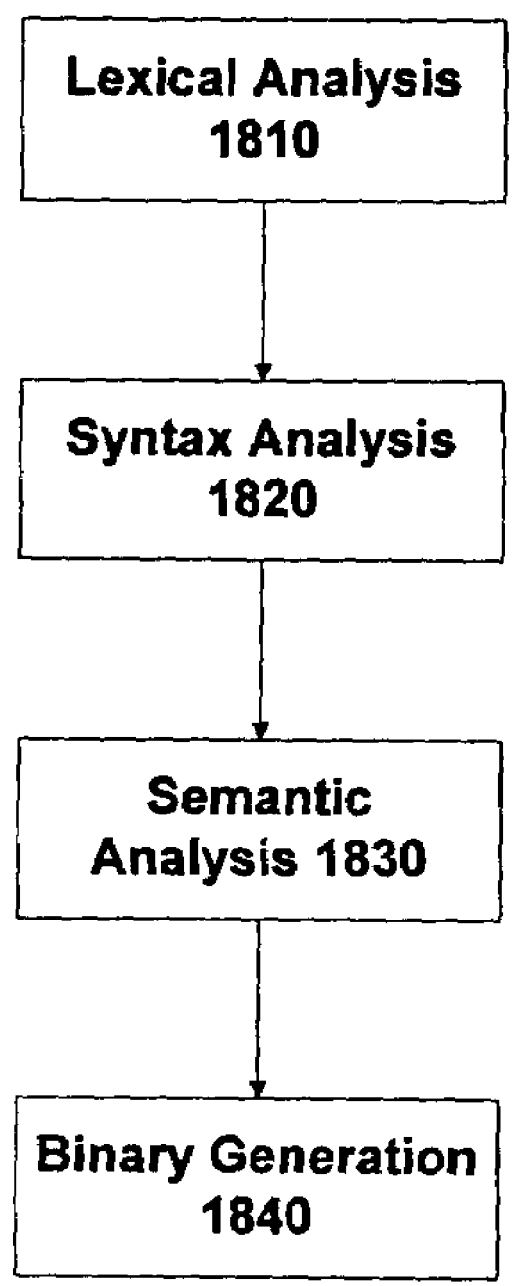
FIG. 18A is a flowchart illustrating the compilation of a fault tree in accordance with one embodiment of the invention.

FIG. 18A is a flowchart illustrating the procedure for compiling a fault tree representation written using eversholt source code into a binary representation of the fault tree. This binary representation can then be used by the diagnosis engine 122 (see FIG. 1B) or any other appropriate user. In general terms, the compilation process reflects operations performed by a conventional compiler, although it will be appreciated that known compilers have primarily been intended for use in relation to computer programming languages rather than fault tree representations.

The compilation process starts with lexical analysis (1810), in which the input language (i.e. the eversholt source code) is broken down into tokens. These tokens are then parsed in a syntax analysis (1820). In one embodiment, the syntax analysis is performed by a YACC-generated parser based on an LALR(2) grammar. The grammar is liberal in that only serious syntax errors are caught as parse-time errors.

The syntax analysis is followed by a semantic analysis (1830), which is run on the complete parse tree from the syntax analysis and catches all other errors. For example, this phase checks for things like undeclared event names, expressions which are not allowed, required properties, and so on.

The final phase of the compilation is the back-end processing (1840), which leads to generation of the eversholt fault tree file in binary format. The file contains a frozen, machine-readable copy of the parse tree and is not expected to be edited directly.

6. The Fault Management Exercise

The fault management exercise (which might be better termed a problem management exercise) has already been described in overview in relation to FIG. 1A. It is assumed that the system is initially behaving properly, and then a fault or defect is exercised to produce an error, or an upset produces an error. This then results in an error being observed by an error detector (either directly or via propagation through a chain of one or more errors). The report from the error detector initiates the fault management exercise, since it implies that the system is no longer fault-free.

The fault management exercise is co-ordinated by the fault management system 120, which is assumed to have a global view of proceedings, and which includes or utilises a diagnosis engine 122 (see FIG. 1B). The fault management system may be implemented as a single entity, or through the interaction of multiple programs and/or systems as appropriate.

Fault management can be considered as a three-step process, namely:

(1) reconnoitre, to obtain information about the problem;

(2) diagnose, to use the collected information to determine the problem that is present; and (3) act, to take suitable remedial action against the diagnosed problem.

In practice however, the different steps may not be clearly defined. For example, the reconnoitre phase may extend into the diagnosis phase, as new reports arrive at the fault management system.

Error reports can reach the fault management system via a variety of routes. One common approach is that whenever an error detector detects an error, it delivers an error report with an unscheduled, unpredictable interrupt mechanism. In contrast to such free-form delivery, a diagnosis engine may run polling routines that execute some specific function to go and look for errors, rather than waiting for the errors to present themselves. If a polling routine uncovers an error, a report arrives, just like any other detected error, but the timing of the arrival is to some extent under the control of the diagnosis engine. The engine decides which pollers to run, and when to run them. A system can be provided with custom polling routines especially for use by the diagnosis engine, in order to improve diagnosability.

Typically, the diagnosis engine runs multiple times during the reconnoitre phase, each time producing an increasingly precise diagnosis (if new information is available). The diagnosis manager makes a decision at the end of each run on whether the best option is to wait and see if any more reports arrive, or to run a poller, or to go with the reports already received and to publish a result. This decision is sensitive to the type of errors that have been detected, and how long errors take to propagate in the system

6.1 The Suspect List

The (published) output of the diagnosis engine is a suspect list. The information in the suspect list is derived by the diagnosis engine from the fault tree for the system, combined with the configuration database, plus potentially other information as well. Various diagnosis and recovery engines communicate by passing a suspect list about.

An example suspect in accordance with one particular embodiment of the invention is presented below. This example has been concocted to show a fault, an open in a signal wire on a data bus from one FRU (fru1), to another FRU (fru2).

| UUFMEID | system__345876/date__200305141604.5678/fme__1 |
| Fault Code | 12ab34c5 |

| Problem | FITrate | ASRU | Clean-up | FRU | Repair? |
| --- | --- | --- | --- | --- | --- |
| fault.open@fru1/databus0 | 160 | fru1/processor0 | — | fru1 | — |
| fault.open@fru2/databus0 | 40 | fru1/processor0 | — | fru2 | — |

| FRU | FRU s/n |
| --- | --- |
| fru1 | 12345678 |

The example suspect list comprises three related tables, whose components will now be discussed in detail.

6.1.1 UUFMEID

UUFMEID stands for "Universally Unique Fault Management Exercise Identifier". As its name suggests, this identifier is unique to this particular fault management exercise, across all machines and all times. Consequently, the UUFMEID allows a record for a particular event on a particular system to be located. In addition, reports and FMEs can be permanently associated through the UUFMEID, while messages in the system, which might potentially be handling multiple fault management exercises simultaneously, can use the UUFMEID to specify the exercise to which they refer.

6.1.2 Fault Code

The fault code is a compressed version of the suspect list. The fault code can be created from the suspect list, but the complete suspect list cannot be (re)created from the fault code. Rather only some of the suspect list information can be recovered from the code. However, the fault code provides a handy abbreviation, for example to report the suspect list over the telephone, or to record in a service engineer's log-book.

6.1.3 Problem

Each row in the body of the suspect list represents one potential (i.e. suspected) problem. The entry in the "problem" column identifies by name the specific problem suspected. The format shown is "problem@location". The suspect list contains all the problems that might produce effects consistent with the reports and any other information (such as configuration and status) available to the fault management system 120 during the fault management exercise. It is likely that just one of the problems in the suspect list is the problem that has actually occurred. However, the fault management system is not able to determine which particular problem within the suspect list has occurred. In other words, the suspect list represents the limit of the diagnosis capability of the fault management system, based on the available information.

The example suspect list above shows a situation where a single wire has had a single open circuit, and the system has precisely diagnosed this. However, the wire crosses from one FRU to another. Whenever this happens, the suspect list contains two problems, one for each FRU. It is expected that in fact the fault is localised to one of the two FRUs, but the diagnosis engine cannot tell which one.

6.1.4 FIT Rate

The FIT rate is a prediction of the rate at which the associated problem is expected to occur; problems with a higher predicted FIT rate are likely to occur more often. FIT rates apply only to faults, not to defects nor (in this context) upsets. If all the problems in a suspect list are faults with FIT rate predictions, the FIT rates can be used to guess at which problem is most likely to be the actual cause of the observed error(s).

For field service, knowledge of the FIT rates is especially useful when the faults lie on different FRUs, as they do in the above example above. Thus the fault fault.open@frua1/databus0 is predicted to occur at 160 FITs, and fault.open@fru2/databus0 is predicted to occur at 40 FITs (presumably, there is more circuitry to go wrong or a less reliable databus connector on fru1 compared to fru2). If just one of these two FRUs actually has a fault (which is most probable), then it is 160/40=4 times more likely that the problem lies in fru1 than in fru2. In other words, the chance that fru1 is faulty is 160/(160+40)=80%, while the chance that fru2 is faulty is only 20%. Therefore, it would not be an unreasonable service strategy to try changing fru1 first to see if the fault goes away.

This sort of decision based on FIT rates in the suspect list can be left to a service technician for human decision-making. Alternatively, the decision may be automated in a service policy module for the system, which can use the FIT rates from the suspect list to select automatically a FRU for first replacement.

In one embodiment, the FIT rate may be adjusted with age of the component. This is particularly appropriate for components that are known to wear out after a certain time. The age of the component at the time of diagnosis may be derived from various pieces of information. One possibility is to use the serial number of a FRU to obtain a component age (see below). Another possibility is to use the configuration database to determine how long a particular FRU has been installed in the system. The manufacture date of the FRU might also be recorded in machine readable form on the FRU itself. In some cases, it may be more appropriate to use a parameter other than time to determine aging, such as the number of power-on/power-off cycles. Data specifying the variation of FIT rate with age may be provided when a FRU is installed into the system, or might be accessed as and when required over a network.

6.1.5 The ASRU

In any given suspect list, there can be any number of ASRUs mentioned. However, in practice most suspect lists have just one ASRU, independent of the number of suspected problems. The implication is that this ASRU should be deconfigured during the act phase. The fault management exercise does not end until this deconfiguration has occurred, or alternatively until the suspected problems are repaired without any deconfiguration (e.g. by replacing the relevant FRU(s)).

In this particular example, the suspect list contains only one ASRU, fru1/processor0, despite containing two FRUs, so that the problem is therefore contained in a single ASRU. However, it is not possible to discover in which particular FRU the problem is located, because the ASRU stretches across the boundary between the two FRUs. Nevertheless, deconfiguring fru1/processor0 will stop the fault producing errors that propagate to reports, irrespective of which FRU actually contains the fault (the open in the databus).

One difficulty is that deconfiguring an ASRU may make a service unavailable. This can be undesirable, especially if the problem is causing correctable errors (e.g. that can be fixed by an ECC). In such circumstances, system reconfiguration may be delayed or inhibited, either by human decision, or by automatic application of a service policy 131 (see FIG. 1B). Leaving a faulty ASRU in service may make diagnosis of future problems harder, but that might be preferable to bringing down the system unnecessarily. The deconfiguration might perhaps be postponed until a service technician arrives with a replacement unit (or units).

6.1.6 The FRU

A problem can only be in a single FRU, but a suspect list may contain multiple problems to specify multiple suspected FRUs. If a FRU is specified for a problem, the FRU is suspected to be faulty, and so repair of the system requires replacement of that FRU. The FRU should be marked as faulty when the diagnosis completes, and later marked as repaired (at the end of the act phase).

Repair of a FRU generally takes two main forms. One possibility is that a faulty FRU is removed from the system for repair in a repair factory, or alternatively the FRU may be repaired on site by a field technician, depending on the nature of the fault. Once the FRU has been repaired, it should be marked as repaired.

The other possibility is referred to herein as a "field acquittal". It will be appreciated that service technicians are supposed to replace FRUs, rather than fiddle around inside them (hence the name). Nevertheless, a field engineer may decide that a particular FRU is not in fact faulty, and so should not be removed. One way to give effect to this is to mark the problem in the FRU as repaired. (If the field service technician is mistaken, and the problem in fact still exists, then it will reappear in the future).

As previously discussed, service policy (human or machine-based) can be used to determine replacement of FRUs. For example, in the suspect list above, it is more likely, based on the FIT rates, that the fault lies in fru1 than in fru2. Accordingly, a service technician may therefore exchange fru1, and send the suspect unit back for repair, leaving fru2 in place. In this case, the technician marks the problem fault.open@fru2/databus0 as resolved (with a field acquittal). Alternatively, a service policy module for the system may refine the suspect list automatically, inserting a field acquittal record for any problems other than in the replaced FRU.

6.1.7 Clean-Up

A clean-up routine may (optionally) be specified for any problem. If a clean-up routine is specified, it is run after the problem has been stopped from creating new errors and before the fault management exercise can end. The clean-up routine returns the system to a correct condition, without changing configuration. As an example, a clean-up routine might clear out stored errors, or run a program to reinitialise some unit that has temporarily been left in a strange state.

6.1.8 Repair

The repair entry in the suspect list is initially empty when the suspect list is first published by the diagnosis engine. An entry in the repair field for a problem implies that that problem is no longer present (or is deemed no longer present, e.g. because another FRU on the suspect list has been replaced).

A convenient way to fill the repair entry is to provide a link to a separate repair record. A sample repair record is shown below. Note that in some cases the repair record may be completed automatically (e.g. by a service policy module).

| Date | Place | Name | Result |
| --- | --- | --- | --- |
| 20030515105304 | Field | Service Policy Module version 1.83.02 | Low chance according to FITrates |
| 20030704132802 | ABC Electronics Repair | George | Passed test, No Trouble Found |
| 20030822201413 | XYZ Electronics Repair | Operator 1223 | Open solder joint at P3 pin 34 See microscope image record #475384 |

6.1.9 FRU Serial Number (S/N)

The FRU s/n (serial number) is an identifier for the particular FRU as installed into the system. Typically every FRU is installed with a unique serial number at the factory, which is usually electronically readable from the FRU itself. This then allows this field of the suspect list to be completed automatically, using configuration information for the system. (Alternatively, if the FRU S/N information is not to machine-readable, then this field may have to be completed by hand).

Although the initial diagnosis may not use the FRU S/N, nevertheless this can provide useful information for refining and/or acting upon a diagnosis. For example, the age of a FRU might be one parameter used in deciding how to respond to a suspect list (e.g. by replacing the oldest FRU). The FRU serial number might then be used to determine the age from a database lookup.

It will be appreciated that there is a wide range of other information that might be included in the suspect list, instead of or as well as the parameters discussed above. For example, the ASRU and/or FRU associated with a problem might be specified in terms of their location rather than their identity. One consequence of this is that if a FRU containing a problem is moved, then the name of the problem changes as well.

There might also be an "alert" field associated with a problem, which could be used to specify an alert that is to be raised when the problem is suspected. This is particularly useful for defects, since these cannot be repaired by changing FRUs. The alert can then specify who should be notified of the defect, such as the relevant engineering or support team, in order to obtain the required design change.

Note that although in one embodiment of the invention there are three types of problem, namely faults, upsets and defects, in other systems further types of problem might be supported, such as an "out-of-calibration" problem. The diagnosis stage of a fault management exercise may issue a suspect list containing such an out-of-calibration problem. The appropriate service action in this case might be to perform a relevant calibration, not to replace a FRU. In these circumstances, the suspect list might also contain the name of the adjustment to be made, or the name of a calibration routine.

The diagnosis phase of the fault management exercise includes the initial publication of the suspect list, based on a history-free diagnosis, plus any further revision of this list by various policy engines (if any). For example, the initial suspect list might be modified in accordance with historical information about the components or system, reliability information, service policy information, and so on.

6.2 The Act Phase

Once the suspect list has been published, system recovery can now be performed. The actions involved in this will be different for the different types of problem, i.e. upsets, defects and faults. The fault management system may control the system recovery, or responsibility for this may be passed to other programs in the system.

The act phase can be regarded as comprising three main stages. The first stage is problem containment. This typically involves ensuring that a diagnosed problem causes no further harm by isolating the ASRU or FRU in which the problem is located. The second stage of the act phase is clean-up. This involves rectifying or removing the harm that the diagnosed problem has already caused. The final stage of the act phase is to re-enable the error detectors, thereby allowing the system to respond to future problems.

Note that the customer business may not necessarily be able to continue uninterrupted during the act phase. For example, in some systems the act phase may include a period when the computer is being rebooted, or even switched off. In this case, the fault management exercise generally persists across the outage. On the other hand, in systems designed for very high availability, a problem should not cause any outage, either during the initial appearance of the problem or during a subsequent fault management exercise and repair.

6.2.1 Problem Containment

It is assumed that the system has a problem that is creating errors. The errors propagate to other errors and also create reports that allow the problem to be diagnosed. The fault management system needs to stop the errors created by the diagnosed problem from travelling through the system, or at least it should confine these errors to a part of the system where they can safely be ignored. All the problems specified in a suspect list must be contained in order for the fault management exercise to continue.

One way to contain a problem is to deconfigure the ASRU containing the problem. This changes the way that the system operates, and prevents error propagation from inside the ASRU to outside (i.e. to the rest of the system). Systems often come with an optional configuration capability, such as being able to turn memories and/or processors on or off. Deconfiguring (turning off) an ASRU in this manner prevents errors from propagating beyond the component. Another way of achieving such a deconfiguration is to stop using the ASRU containing the problem. In this case, the problem is no longer exercised, and so will not produce any further errors. Another way of preventing a problem spreading errors is to remove physically from the system the FRU containing the problem. This then prevents the problem from causing any further trouble within the system.

6.2.1.1 Deconfiguration

When a fault is diagnosed, there may be more than one ASRU suspected of containing the fault. Deconfiguring a faulty ASRU may also imply deconfiguring one or more other, nonfaulty, ASRUs that are in some way dependent upon the faulty ASRU to be deconfigured. In addition, it may not be possible to deconfigure a particular ASRU, either because this capability is not supported by the system, or because the system cannot operate without the ASRU in question. Note that in this latter case, the fault management exercise will typically require human intervention in order to complete (and hence is likely to become prolonged).

There are two general types of deconfiguration. The first can be regarded as a form of isolation. This is particularly appropriate for ASRUs that are surrounded by some logic which can be switched so that signals can no longer travel across the ASRU boundary. With a hardware ASRU, this switching can be performed with gates. With a piece of software treated as an ASRU, this might be achieved by changing the logical-to-physical address map so that code containing a defect can no longer run. The system is also changed so that it no longer attempts to use the deconfigured ASRU, such as by updating the configuration database.

Isolation is a strong approach to problem containment, because it provides a very clear barrier to error propagation. Thus even if something did try to cross the ASRU boundary, such as an erroneous data packet or function call, it would not succeed. There would normally be some signal to indicate this, different from the error(s) created by the original problem in the ASRU.

An example of deconfiguration by isolation is a processor connected to the rest of the system by a central switch chip. Inside the switch, there are gates that cause signals from the processor to be ignored. These gates are primarily intended to prevent the switch being confused if one of the processors is absent. However, if these gates are set so as to ignore a processor that is in fact present, then that processor can no longer send any errors to the rest of the system. As a result, the processor has, in effect, been deconfigured.

A simpler form of deconfiguration than isolation is avoidance, in which the system stops using the ASRU to be deconfigured (rather than specifically isolating it). Deconfiguration by avoidance may be employed in many practical situations. For example, consider a memory with one word broken, where an ASRU is defined to be the memory page containing the broken word, and where the rest of the memory remains useable. In these circumstances, avoidance of the faulty ASRU is achieved by telling the software using the memory (typically a virtual memory system) not to access the afflicted page.

Deconfiguration by avoidance may allow reports of further errors from the deconfigured ASRU to reach the fault management system. These errors may be generated by the original problem, or by the deconfiguration process itself (perhaps if a particular component is left in an indeterminate state). The fault management system can accommodate such errors by the use of constraints in the system fault tree. One such constraint is is_on(asru), which queries the configuration database about the current status of the ASRU in question. This can then be used to control error propagation and reporting. Thus at runtime, the diagnosis engine asks the configuration management system which ASRUs are switched on. This information controls how errors are assumed to propagate in the fault tree, and allows reports from ASRUs that have been deconfigured to be automatically eliminated from the diagnosis.

Care is needed with respect to reports that arrive close to or during configuration changes. The diagnosis system wants to know the configuration at the time when an error was propagating, rather than now, when the computation is being performed. In one embodiment therefore, calls to the configuration database include parameters for the earliest and latest times of interest, which are derived from a knowledge of propagation times within the system. The configuration database keeps records of the recent history of reconfiguration, as well as the current state. Using this information, it can reconstruct the configuration for the period specified in the call from the diagnosis system. In one embodiment, this is implemented using a chart recorder model, as described below in relation to FIG. 21.

6.2.1.2 Workaround

Another response to finding a problem in a system is a workaround. This involves modifying the method of operating a system in order to avoid exercising a problem known to be present. Using a workaround is particularly appropriate if the problem is a defect, since a design change is required to remove the problem completely, and this could take a long time. Workarounds are especially useful for stopping defects in software from causing errors. A workaround is also valuable if a fault is found in an ASRU, and the system cannot work without that ASRU, or if there is no deconfiguration capability for that ASRU. In these circumstances, providing some form of workaround allows the fault management exercise to complete.

In some ways, workarounds are similar to deconfiguration by avoidance (indeed, a workaround might be regarded as one form of deconfiguration). A change that typically allows the customer services to continue running properly, but which is nevertheless visible to the customer, is generally referred to herein as a workaround. In contrast, a change which is buried internally (but which might perhaps reduce system resources, such as by taking out an ASRU, thereby possibly reducing throughput) is referred to herein as deconfiguration by avoidance.

Note that deconfiguration by isolation and deconfiguration by avoidance can generally be performed automatically by the system. In this case the system can notify the fault management system when the deconfiguration has completed (or the fault management system may itself control the deconfiguration), thereby allowing the fault management exercise to complete. In contrast, a workaround generally involves a change in customer operating procedures, and so is carried out or at least organised by humans. In these circumstances, the human intervention also involves notifying the fault management system that the workaround is in place, so that the fault management exercise can move on. In one embodiment, such notification may be performed by marking the relevant problem in the suspect list as having had a "field acquittal" (as discussed above). The fault management system monitors the suspect list, and so detects such a change, thereby allowing the fault management exercise to progress to conclusion.

6.2.1.3 Removing a FRU

One possible reaction to a problem in a suspect list is simply to remove the FRU containing the problem from the system, while the ASRU is still in configuration. There are some problems for which this coincides with the traditional approach. For example, hot replaceable redundant power modules are not usually treated as ASRUs, subject to explicit configuration and deconfiguration. Rather, they are just plugged and unplugged without formality. If there is a problem in one of these power modules, pulling the module out of the system removes the problem from the system, thereby preventing the problem from causing any new errors in the system.

The removal of a FRU typically triggers an interrupt, leading to an update in the configuration database showing the FRUs that are present in the system (this already happens in many present-day systems). The configuration database is also updated to keep track of software changes, such as when uninstalling a program representing a FRU that has been found to contain a defect. In one embodiment, the configuration database notifies the fault management system of any configuration updates. If a FRU containing a problem has been removed, that problem can no longer spread errors, thereby allowing the fault management exercise to move on.

6.2.1.4 Mark as Field Acquittal

There are some circumstances in which a problem in a suspect list should be removed from the suspect list, even if no action has in fact been taken with respect to the FRU or ASRU in question. This then forces the fault management exercise to progress. There are various reasons for wanting to do this. For example, a service engineer might adopt this approach if there are multiple problems on a suspect list. Thus if one problem on the suspect list is specifically addressed (e.g. by taking out a FRU), the engineer might then mark all the other problems on the suspect list as a field acquittal. Another possibility is that the engineer believes that a different problem is present from that indicated by the diagnosis. This then allows the system to continue operations. The engineer can now test whether errors are still being created; if not, then the action taken by the engineer would appear to have fixed or at least contained the problem.

When there are multiple problems in the suspect list, every problem is to be resolved in some manner, such as by deconfiguration, reconfiguration (e.g. a FRU removal), repair, or field acquittal. In a multi-problem suspect list, the fault management system tracks how many problems in the suspect list have yet to be resolved (i.e. the ASRU of a problem is still in configuration, its FRU is still present and not repaired, and it has not been marked as field acquittal). Once the number of unresolved problems in the suspect list drops to zero, the fault management exercise moves on.

6.2.2 Clean-Up

Once the problem(s) in the suspect list are no longer creating new errors (or at least, any errors that are being created can no longer propagate to the now operational portion of the system), the fault management system goes on to address any errors created by the original problem that may already be stored in the operational part of the system. For example, a processor with a broken bus pin may have written correctable errors all over main memory. Deconfiguring the processor ASRU stops new errors from being written to memory, but the existing errors are still stored in memory. The clean-up phase remedies these errors (this process is sometimes termed "error repair"). The clean-up routines are responsible for clearing out stored errors and putting the system back together.

To perform the clean-up operation, the fault management system takes the suspect list and runs all the clean-up routines specified in the suspect list for the various problems. If no clean-up routine is specified for a particular problem, then this implies that no clean-up is necessary for this problem. In one embodiment, the clean-up routines are run independently of how the associated problem has been resolved (whether by field acquittal, ASRU deconfiguration, FRU removal, etc). The individual clean-up routines are therefore robust against being run in a range of configurations. The fault management system itself is robust against a missing clean-up routine. This situation might arise, for example, in the case of a software FRU, where the clean-up routine might have been uninstalled along with the defective program. (Some care is needed here, since a missing clean-up routine might also indicate some problem with the fault management software). Clean-up may also sometimes be performed after soft upsets. For example, some upsets change the system configuration, and clean-up must put it back the way it started.

Note that errors might still be arriving at error detectors during the clean-up phase. This does not necessarily indicate that the diagnosis is wrong or that the problem containment has failed. Rather the late errors might be caused by slow propagation from a problem that existed prior to the problem containment operation. (The fault management system can check whether or not these additional error events are consistent with its diagnosis and the problem containment). The clean-up routines therefore ensure that there are no errors in the system that are still slowly propagating towards error detectors. Otherwise, if such an error did arrive after the end of the clean-up stage, it would trigger a new fault management exercise.

Care also needs to be taken with regard to propagation time for reports from an error detector into the fault management system, especially where the same error gives rise to multiple detections. For example, assume that there is an erroneous bit in memory, and first and second reads of this bit give rise to first and second error reports respectively. The first report may lead to a diagnosis and a clean-up of the erroneous bit. If the second report then arrives after the clean-up has completed, it could initiate a new fault management exercise. There are two main ways in which this difficulty can be addressed. One is to delay completion of the clean-up exercise to allow for report propagation into the fault management system (which can be predicted from a knowledge of system design). The other is to timestamp error reports at creation. In the latter case, the fault management system on receipt of the second report could recognise that despite arriving at the fault management system after the clean-up operation had completed, the report was in fact created prior to the clean-up operation, and so belongs to the original fault management exercise.

Depending on the particular diagnosed problem and system, clean-up may therefore have to do any or all of clearing stored errors, waiting for errors to propagate to reports (and the reports to be received by the fault management system), and restoring configuration. These different operations may occur in various orders, and may have to be repeated as appropriate.

6.2.3 Re-Enabling Error Detectors

Once all the clean-up routines (if any) have finished, then there should be no further stored or propagating errors in the system. Accordingly, no new reports should be created or received for the original fault management exercise. At this point, the error detectors can be re-enabled, thereby allowing the detectors to be used in the diagnosis of any future problems. (Error detectors that may have been deconfigured along with a faulty ASRU, or pulled out with a faulty FRU do not need to be re-enabled).

It is assumed here that the error detectors are designed to avoid creating too many reports during a fault management exercise. This typically involves disabling hardware from generating an interrupt when an error has already been detected. The rationale behind this is that a single problem may generate a string of repeated errors. Normally the first error in such a series is of by far the greatest value for diagnosis. Disabling the error detector at this point therefore greatly simplifies the diagnosis by reducing the overall number of error reports to be processed, whilst at the same time losing little (if any) useful information.

(Certain error detectors may be automatically re-enabled at some earlier stage. The diagnosis manager is then informed of this, and can use this information in subsequent diagnosis, as described in more detail below).

Typically, a detector is re-enabled by first clearing the original error status, and then re-sensitizing the detector to future errors (in some detector-specific way). This allows the detector to create new reports on detection of an error. Any report that arrives after the detectors have been re-enabled at end of the clean-up routine, whether from a detector that has previously created a report in this fault management exercise, or from any other detector, is treated as part of a new fault management exercise.

One potential complication with re-enabling error detectors occurs in a system in which multiple fault management exercises are going on at the same time. In this situation, some of the disabled error detectors may have nothing to do with the fault management exercise that is just ending. One possibility is to simply re-enable all error detectors. This may lead to additional error reports from a problem (or problems) already being handled by the other fault management exercise(s). In general such repeat reports will not impact the diagnosis. A more elegant approach however is to re-enable only those error detectors associated with the fault management exercise that has just completed. This can be done on the basis of the reports that were incorporated into the fault management exercise in question.

6.3 Further Service Action

Although the act phase marks the end of the fault management exercise, the system may still require further attention. In particular, this is the case where an ASRU has been deconfigured (whether by isolation or avoidance). The diagnosed problem is still present in the system, although it is not causing errors. Nevertheless, the system still needs service, because a part is broken and out of use. Usually, this involves human intervention, such as a visit from a service technician. The technician removes (or replaces) the FRU that contains the problem, thereby returning the system to its full operational condition. Until this time, the fault management system tracks that the problem is still present in the FRU, in order to ensure that the deconfigured ASRU is not brought back into service. This also allows the fault management system, if the deconfigured ASRU is for some reason brought back into service and starts creating new reports again, to treat these reports as symptoms of a known problem, not as something new. The system configuration database can keep notes of which problems are present, and when they have been repaired (if necessary).

Different types of problem lead to a need for different types of service operation. For example, no service action will generally be needed for a problem which is diagnosed as an upset. Thus an upset is not associated with an ASRU or an FRU, and so does not have an ASRU or an FRU entered in the suspect list. An upset is therefore not remedied by an ASRU deconfiguration or FRU removal or replacement. Rather, an upset is remedied when the system is restored to its proper operating condition by an appropriate clean-up. Once the error detectors have been re-enabled, the fault management operation is finished, and there is no repair to be done later. (This assumes that the clean-up routines are successful; in some circumstances a further explicit recovery action may be needed after an upset to put the system back together).

If the problem is a fault, then a repair is normally required. Typically, the ASRU containing the fault is deconfigured during the fault management exercise and any appropriate clean-up performed, thereby allowing the system to continue operating without further errors. At some later date, a service operation is performed to replace the FRU containing the fault.

If the diagnosed problem is a defect, then replacing the FRU is unlikely to cure the problem, since the replacement FRU is likely to share the same problem. Deconfiguring the ASRU may also be of limited benefit, if the same problem potentially exists in other ASRUs (this is particularly true of replicated hardware ASRUs).

Defects are rarely fixed by a field service technician, but instead tend to be passed onto some back-room engineering operation. An appropriate further action upon diagnosis of a defect is therefore to send an alert to such a back-room operation directly. Note that this can be performed by the system automatically, without human intervention. For diagnosis systems that produce suspect lists including defects, the definition of the alert may be included with the definition of the defect (the alert could also be included as information in the suspect list).

Ultimately, a defect is remedied by installing one or more new components into the system, for example, a new software version. This can normally be performed as part of a standard hardware or software maintenance operation. The effect of the installation is to remove the defect from the system. Note that the new component(s) does not necessarily have to replace the component in which the defect was located. In some circumstances it may be simpler to alter one or more other portions of the system to accommodate the operation of the nominally defective component, so that the system no longer produces errors. For example, if the defect in one component is to transmit a message field with an additional bit in a certain field, then the system could be repaired by altering the message recipient in another component to accept such an additional bit. Another possibility would be to insert some converter inbetween the transmitter and the receptor that stripped out the additional bit.

In some embodiments, the fault management exercise may continue after the end of the act phase. For example, the fault management system may monitor the system after a particular ASRU has been deconfigured in response to a problem in a suspect list. If the observed errors associated with the suspect list reappear, then the fault management system may conclude that its selection of the problem to remedy from the suspect list was incorrect, and that another problem in the suspect list is the cause of the errors.

Another possibility is that once an ASRU has been deconfigured, the fault management system runs diagnostic tests on the ASRU that were not possible while the system was still part of the active configuration. Such tests may confirm or deny the presence of the suspected problem within that ASRU, and the fault management system can then act accordingly.

6.4 Other Aspects of the Fault Management Exercise

In some systems, the act phase may include a period when the computer is being rebooted, or even switched off, such as to accommodate a service operation. The fault management exercise persists across such an outage in order to be able to respond to any repair performed during the service operation. Even if a problem does cause a system to crash, then it is still possible to capture error data (reports) and store them in some buffer, a log file or a reserved memory area. After reboot, the system can detect these undiagnosed reports, and so launch a fault management exercise to diagnose what caused them (this assumes of course that the problem is not so severe as to prevent a subsequent reboot).

6.4.1 Configuration Management Policies

Although the fault management system may make a request for deconfiguration of an ASRU that is suspected of containing a fault, the ASRU is not necessarily going to be deconfigured. Rather, reconfiguration of the system is normally managed by a separate configuration management system 130 (see FIG. 1B), which controls which deconfigurations occur in the system and when.

A configuration management system generally implements policies to ensure that a specific service remains available by having sufficient compute resources, such as memory, processors and networks. If deconfiguring an ASRU would cause a service to run out of resources, an automated configuration management system may attempt to bring on-line spare resources, or to reclaim resources from some other service to compensate for the ASRU being deconfigured. Alternatively, the configuration management system may wait for human intervention prior to such deconfiguration, in which case the fault management exercise can be regarded as postponed.

The configuration management system needs to be pragmatic about the severity of a problem. For example, if a problem has just crashed the system, and the fault management system instructs the configuration manager to "Deconfigure ASRU A", this may be a sensible strategy to adopt, even if it results in fewer resources than desired (or required) to run a complete set of services. Thus ASRU A may be so broken as to cause the entire system to be unable to run if ASRU A is not deconfigured.

The configuration manager also needs to be careful in respect of problems that may crash the system or corrupt data, but that have not done so yet. Again, the pragmatic approach may be to deconfigure the relevant ASRU before such a crash does occur. One possibility is to have an optional field in the suspect list that could be used to compel the configuration manager to deconfigure the relevant ASRU, providing such situations can be diagnosed accurately and with sufficient reliability.

6.4.2 Automated Repair

In some circumstances, a system supports automated repair or reconfiguration, based on spare resources that may be available. For example, disk drive blocks can go bad, and spare blocks are set aside on the disk to take the place of these bad blocks without changing the perceived capacity of the drive. The process of replacing a bad block with a spare is an automated repair. Other examples of automated repair schemes are the bit- and word-line redundancy found in memories, and the provision of entire DRAM chips in an array.

Such an automated repair generally leads to a permanent change in the configuration, whereby the system has stopped using one component and started to use another. This corresponds to deconfiguring a first ASRU, and configuring in a second ASRU. In such circumstances, the relevant fault in the suspect list should be marked appropriately (e.g. by "automated reconfiguration") so that the fault management exercise can come to an appropriate conclusion.

6.4.3 Taking No Action

Sometime it may be appropriate not to take any particular system action in the act phase. For example, an error detector may measure the voltage of a backup battery for a system clock, and if the voltage drops too low, the detector produces a report, which triggers a fault management exercise. The diagnosis phase of the fault management exercise determines that the fault "backup battery flat" is present. The act phase of the fault management exercise then sends an alert to a human operator responsible for replacing the battery.

However, the act phase does nothing in terms of system recovery, and keeps on doing nothing. In addition, the fault management exercise does not terminate. Thus there may be further intermittent reports of voltage error, perhaps as the room temperature varies, causing the backup battery voltage to increase or decrease. Any such report is discarded by the fault management exercise without further action. Eventually, the human operator replaces the battery, pulling out the old battery and fitting the new one. The new battery has a higher voltage, so that no voltage error exists, and no report will be generated.

At this time, the fault management exercise is still in effect. However, the system cannot use the absence of a report of the voltage error as a trigger to end the fault management exercise, otherwise it would be confused by intermittent reports caused by temperature variation. Consequently, the human operator must enter a command to cause the fault management exercise to terminate.

6.5 Logging

Error detectors collect information about error events and package the information up as reports to send to the diagnosis system. In systems without automated diagnosis, the output of such detectors has generally gone as messages to a console and/or into a log file. In systems with automated diagnosis, these error messages may still be created, for example for use as a backup to automated diagnosis, and saved to a text file. However, distribution of the messages (e.g. to a console) may be restricted to avoid confusion and unnecessary customer concern (e.g. if the message only relates to a routine upset that has been addressed by an ECC system). Rather, the automated diagnosis facility may be used to filter and interpret the messages, and so to present them in a much more meaningful manner and context.

The diagnosis engine determines its output (the suspect list) from a set of known inputs (the error reports). To monitor and assess behaviour of the diagnosis engine, a log of the inputs to the diagnosis engine can be maintained (e.g. in a text file). In one embodiment, the fault management system itself is responsible for creating and writing to the log.

Note that the log information should include the ordering of inputs as received by the fault management system (rather than just the original timestamp associated with each event). This is because in real-time error handling, inputs may be presented to the diagnosis engine in quite a different order from that implied by timestamps added by error detectors, or in a different order from that of the outputs of the error detectors.

The configuration management system also provides input to the diagnosis engine, and the contents and timing of such input can also be important for diagnosis, as can the particular version (modification number, etc) of the diagnosis algorithm used in any given analysis. Accordingly, it is helpful if this information is also logged. Other data to be logged includes any timeouts (generally provided as asynchronous events) that are used by the fault management system to discover whether a given period of time has elapsed without an error propagating to produce a report.

The diagnosis log also records an indication of when an existing fault management exercise has ended. Note that this is separate from the change in configuration as ASRUs are deconfigured, because it also has to cover the time taken for any subsequent clean-up to run. (This may be particularly significant if multiple fault management exercises are running in parallel).

The outputs from the diagnosis engine should also be logged. In addition, it may be desirable to log some information about the internal status of the diagnosis engine (this would primarily be useful for understanding and debugging the diagnosis algorithm itself).

Considerations for the diagnosis log are that it is machine readable, ordered, fast, non-volatile, and atomic (inputs for each event logged together and separate from inputs for other events). One advantage of having a machine readable log is that this then allows simulations to be run based on the input to the fault management system. Such a simulation allows behaviour of the diagnosis algorithm to be examined in detail, offline, by a human, as well as testing future versions of a diagnosis engine to ensure that they are consistent with previous versions (regression testing).

Existing error logs (i.e. from systems without automated diagnosis) can also provide valuable input for testing the diagnosis engine. A further possibility is to perform testing using simulated input, although the power of this approach is limited, since the system model used to generate the diagnosis algorithm will normally be used as well to generate the simulated test input (so that there is an interdependency between the two).

7. Diagnosis

Figure 18B:
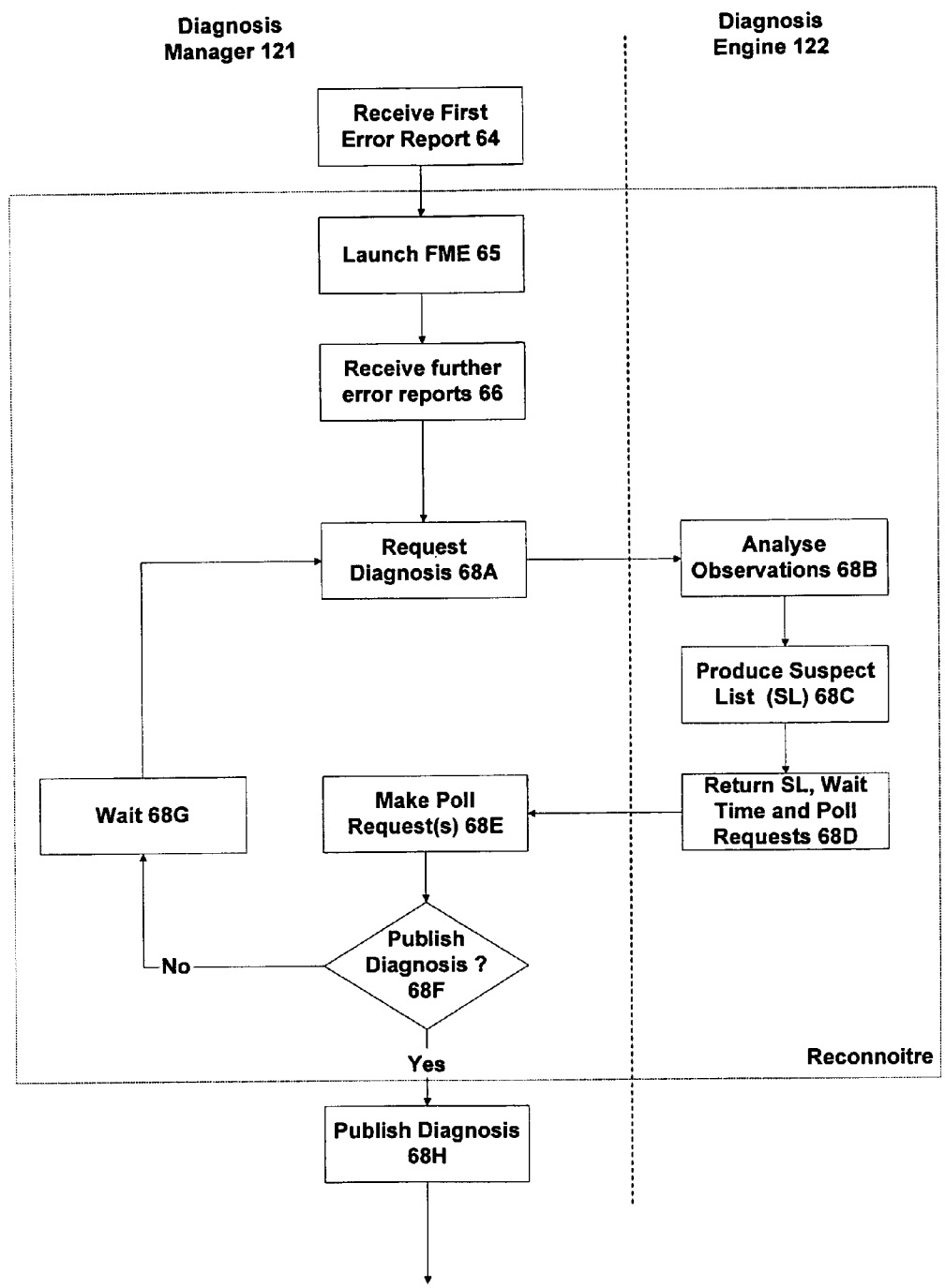
FIG. 18B is a flowchart illustrating the diagnosis phase in more detail in accordance with one embodiment of the invention.

The general operation of diagnosis or inference in accordance with one embodiment of the invention is shown in the flowchart of FIG. 18B (see also FIGS. 1A and 1B). The diagnosis manager 121 receives an initial report of a detected error (64), and launches a fault management exercise (65). (As explained in more detail below, the launch of a new fault management exercise at operation 65 may in fact be postponed to see if the error report(s) can be explained by any fault management exercise that is currently in progress).

In general the diagnosis manager will receive further reports of detected errors (66). Each record of a report is called here an "observation". The diagnosis manager now requests the diagnosis engine 122 to perform a diagnosis (68A). The diagnosis manager ensures that the diagnosis engine operates on a fixed set of data, as regards both observations and configuration information, during the relatively short period the engine runs. The diagnosis engine explores the fault tree representation 123 to explain the observations (68B). The output of this analysis is a suspect list (68C) that identifies one or more problems that may have caused the observed errors.

The diagnosis engine passes back to the diagnosis manager the suspect list, a wait time, and a set of poll requests (68D). The manager activates the pollers on behalf of the diagnosis engine, or at least requests the system to do so (68E). In addition, the diagnosis manager determines whether to publish the diagnosis (68F). Thus the engine is usually called multiple times by the diagnosis manager in the process of diagnosing one problem, and the engine produces an interim suspect list each time. The manager decides whether to wait (68G) or to publish (68H), based first on whether the diagnosis can ever be improved, and second on whether the system can afford to wait. The published diagnosis may then be refined by a policy module (operation 70, see FIG. 1A) before the fault management system enters into the act phase.

One possibility is that the engine tells the manager that the diagnosis might be improved, but the manager might have to wait a long (perhaps infinite) time for this to happen. The manager then has to make a decision of how long to wait, which may depend on the perceived seriousness or urgency of the problem. Any interim suspect list can be published as a final diagnosis at the discretion of the diagnosis manager. The manager not only decides when to publish a new suspect list for a new fault management exercise, but also when to publish a revision of an old suspect list, which may be possible when new observations appear. (Although FIG. 18B depicts further error reports being received as a single operation 66, it will be appreciated that in practice that such reports may show up on an ongoing basis; this then gives an opportunity for further analysis and diagnosis, even if the existing diagnosis has already been published at operation 68H).

The diagnosis manager takes care of marking observations with re-enable times when an error handler associated with a detector informs the manager that a detector has been re-enabled. The diagnosis manager marks stored errors as cleared when a fault management exercise claiming stored errors terminates. Pollers themselves mark propagations with information on poller runtimes.

An observation, i.e. a record of the capture of one error by one error detector to create one report, generally includes data such as the name of the report and the time the report occurred. The report made by the error handler may have an arbitrary amount of extra information attached, and all of this information is included as data in the observation. In addition, observations are marked with the re-enable time for the detector which produced the report. Observations for a specific named report (from a particular detector) thus provide information both on the sequence of when that report was observed, and also on what times the error detector was disabled. The diagnosis algorithm understands that during periods when the detector was disabled, errors might have been present at the error detector without causing another report.

One report may be observed multiple times in the course of diagnosing a single real problem. Each separate report created by an error handler leads to the construction of a separate observation by the diagnosis manager. The diagnosis engine must construct a hypothesis which explains all the observations.

A "real problem" is one thing that is wrong with the system. Each real problem is associated with one suspect list by diagnosis. The problems on the suspect list could all individually produce the effects that are believed to have been caused by the real problem.

An important task of the diagnosis engine is to construct a credible hypothesis to explain what is going on. There can be several "real problems"—separate faults, upsets and defects—present in the system simultaneously, and each of these has to be represented by a separate suspect list containing possibly multiple problems as defined in the fault tree. Each of the real problems is represented by a suspect list, and each of the problems on the suspect list is able to cause all the reports believed created by the relevant real problem (some of the reports might have been caused by one of multiple different real problems).

In one embodiment, the diagnosis algorithm operates by a recursive analysis of all potential hypotheses, discarding those that are found not to be possible in the current circumstances—e.g. because they rely upon a component being operational when it is currently deconfigured. The algorithm involves both ascending (climbing) the fault tree from the original reported error, and also descending the fault tree to verify the consequences of a suspected problem. At some parts of the analysis, the algorithm adopts what is referred to herein as an "optimistic" approach, while in other parts it adopts a "pessimistic" approach. This diagnosis algorithm is described in more detail below.

At any given time, some real problems may be in the process of diagnosis, while other might have been diagnosed, with a suspect list published, but are still being handled in their fault management exercises. Yet other problems might have been finished with, in that their fault management exercises are over, but are still somehow present in the system (e.g. because a faulty component has been deconfigured but not yet replaced).

In one embodiment, the diagnosis engine makes the assumption that any real problem with a diagnosis already published is, in fact, present. Once a diagnosis has been published, the diagnosis engine can refine the diagnosis by reducing the size of the suspect list, but new problems are not added to the suspect list. The real problem corresponding to the suspect list is held to explain a set of observations, and no further explanation of those is needed.

Conversely, for observations without a published diagnosis, all is still open. The engine tries to construct a single hypothesis to explain all these observations at the same time. The construction proceeds incrementally by hypothesising the presence of problems, errors and propagation routes. At any stage of this process, the engine may discover that its current hypothesis is disproved, reverse its deliberations, and try a different hypothesis.

It will be appreciated that diagnosis in large systems can be very involved, with large-scale fault trees to be processed. It is not necessarily expected that the diagnosis approach described herein will always be correct for the analysis of multiple simultaneous real problems, but the results have been found reliable enough to be of significant benefit.

7.1 Understanding the Fault Tree

A problem creates an error, which propagates as specified by its effect bubbles. An event (called say error.something) is regarded as "present" when a propagation from a problem has caused an error of a particular type to be present in a part of the system. The definition of the event error.something with its attached bubbles represents how that part of the system propagates that type of error. An error is a signal created by a problem that flows along the routes defined by the propagations in the fault tree, through the parts of the system defined by the events in the fault tree, and may cause a report (depending upon the particular propagations). The constraints defined on the propagations refine the definition of how the events transmit errors and modify their parameters.

The cause bubble on an event defines how a particular type of error is caused to become present in the part of the system represented by that event. The inhibit bubble defines how that error in an event can be inhibited from propagating. The effect bubble defines how, if that error is present in the event and is not inhibited, it will be propagated.

An error will only be present when there are enough propagations to its cause bubble and not enough propagations to its inhibit bubble, where "enough errors" is defined by the K in the cause or inhibit bubble according to the following rules:

at least K errors must be present at the bubble at the same time.

K="A" in a cause or inhibit bubble means: "all the incoming propagations that are not forbidden by their configuration constraints".

K=an integer in a cause or inhibit bubble means: "K incoming propagations".

When an error is caused in the part of the system represented by an event, and not inhibited from propagating, it will propagate from its effect bubbles according to the following rules:

each effect bubble must propagate at least N errors.

N="A" in an effect bubble means: "all the propagations that are not forbidden by their configuration or parametric constraints".

N=an integer in the effect bubble means: "at least N propagations, or the number of propagations not forbidden by their configuration or parametric constraints, whichever is smaller".

A delay constraint on a propagation from an effect bubble implies: "if an error travels along this propagation, it will start from the effect bubble immediately an error becomes present in this event, and will arrive at the cause bubble at the other end of the propagation some time between the minimum and maximum propagation delays later".

A poller on a propagation from an effect bubble implies: "if an error travels along this propagation, it is only guaranteed to arrive at the cause bubble if it is present throughout the time the poller is running; it may arrive if it is present at any time the poller is running; and it will not arrive if it is present only after the poller stops running. It may arrive at the cause bubble at any time after the poller starts running, and is guaranteed to have arrived, if it is going to do so, by the time the poller stops running".

An error which travels along a propagation only to be thrown away because the poller is not running does count towards meeting the N requirement.

The above definitions of N and K are consistent with the approach described in relation to the Eversholt language of eliding propagations that do not satisfy the relevant configuration constraints.

The diagnosis engine views errors as either momentarily or continuously present at an event. Error detectors are generally designed to detect errors present momentarily. The error at the cause bubble of a report is viewed as momentarily present at the time the detector detected the error. A momentary error E is modelled as having been present at some instant $T_{(E)}$, subject to (earliest, latest) time limits:

$$T_{E(E)} <= T_{(E)} < T_{L(E)}$$

These time limits indicate that an error was at least momentarily present within the time interval, but do not imply that no other error was present, or that this error was not continuously present. Note the use here of one relational operator "<=" and the other "<" in the constraint on $T_{(E)}$. This asymmetry helps to simplify computations with timestamps, although other embodiments may adopt other conventions for timing constraints.

A stored error S is modelled as being continuously present between a start time $T_{S(S)}$ and a finish time $T_{F(S)}$. These times are usually only known approximately. In such circumstances, the best that can be done is to represent each of them as an (earliest, latest) pair:

$$T_{ES(S)} <= T_{S(S)} < T_{LS(S)}$$

$$T_{EF(S)} <= T_{F(S)} < T_{LF(S)}$$

Errors can be stored in part of the system represented by an event. The storage is represented by a feedback loop around the event, perhaps with constraints. The effect of this storage is to move the earliest limit on the propagation of the error to this event earlier in time.

Stored errors are cleared out by the end of a fault management exercise dealing with them, and the store is either deconfigured or rewritten with data which is not in error. This is the function of the clean-up routines in the fault management exercise. Stored errors also can be cleared out on certain reconfigurations—for example, a memory could be cleared of stored errors when a system moves it between two domains. This can be represented as a constraint on the feedback loop. In addition, stored errors may also be cleared by (enough) errors propagating to the inhibit bubble of the relevant event. (If inhibition of the event does not clear out stored errors, this can be represented by having the stored error propagate to an error without feedback but with an inhibit bubble).

7.2 Inference from Constrained Propagation

Inference is based upon propagation under constraints. Any report which is observed represents the creation of an error by a problem, the propagation of that error through the events in the fault tree, and the detection of that error by the error detector associated with that report. A single error takes this whole path. Other errors may be created by the problem and take different paths, and this error may cause other errors, and may be detected by other error detectors, but it is known for certain from just the first observation that at least one error has made the whole journey from a problem to the observed report. Accordingly, it is immediately appropriate to try to trace the journey that this specific detected error took back through the fault tree.

To distinguish this particular error (the one that was created by the problem and was detected to cause the report) from all other errors flowing around, it is called here the "particular error". The route through the fault tree that the particular error is hypothesised to have taken is called the "particular route". The report at the end of the particular route, caused by the particular error, is called the "particular observation".

The route taken by the particular error can have any number of constraints in various places in the fault tree. The particular error must have met all these constraints, or it would not have propagated. Therefore, in order to find what problems might have created the particular error, the diagnosis algorithm climbs up from the particular report back through the fault tree, evaluating the constraints as it goes. Any route back to any problem that is not forbidden by the constraints on propagation is a candidate to have been the particular route. Any problem at the far end of such a route is an initial candidate for the real problem that exists in the system.

Constraints on propagation in the eversholt language take two possible forms: timing constraints, and configuration and parametric constraints. (Polled propagations can be regarded as a special category of timing constraints). If an error travelling along a propagation does not meet any one of the constraints defined for that propagation, then the propagation fails. Looking at the constraints applying to any route that an error has taken allows inferences to be made about the error, in that the error must have met all the constraints along the route.

As a matter of convention, and to simplify implementation, constraints on a single propagation from effect bubble to cause bubble are considered to act in a defined order:

from effect bubble
parametric and configuration constraint
timing constraint
to cause bubble When initially climbing the fault tree from report to problem, the constraints are evaluated in reverse order, i.e., timing, and then configuration and parametric, because that is the order they are encountered in the climb. Note that other fault tree implementations may assume a different order of constraint application (or may not make any assumption at all about such ordering).

7.3 Timing Constraints

Timing constraints specify how long a propagation may take, or alternatively what poller must run in order to enable the propagation. An error cannot fail to "meet" a timing constraint, but the delay or the poller does place restrictions on the time at which the error may have propagated. If the poller has not run, or ran at the wrong time, the propagation may not have been able to complete. Propagation delays are specified as a {within(Pmin(E, F), Pmax(E, F))} constraint, the minimum and maximum propagation delay from event E to event F.

7.3.1 Evaluating Delay Timing Constraints when Climbing the Fault Tree

A momentary error is hypothesised to be at least present transiently, and error detectors which produce reports are presumed to be sensitive to such momentary errors. (If this is not the case, the error detector can be modelled with a poller).

Assume that an error event error.e is hypothesised to propagate to a report event ereport.f, and that for a particular observation under examination, the time $T_{(F)}$ that the reported error was detected to produce the observation is approximately known to be between an (earliest, latest) pair: $(T_{E(F)}, T_{L(F)})$. Accordingly, the error is known to have been present at the detector at some time $T_{(F)}$ within this window.

From this information, it can be inferred that the particular error was present at error.e at some time $T_{(E)}$ within known limits:

$$T_{E(F)} - P_{MAX(E, F)} <= T_{(E)} < T_{L(F)} - P_{MIN(E, F)}$$

where $P_{MIN(E, F)}$ and $P_{MAX(E, F)}$ represent the minimum and maximum propagation times respectively between event error.e and event ereport.f. Note that this does not imply that there was an error present throughout this interval, nor that the error was not also present outside this interval—just that the error was certainly present at event error.e at some instant $T_{(E)}$ within the specified interval.

An analogous arithmetic can be repeated to discover a limiting time interval for the presence of this particular error at some earlier precursor event to E, further up the fault tree. Climbing up the fault tree to discover each possible path for the propagation of the error from problem to report, a time interval can be computed during which an error must have been momentarily present at each event on the tree, if the hypothesis that the particular error took that particular route is correct.

Separate computations can discover separate limits on the time of presence of an error at an event. For example, limits can be set based on the arrival time of the error at an error detector, while known changes in configuration can also set different time limits. Any propagating error must meet all these separate constraints, and the time $T_{(E)}$ that the error was present must be in compliance with all the computed limits.

Whenever multiple separate limiting times describe the presence of an error at an event, they combine to produce the narrowest possible limits. If the various limits on $T_{(E)}$ are $T_{E1(E)}, T_{E2(E)} \ldots$ and $T_{L1(E)}, T_{L2(E)} \ldots$ then the combined limits are $$\max(T_{E1(E)}, T_{E2(E)}, \ldots) <= T_{(E)} < \min(T_{L1(E)}, T_{L2(E)}, \ldots)$$

Figure 19:
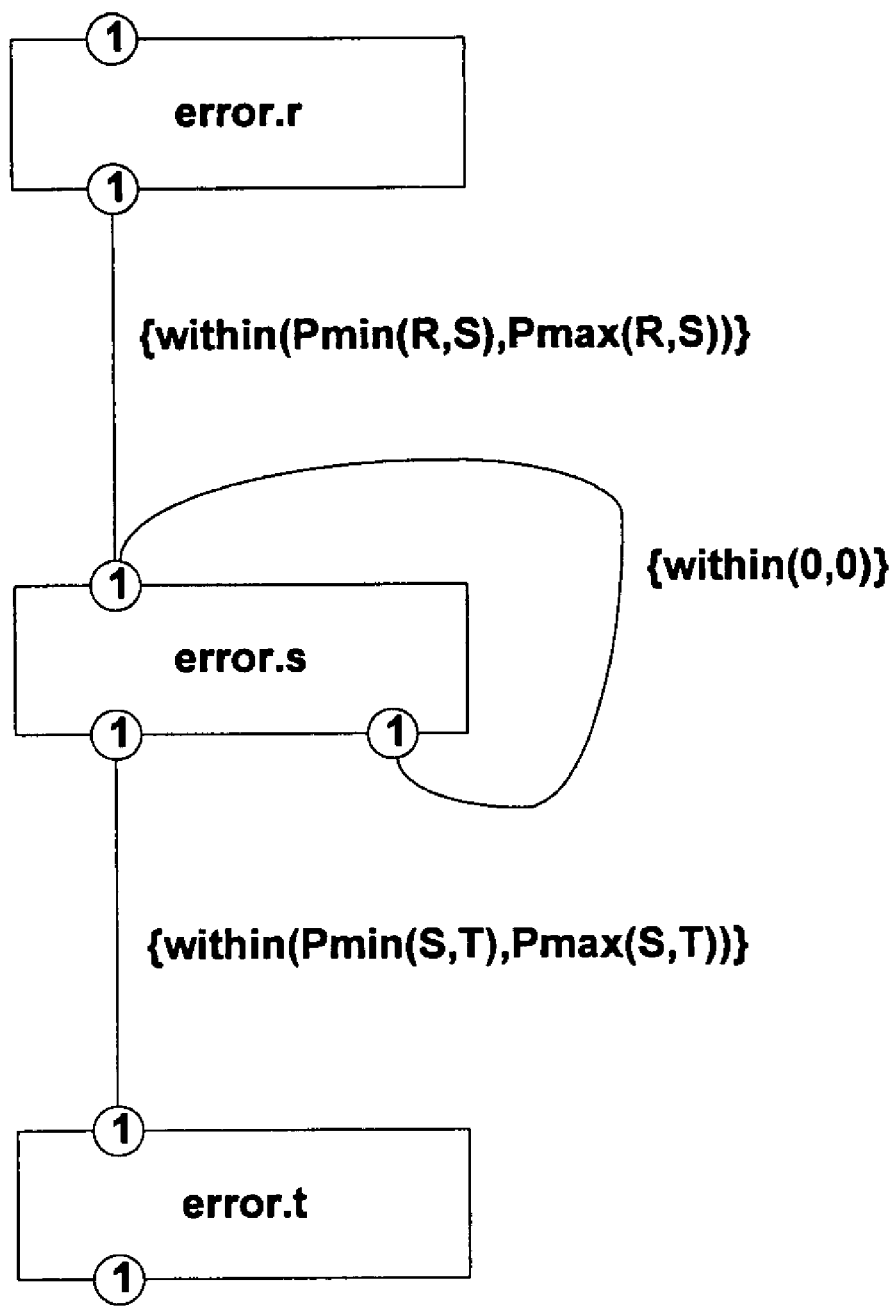
FIG. 19 illustrates a fault tree diagram incorporating stored errors and timed propagations in accordance with one embodiment of the invention.

A continuous error is an error that is conjectured to be present all through some period of time, such as when an error is stored. An example of such a stored error is illustrated in FIG. 19. When climbing the fault tree and going up a propagation to an event representing a stored error, the limits on the time that a momentary error had to propagate from the effect bubble of the event representing the stored error are computed as discussed above. The impact of the storage is to move the earliest time forward when climbing up the propagation from the stored error.

For example, an error is hypothesised to be present at least momentarily at event error.t at some time $T_{(T)}$ within limits:

$$T_{E(T)} <= T_{(T)} < T_{L(T)}$$

Climbing up from error.t, a momentary error is computed to be present at the effect bubble of error.s at a time $T_{(S)}$ within limits:

$$T_{E(S)} = T_{E(T)} - P_{MAX(S, T)} <= T_{(S)} < T_{L(S)} = T_{L(T)} - P_{MIN(S, T)} \qquad \text{Eq. 7.1}$$

Stored errors are cleared out if the feedback path opens, a propagation occurs to the inhibit bubble, or the fault management exercise handling the problem that created the stored error ends (this last is noted specially by the diagnosis manager). As a special case, the diagnosis engine evaluates the constraints on the feedback path before climbing up higher. Any configuration constraint on the feedback path is evaluated for a time from $T_{L(S)}$ backwards. The feedback path is also considered to open when the fault management exercise ends. When the feedback path is open, the assumption is that the event representing the stored error cannot propagate any error. (There are some hardware designs for which this is not a valid assumption, in which case these designs should be modeled by both a stored error and a parallel propagation of a momentary error).

The value of the constraint {C} on a feedback path may change with time, as configuration changes with time, and can therefore provide further limits to the time $T_{(S)}$ when a momentary error might have propagated from error.s. For example, in one situation, $T_{(S)}$ may have to satisfy not only equation 7.1 above, but also $$T_{ES(\{C\})} <= T_{(S)} < T_{LF(\{C\})}$$

where $T_{ES(\{C\})}$ is the earliest time that the constraint {C} might have started to evaluate to TRUE, and $T_{LF(\{C\})}$ is the latest time that it might have finished being TRUE.

It is possible that there are multiple separate periods when {C} was true during the interval defined by the limits in equation 7.1. For the best diagnosis, each of these needs to be treated as a separate opportunity to construct a hypothesis by the diagnosis engine, with the engine iterating through the possibilities. For each separate period when {C} is true, the limits on the time $T_{(S)}$ when a momentary error might have propagated are:

$$\max(T_{E(S)}, T_{ES(\{C\})}) = T_{E1(S)} <= T_{(S)} < \min(T_{L(S)}, T_{LF(\{C\})}) = T_{L1(S)} \qquad \text{Eq. 7.2}$$

In equation 7.2, $T_{E1(S)}$ and $T_{L1(S)}$ are the new limits on $T_{(S)}$ for this opportunity to propagate an error, taking into account both the feedback loop and the propagation to error.t. For this opportunity, the error may have become stored in error.s at an earlier time. Error stores capture errors, hold them, and may propagate them later. This earlier time is limited by the earliest that the feedback loop could have closed for this opportunity.

The start time for the error being stored, which is the same thing as the time at which an error propagated to the cause bubble of error.s, is limited by $$T_{ES(S)} >= T_{ES(\{C\})}$$

$$T_{LS(S)} < T_{L1(S)}$$

These times are the limits on the time of propagation of a momentary error to the cause bubble of error.s to store an error into error.s. These limits can then be used to discover the limits on the time at which this error might have propagated from the effect bubble of error.r, and may be narrowed further when the engine later descends the tree having discovered a possible causal problem.

7.3.2 Evaluating Delay Timing Constraints Descending the Fault Tree

Figure 20A:
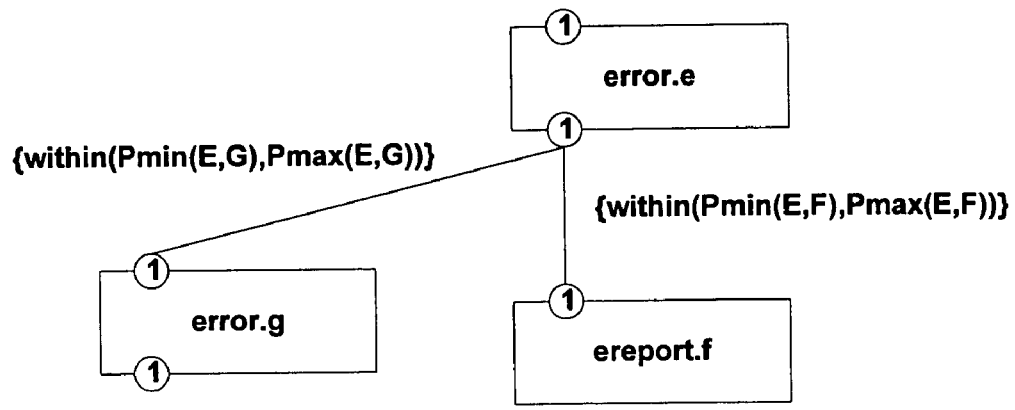
FIG. 20A illustrates a fault tree diagram incorporating timed propagations in accordance with one embodiment of the invention.

Having established time limits for the presence of an error, it is then possible to use those limits to predict the time at which some subsequent event may occur (or may have occurred). For example, in the fault shown in FIG. 20A, if there is a must propagation from an error.e to an error.g, then any error present at error.e must propagate to cause an error at error.g, and this error must be present at error.g at some time $T_{(G)}$ within the limits:

$$T_{E(E)} + P_{MIN(E,G)} <= T_{(G)} < T_{L(E)} + P_{MAX(E,G)}$$

(Again, this is not to say that an error was present at error.g throughout these time limits, or was not present outside them). Consequently, from the observation of the arrival time of ereport.f, it is possible to predict (earliest, latest) limits on the time at which an error was definitely present at least momentarily at error.g, namely:

$$T_{E(F)} - P_{MAX(E, F)} + P_{MIN(E, G)} <= T_{(G)} < T_{L(F)} - P_{MIN(E, F)} + P_{MAX(E, G)}$$

This arithmetic can be repeated to discover a limiting time interval for the presence of a consequence of the particular error at later events below G. Hence, the observation of the arrival time of just one report allows a chain of inference which sets time limits on the momentary presence of an error as it propagates from problem to report, and also as it propagates along other paths in the tree. Of course, the actual path of travel for any given error may not be known, but the diagnosis engine is able to postulate all possible paths of travel from the fault tree. For each postulated path, a time interval limiting the presence of the error at each event can then be computed.

Climbing the tree from report to problem produces one pair of limiting times on the presence of an error at an event. Descending the tree from problem to report and performing further tests to check the validity of a hypothesis can produce limits that are more restrictive. This can occur because time-varying configuration information restricts propagation, because execution of a poller restricts propagation, and also because of the implications of observations used in the inhibitors and requirements tests (as described in more detail below).

Whenever multiple timing constraints apply to the presence of an error at an event, the times are combined to produce a single result, as described above. If the engine has to retreat because it has disproved a hypothesis, it also has to undo these timing combinations, in other words, discarding time limits which were applied while constructing the hypothesis.

Returning to FIG. 19, the fault tree shown therein will now be evaluated descending the tree. A momentary or continuous error present at time $T_{(R)}$ at error.r will cause an error to be stored at error.s. If $T_{(R)}$ is presumed to be present at some time between the limits ($T_{E(R)}, T_{L(R)}$), an error starts to be continuously present at error.s at time $T_{S(S)}$. The time limits on this are:

$$T_{ES(S)} = T_{E(R)} + P_{MIN(R, S)} <= T_{S(S)} < T_{L(R)} + P_{MAX(R, S)} = T_{LS(S)}$$

$T_{ES(S)}$ is the earliest time that an error became stored in error.s, and $T_{LS(S)}$ is the latest time that an error became stored in error.s. The error will be continuously present at error.s until the feedback loop is broken, or the end of the fault management exercise clears the error out.

If the feedback loop were a may propagation, the stored error might be cleared at any time after $T_{S(S)}$. However, since there is a must propagation from error.s to error.t, this implies that an error must be continuously present at error.t, starting at some time $T_{S(T)}$. Limits on this time are $$T_{ES(T)} = T_{ES(S)} + P_{MIN(S, T)} <= T_{S(T)} < T_{LS(S)} + P_{MAX(S, T)} = T_{LS(T)}$$

In this example, the error will be present at error.t throughout the period from $T_{S(T)}$ through to near the end of the fault management exercise. The fault management exercise ensures that any error propagating from an error store such as shown in FIG. 19 has disappeared by the time the fault management exercise ends.

As a hardware example of a stored error (such as shown in FIG. 19), consider the overcurrent protection of a power supply, in which excess load current due to some fault is modeled by an error.r, and this error in turn causes the overcurrent trip mechanism of the power supply to come into play. In particular, the trip mechanism can latch the power supply off until some corrective action is taken by software or by a human. Turning the power supply off causes an undervoltage error, modeled by error.t, while error.s models the latching action built somewhere into the power supply hardware.

Note that since a must propagation from a stored error implies that the error must propagate at all times after it has been stored until it has been cleared, a timed must propagation is never appropriate for an error store implemented as an addressable memory. This is because the propagation would depend on the read address, and so could not be guaranteed to occur.

If the propagation from error.s to error.t in FIG. 19 were replaced by a may propagation, then a momentary error could have propagated to error.t at a time $T_{(T)}$ where:

$$T_{ES(S)} + P_{min(S,\,T)} = T_{E(T)} <= T_{(T)} < T_{LF(S)} + P_{max(S,\,T)} = T_{L(T)}$$

7.4 Polled Constraints

An error propagated as an output by a poller is considered to be momentary (not continuous). Pollers usually represent some sort of software function. Outer limits on the poller start and finish times are known, but not the intervening time at which the poller actually propagates the error. Even if a continuous error propagates to a poller, it is assumed that a momentary error propagates from the poller. If, in climbing a fault tree to trace a particular route, the diagnosis algorithm reaches a propagation with a timing constraint that is a poller, the propagation will be marked with the start and end times of the last run (if any) of the poller.

The diagnosis engine adopts what is termed optimistic evaluation for climbing the fault tree when faced by the question: "is it credible that an error propagated through this poller?" Thus if a poller propagates an error, then the error must appear at the cause bubble sometime between the earliest start time for the poller and the latest finish time for the poller (this is a design requirement for any poller program). In other words, for a polled propagation having N=K=1 from error.j to error.h, we have:

$$T_{ES(poller(J,\,H))} <= T_{(H)} < T_{LF(poller(J,\,H))}$$

However, the actual value of $T_{(H)}$ (i.e. the timing of error.h) is not normally known, but only the earliest and latest times that error.h could have been present, namely:

$$T_{E(H)} <= T_{(H)} < T_{L(H)}$$

This leads to the relationship (albeit in practice a rather weak one):

$$(T_{E(H)} <= T_{LF(poller(J,\,H))}) \text{ \&\& } (T_{ES(poller(J,H))} < T_{L(H)})$$

If the time the poller was running (or still is running) overlaps, in any way, the limits on the arrival time of the error at the cause bubble, then it is possible that that particular route was taken. If the above relationship does not hold, then it is not credible that the error propagated through the poller.

If the error did propagate through the poller, an error must have been present at error.j at some time $T_{(J)}$. The limits on $T_{(J)}$ are then $$T_{ES(poller(J,\,H))} <= T_{(J)} < \min(T_{LF(poller(J,\,H))},\, T_{L(H)})$$

As usual, this does not say that an error was not present at error.j at any other time, but only that an error was present at error.j at some time $T_{(J)}$ within the specified limits.

The diagnosis engine adopts what is termed pessimistic evaluation for climbing the fault tree when faced by the question: "is it credible that an error did not propagate through this poller?" It is generally credible that an error did not propagate through a poller, unless the error was continuously present throughout the time that the poller ran. In pessimistic evaluation, the error present at the input of the poller has to be continuously present, and also has to meet the timing limits:

$$T_{LS(J)} <= T_{ES(poller(J,\,H))}$$

$$T_{EF(J)} > T_{LF(poller(J,\,H))}$$

For descending the fault tree, optimistic evaluation is based on the fact that when tracing the route taken by an error down from an event through a poller, such as the route from error.j to error.h, the propagation can only occur if the limits on the time the error is present at error.j, namely $T_{(J)}$, overlap the run time of the poller. This can be expressed as:

$$(T_{E(J)} <= T_{LF(poller(J,H))}) \text{ \&\& } (T_{L(J)} >= T_{ES(poller(J,H))})$$

An error will be present at error.h at some time $T_{(H)}$. The limits on $T_{(H)}$ are:

$$\max(T_{E(J)},\, T_{ES(poller(J,H))}) <= T_{(H)} < T_{LF(poller(J,H))}$$

This relationship illustrates how a poller can sample its input at any time and present its output at any later time until it finishes running. For pessimistic evaluation when descending the fault tree, it is always credible that an error which is only momentarily present at the input to a poller might not have propagated through the poller.

As noted above, continuous errors at the input to a poller need only be momentarily present at the output of the poller. The error at the output might even be momentarily present multiple times during the poller run. Therefore, in an optimistic evaluation when descending the fault tree, a continuous error can be characterised by start and finish times, $T_{S(J)}$ and $T_{F(J)}$. The error is assumed to be continuously present between these times, each of which is known only approximately, subject to the following limits:

$$T_{ES(J)} <= T_{S(J)} <= T_{LS(J)}$$

$$T_{EF(J)} <= T_{F(J)} <= T_{LF(J)}$$

It is credible that such an error could be transmitted by a poller if there is any overlap between the time that the error is present and the time that the poller is running, in other words:

$$(T_{ES(J)} <= T_{LF(poller(J,H))}) \text{ \&\& } (T_{LF(J)} >= T_{ES(poller(J,H))})$$

If the error does propagate, a momentary error will appear at error.h at time $T_{(H)}$, as defined by:

$$\max(T_{ES(J)},\, T_{ES(poller(J,H))}) <= T_{(H)} < T_{LF(poller(J,H))}$$

Pessimistic evaluation when descending the fault tree for a continuous error is appropriate when the question is: "is it credible that this error did not propagate through this poller?" If an error is continuously present at the input to a poller throughout the time that the poller is running, then the poller must propagate the error to its output. This implies that if the following relationship holds, then it is not credible that the error did not propagate:

$$(T_{LS(J)} <= T_{ES(poller(J,H))}) \text{ \&\& } (T_{EF(J)} >= T_{LF(poller(J,H))})$$

Alternatively, if the above relationship does not hold, then it is possible that the error did not propagate.

If the error does propagate, a momentary error will appear at error.h at time $T_{(H)}$. The limits on this are $$T_{E(H)}=T_{ES(poller(J,H))}<=T_{(H)}<=T_{LF(poller(J,H))}=T_{L(H)}$$

7.5 Parametric and Configuration Constraints

As previously discussed, configuration database 135 (see FIG. 1B) can be used to hold a history of configuration. The duration that a configuration variable V takes a particular value C can be defined by four times, which (in chronological order) are:

| | |
|---|---|
| TES(C) | the earliest time that V could have taken the value C |
| TLS(C) | the latest time that V could have had any value but C |
| TEF(C) | the earliest time that V could have taken a value other than C |
| TLF(C) | the latest time that V could have taken the value C |

Let us assume that the configuration changes the value of V from B to C, and later from C to D. In the period before $T_{ES(C)}$, the value of V was definitely B. In the period from $T_{ES(C)}$ to $T_{LS(C)}$, the value of V could be either B or C, but nothing else. In the period from $T_{LS(C)}$ to $T_{EF(C)}$, the value of V was definitely C. In the period from $T_{EF(C)}$ to $T_{LF(C)}$, V took the value C or D, but nothing else. In the period after $T_{LF(C)}$, V definitely took the value D. (Note that in this situation $T_{EF(C)}$ is the same thing as $T_{ES(D)}$, and $T_{LF(C)}$ is the same thing as $T_{LS(D)}$).

Using this model therefore, a configuration variable takes either one definite value, or one of precisely two values, depending on whether or not the variable was changing value at the time. This is a useful property that can be exploited by the diagnosis algorithm.

When the diagnosis engine moves forward over the fault tree, exploring a possible route by which an error has propagated, it evaluates constraints on a propagation, and decides whether or not an error might have propagated along that route. If it decides that the propagation is possible, it constructs a hypothesis that some error propagated that way, so that the error must have met any parametric constraints on the propagation. For example, with the constraint {$adrs > 8} on a propagation, any error following this propagation must have had $adrs greater than 8. In this way, the diagnosis engine "picks up" any parametric constraint on a propagation as an extra description of the error that (hypothetically) propagated. Note that "picking up" a parametric constraint in this way implies ANDing the parametric constraint with any other parametric constraints already describing the particular error. On the other hand, if the engine later retreats from a propagation in a hypothesis, it drops the constraint from its description, removing the ANDed parametric constraint as the engine passes back over the propagation. The full description of the hypothetical propagating error at any point on the tree is the AND of all the picked-up parametric constraints currently being held (since the propagating error must meet all these parametric constraints simultaneously).

It is possible for the fault tree to contain a constraint that assigns a particular value to a parameter, for example:

{$syndrome := 0x71}

The effect of such an assignment is not to constrain propagation, but rather to change the value of a parameter of an error which does propagate.

In climbing up the tree, the diagnosis engine may already have formulated a hypothesis which includes a constraint such as {$syndrome == 0x42}

On encountering the assignment in climbing the tree, the engine transforms it into a relational expression and adds it to its description of the hypothetical error:

{($syndrome == 0x71) && ($syndrome == 0x42)}

The diagnosis engine then determines that this evaluates to {FALSE}, and so concludes that the error cannot have propagated along this particular route.

If the engine decides that the error might have propagated along the route and been assigned a new value for $syndrome, it has to leave behind any terms in its description of the propagating error that reference $syndrome. The engine does not yet have any information about the value of $syndrome higher up the tree. In climbing further, it can add new constraints on $syndrome to its description higher up. If the engine later has to retreat over the assignment constraint, it picks up the old description it left behind.

In climbing down the tree from a hypothetical problem, the assignment never blocks propagation, but does mean that the engine has to leave behind any terms in the description containing $syndrome as it passes the assignment constraint. Climbing down over the assignment, the engine transforms the assignment into a relational expression and adds it to its description of the propagating error. It also picks up any description it left behind during the earlier climb of the diagnosis algorithm.

Before any parametric constraints apply to an error, the error is assumed to be unconstrained, and parameters associated with the error might have taken any value at all. This can be represented as the constraint {TRUE}, indicating that no constraints apply. Whatever the values of any parameters associated with an error, the constraint {TRUE} always evaluates to TRUE.

As the engine moves forward over the tree "picking up" parametric constraints which it knows that the error that it is hypothesising to have propagated must have met, it adds each parametric constraint to its description of the error. For example, the engine may climb a first propagation including the constraint {$adrs > 8}, whereupon it knows that the particular error would be described by the constraint {($adrs > 8 && TRUE} (which is the same as simply {$adrs > 8}).

The engine may climb further on the same particular route and pick up the constraint {$adrs < 6} from another propagation. An error which propagated along this particular route must therefore have met {($adrs < 6) && ($adrs > 8)}, in other words, {($adrs < 6) && ($adrs > 8)} must evaluate to TRUE for some value of $adrs. Since there is no value of $adrs that can possibly have {($adrs < 6) && ($adrs > 8)} evaluate to TRUE, it is therefore determined that the error cannot have propagated this way. The constraint therefore evaluates to {FALSE}, thereby implying that propagation along this particular route is not possible, independent of the actual values of any parameters associated with the error.

Although the particular route involving the above two propagations can therefore be rejected, this does not necessarily imply that the particular error did not traverse one of the propagations. Let us assume therefore that the diagnosis engine now examines another particular route, still including the first propagation with {$adrs > 8}, but now with a second propagation having the constraint {confprop(system, "on") && ($adrs > 8)}. (In eversholt, confprop returns the value of a configuration variable from the configuration database; in this particular constraint, the variable is named "on", and is a property of the part of the system named "system"). The value taken by this constraint is either TRUE (when the system is switched on) or FALSE (when the system is switched off). Accordingly, when the system is switched on, the constraint on this route evaluates to {$adrs >8}, and any error with a value of the parameter $adrs greater than 8 will propagate along the route. In contrast, if the system is switched off, the constraint {confprop (system, "on") && ($adrs > 8)} will evaluate to FALSE, and so no error will propagate along the route, irrespective of the actual parameter values associated with the particular error.

The evaluation of parametric and configuration constraints on propagation can usefully be transformed into a single challenge. Given an error E hypothesised to have propagated at some time between $T_{E(E)}$ and $T_{L(E)}$, and to meet a known set of parametric constraints, and faced with a new constraint, what are the parametric constraints that would have allowed the error to propagate, and when might it have propagated?

Figure 20B:
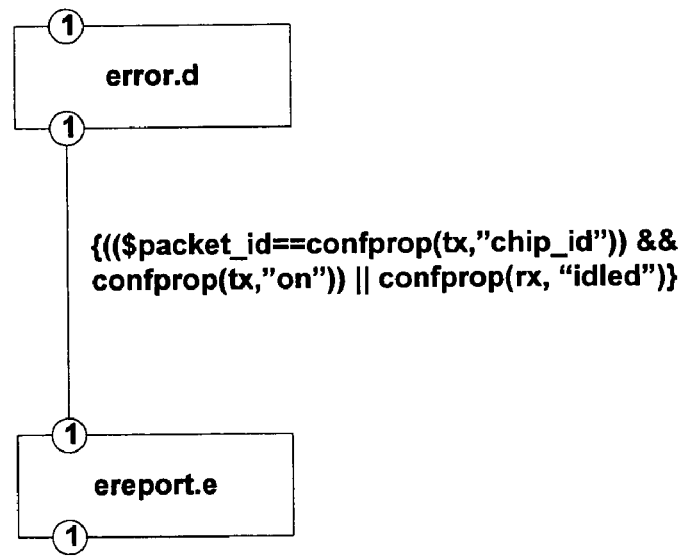
FIG. 20B illustrates a fault tree diagram with a constrained propagation in accordance with one embodiment of the invention.

This approach is illustrated in the fault tree fragment of FIG. 20B (even if the fragment itself is unlikely to be encountered in the fault tree of a practical system). It is assumed that the diagnosis engine climbs up the fault tree, hunting for a problem to add to its suspect list, and has reached error.e. The engine has constructed the hypothesis: "an error was present at error.e at some moment between the times $T_{E(E)}$=17 s and $T_{L(E)}$=99 s, and met the constraint {$adrs == 0x1234}". The engine now has to determine whether this error might have propagated to error.e from error.d. If so, the error must also have met the constraint on the propagation from error.d to error.e (in addition to having met {$adrs == 0x1234}).

The (rather artificial) constraint on the propagation to be evaluated from error.d to error.e is:

{(($packet_id == confprop(tx, "chip_id")) && confprop (tx, "on")) || confprop(rx, "idled")}

This constraint implies that: "an error will only propagate either if the value of the $packet_id parameter of the error is equal to the value of the configuration variable named chip_id of the device tx, in which case the value of the configuration variable on of the device tx must also be TRUE, or if the value of the configuration variable idled of the device rx is TRUE".

In determining this constraint, the diagnosis engine uses the values of the configuration variables for the period of interest. In particular, the configuration database provides historic information on configuration variables, and it is assumed that the values of chip_id and on for the device tx and the value of idled for the device rx are as shown in FIG. 21.

Figure 21:
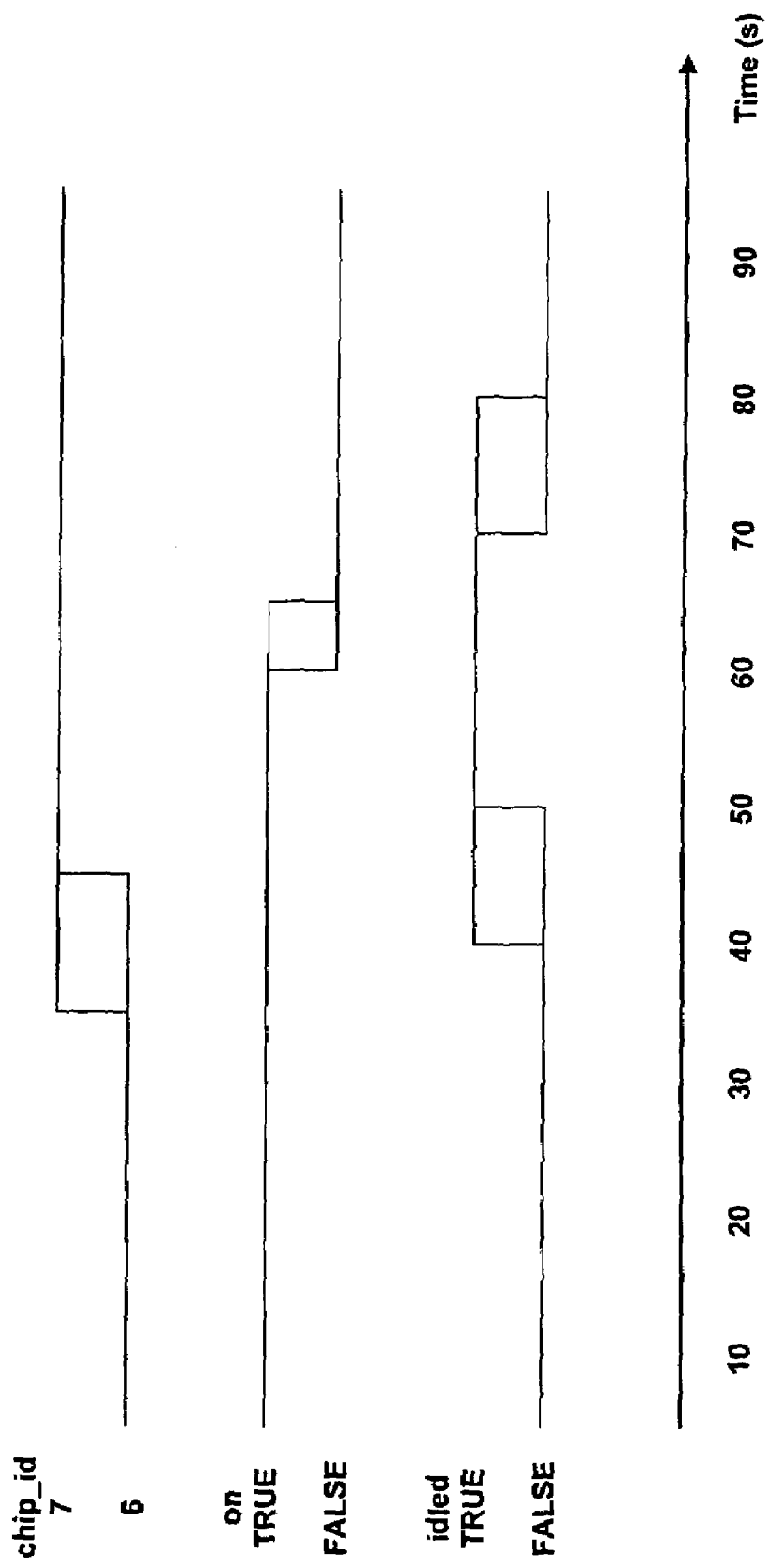
FIG. 21 is a graph illustrating the time history of configuration changes.

FIG. 21 shows that each configuration variable can be restricted to either one value or two values at any given time, depending on whether or not the variable was in the process of being changed by the configuration system. In particular, it is assumed that the configuration manager started changing the value of chip_id from 6 to 7 at 35 s, and this completed at 45 s. While that was going on, the configuration manager started to change idled from FALSE to TRUE at 40 s, which completed at 50 s, and then started to change idled back from TRUE to FALSE at 70 s, which completed at 80 s. Meanwhile, the manager started to change on from TRUE to FALSE at 60 s, and this completed at 65 s.

For a configuration variable whose value is known to be one of two possibilities, the diagnosis engine must make evaluations assuming first one possibility, and then the other possibility. In general, if n configuration variables are in this uncertain state at a given time, there will be $2^n$ different evaluations to be made.

Table 7.1 shows the information returned from the configuration database, rearranged into a single time order. Each change to a configuration variable V is described by the times $T_{ES(V)}$, $T_{LS(V)}$, the earliest and latest times that the variable could have taken on its new value. The set of times for all the changes is arranged into chronological order for the table.

TABLE 7.1

Time Intervals and Values of Configuration Variables

| Time Starting at | Chip_id value | On value | idled value |
|---|---|---|---|
| 17 | 6 | TRUE | FALSE |
| 35 | 6 or 7 | TRUE | FALSE |
| 40 | 6 or 7 | TRUE | TRUE or FALSE |
| 45 | 7 | TRUE | TRUE or FALSE |
| 50 | 7 | TRUE | TRUE |
| 60 | 7 | TRUE or FALSE | TRUE |
| 65 | 7 | FALSE | TRUE |
| 70 | 7 | FALSE | TRUE or FALSE |
| 80 | 7 | FALSE | FALSE |
| 99 | 7 | FALSE | FALSE |

Accordingly, the history of the system can be divided into a set of time intervals during which each of the configuration variables takes a specific form (even if sometimes there is uncertainty represented within that form). The constraint from FIG. 20B is therefore evaluated for each time interval of the table, and Table 7.2 shows the results. Where there are multiple possible values of a variable, multiple evaluations are done, as shown, using all possible combinations of the possible values.

TABLE 7.2

Time Intervals and the Constraint Evaluation

| Time Interval | Chip_id value | on value | Idled value | Evaluation |
|---|---|---|---|---|
| 17–35 | 6 | TRUE | FALSE | {$packet_id == 6} |
| 35–40 | 6 | TRUE | FALSE | {$packet_id == 6} |
| 35–40 | 7 | TRUE | FALSE | {$packet_id == 7} |
| 40–45 | 6 | TRUE | TRUE | {TRUE} |
| 40–45 | 6 | TRUE | FALSE | {$packet_id == 6} |
| 40–45 | 7 | TRUE | TRUE | {TRUE} |
| 40–45 | 7 | TRUE | FALSE | {$packet_id == 7} |
| 45–50 | 7 | TRUE | TRUE | {TRUE} |
| 45–50 | 7 | TRUE | FALSE | {$packet_id == 7} |
| 50–60 | 7 | TRUE | TRUE | {TRUE} |
| 60–65 | 7 | TRUE | TRUE | {TRUE} |
| 60–65 | 7 | FALSE | TRUE | {TRUE} |
| 65–70 | 7 | FALSE | TRUE | {TRUE} |
| 70–80 | 7 | FALSE | TRUE | {TRUE} |
| 70–80 | 7 | FALSE | FALSE | {FALSE} |
| 80–99 | 7 | FALSE | FALSE | {FALSE} |
| 99 | 7 | FALSE | FALSE | {FALSE} |

Each row of Table 7.2 represents a separate opportunity for propagation of an error to have occurred during the defined time period. However, it is not known whether the error did propagate during one of these opportunities, or which particular opportunity for propagation might have been taken, but all are candidates for building a hypothesis that the error did propagate.

In order to minimise further computation, evaluation results from Table 7.2 that are adjacent in time and that have the same value can be merged as a convenience for computation. The effect of this is shown in Table 7.3, each row of which also represents a separate opportunity for propagation of an error. (Note that time intervals for the different opportunities for propagation in Table 7.3 overlap because of the uncertainty in the time that the configuration changes happened).

TABLE 7.3

Consolidated Time Intervals and the Constraint Evaluation

| Time Interval | Evaluation |
| --- | --- |
| 17–45 | {$packet_id == 6} |
| 35–50 | {$packet_id == 7} |
| 40–80 | {TRUE} |
| 70–99 | {FALSE} |

Table 7.3 lists all the constraints that might have applied to the propagation at all possible times (during the period of interest). If an error did propagate from error.d to error.e, the error met at least one of these constraints. The diagnosis engine therefore uses Table 7.3 to drive the diagnosis algorithm. The engine iterates through these opportunities, using each in turn to define the parameters and timing of the error that it is hypothesising to have propagated.

Table 7.4 shows the properties of the errors which, one by one, the diagnosis engine attempts to validate as hypotheses. Wherever the constraint on propagation evaluates to {FALSE}, no propagation is possible, and the engine has disproved the hypothesis it is building. In this case, the engine then retreats and attempts to build another hypothesis.

TABLE 7.4

Errors hypothesised to be present

| TE(D) | TL(D) | Constraint describing the error |
| --- | --- | --- |
| 17 | 45 | {($packet_id == 6) && ($adrs == 0x1234)} |
| 35 | 50 | {($packet_id == 7) && ($adrs == 0x1234)} |
| 40 | 80 | {$adrs == 0x1234} |
| 70 | 99 | {FALSE} |

As the engine examines a sequence of propagations in climbing the tree, the number of different combinations of constraint evaluations that it has to examine may increase. The engine needs to search through all of these combinations to see if any of them leads to a credible hypothesis that a problem did cause an observed report. The engine iterates through the possible evaluations for each propagation, and uses recursion to evaluate the combinations of propagations as it climbs the fault tree. This method of evaluation naturally creates results that represent the most optimistic possible opportunities for propagation. All options are in there somewhere.

When descending the tree and retracing the route of the particular error back to the report, there is no need to re-evaluate the parametric and configuration constraints, because a hypothesis as to the result of that evaluation has already been chosen by the engine in the process of climbing the tree. However, the engine does need to evaluate constraints on other routes for the requirements and inhibitors tests (as described below). The same process of constructing all possible evaluations, with defined time limits, is used, as described above. In particular, all possible evaluations are explored to try to construct a credible hypothesis, which again uses iteration and recursion on these new routes.

Although the above example suggests that a considerable amount of computation including iteration and recursion is used to examine just one route through the fault tree, in practice there are usually rather few configuration constraints on fault trees, and furthermore configuration variables tend not to change very often.

In its analysis and exploration of the fault tree, the diagnosis engine may arrive at an error event already hypothesised to be present, or at a problem, or at a report which has been observed. The engine is following the hypothetical route taken by an error, and has some description of the parameters and timing of the hypothetical error that is propagating. The diagnosis engine then tries to discover if that description matches any available information about the event. If so, the hypothesised event is a credible cause or effect of the propagating error.

Parameter matching may be optimistic or pessimistic. For optimistic matching, where the parameters of the event are described by the constraint {E}, and the parameters of the propagating error are described by the constraint {F}, then a match is declared if there are any values for the parameters that can be chosen such that {E && F} !=FALSE. In this case, the parameters of the error propagated will then be described by the constraint {E && F}.

For pessimistic matching, if an error is encountered at an event already presumed present, then no match is declared if there are any values of any parameters for which {E && F} == FALSE. The pessimistic approach therefore assumes that if there are values that can be chosen such that this relationship holds, then the propagating error had parameters with those values.

If the parameters of an event are described by {TRUE} (the event is unconstrained) and the parameters of the propagating error are also described by {TRUE} (the propagating error is unconstrained), then {F && E} is equal to TRUE no matter how the parameter values fall. In this case, even the pessimistic approach recognises that there is a match, and the parameters of the error propagated will then be described by the constraint {E && F}.

Adopting the optimistic approach, if an event is described as momentarily present, it will match if the limits on the time it was momentarily present overlap in any way the limits on the propagating error:

$$(T_{E(E)} < T_{L(F)}) \ \&\& \ (T_{L(E)} >= T_{E(F)})$$

This pair of limit pairs can be merged to make the timing more precise. For an error presumed continuously present, the timing match criterion is $$(T_{E(F)} <= T_{LF(E)}) \ \&\& \ (T_{L(F)} >= T_{ES(E)})$$

If the propagating error F is required to be continuously present, even the optimistic approach cannot make a match if the event E is only momentarily present. However, if E is indeed continuously present, an optimistic match requires $$(T_{ES(E)} <= T_{LS(F)}) \ \&\& \ (T_{LF(E)} >= T_{EF(F)})$$

Problems that are faults are presumed continuously present for all time after the earliest they might have arisen. Problems that are upsets are presumed to have been only momentarily present, at some time $T_{(P)}$. The limits on $T_{(P)}$ are the limits on the momentary error which the problem is presumed to have created. Problems that are defects are presumed to be present all the time that their FRU has been (or will be) present in the system.

For momentarily present errors, the pessimistic approach implies:

$$(T_{E(E)} >= T_{E(F)}) \;\&\&\; (T_{L(E)} <= T_{L(F)})$$

while for continuously present errors, the pessimistic approach implies:

$$(T_{ES(E)} <= T_{E(F)}) \;\&\&\; (T_{LF(E)} >= T_{L(F)})$$

If the propagating error F has to be continuously present, then it can never match a presumed event which is only momentarily present. If the presumed event is continuously present, then the pessimistic timing match criterion is $$(T_{LS(E)} <= T_{ES(F)}) \;\&\&\; (T_{LF(E)} >= T_{EF(F)})$$

7.6 The Life Cycle of a Report

When a first report arrives at the diagnosis manager, the manager creates an observation for the report. It is important here to differentiate between each instance of a report, since the same report can arrive multiple times, and a separate record, an observation, is kept for each instance. The different instances of a report may have different parameters appended, and are not necessarily all caused by the same problem. An observation therefore represents one instance of a report, together with its attached parameters.

The diagnosis manager initially marks each new observation as UNEXPLAINED. The diagnosis manager then calls the diagnosis engine. At this time, there may be observations of reports which have previously been deduced to be caused by some already-diagnosed real problem, with a suspect list already published. The fault management system will have marked these as CLAIMED when it published the suspect list. There are also any number of UNEXPLAINED observations waiting for explanation.

In one embodiment, the diagnosis manager keeps copies of published suspect lists until the end of the fault management exercise. The arrival, or sometimes the non-arrival, of a new observation can eliminate some problems from these published lists. The diagnosis engine looks at each published diagnosis and checks that each problem in the suspect list can still credibly cause each observation already CLAIMED by the fault management exercise. If this is no longer the case and some problems can be eliminated as suspects, the engine marks these in the list as field acquitted. The diagnosis manager can publish this information, since it may still be in time for some downstream agent (e.g. a human engineer) to make use of it.

The diagnosis engine picks an UNEXPLAINED observation to check. For consistency, the engine is arranged to use the same trigger observation if possible for each diagnosis (e.g. based on time of arrival and/or report name). If this new observation can be caused by all the problems in any existing published suspect list, the engine marks it as CLAIMED by that fault management exercise. This can require multiple CLAIMED markings (i.e. one for each fault management exercise that the observation could belong to).

The diagnosis engine goes on picking UNEXPLAINED observations to check. (Again, for consistency, the order of picking observations can be set by some predetermined condition(s)). If the diagnosis engine finds that an observation cannot be caused by any existing problem, it uses this as the trigger observation for a new diagnosis. It creates a new suspect list with the problems that can credibly cause the trigger observation. The engine counts up how many of the UNEXPLAINED observations that each problem, in the suspect list for the trigger observation, can explain. It finds the problem which explains the trigger observation and also explains the largest number of UNEXPLAINED observations. All problems in the suspect list that can explain all these observations are retained. All other problems are discarded from the list. The engine marks all observations that can be explained by all problems in the suspect list as EXPLAINED, with a reference to the suspect list. Again, this can require multiple markings. However, if there are any UNEXPLAINED observations left, it means that there are at least two problems present and being diagnosed simultaneously. Accordingly, the engine repeats the operations just described, creating as many suspect lists as needed to explain all observations, with the process repeating until no UNEXPLAINED observations remain. The diagnosis engine now has one suspect list for each real problem it believes is present.

The above approach is pragmatic, in that it will always succeed if there is one problem to be diagnosed at any given time, but may not always be correct if there is more than one problem. The approach tries to minimise the number of suspect lists published, but there is always the possibility that two (or more) different problems might be masquerading as a single problem. If multiple problems do appear at once, and those multiple problems can create the same reports, then the diagnosis may not be able to identify them separately. Which observation is used as the trigger observation can change the answer in this case. One possibility would be to repeat the analysis using each observation present as an initial trigger, creating a set of suspect lists each time. In this case the output would be alternative possible sets of suspect lists. However, in one embodiment, it is regarded as easier to take subsequent action based upon just a single set of suspect lists, even with the knowledge that this set may (occasionally) be incorrect.

The diagnosis engine returns its set of suspect lists to the diagnosis manager. Along with each list goes a timeout, the shortest maximum delay to any report that might differentiate between the problems in the list, and also requests to run pollers for any propagations that might help with further diagnosis. The manager examines each suspect list and decides to publish it, or to wait for more information, and may also request the pollers to run. This decision is made independently for each suspect list.

If a suspect list is published, it implies the existence of precisely one real problem, and one fault management exercise to handle it. Publication of a suspect list signals that a fault management exercise is in progress, and creates the fault management exercise ID. In addition, publication of a suspect list causes the diagnosis manager to mark each observation explained by the problems in the list as CLAIMED by that fault management exercise. Any suspect list published causes any observation which can be caused by all problems in the list to be marked as CLAIMED by the fault management list for that observation. Note that a single observation can therefore be CLAIMED by multiple fault management exercises, if multiple real problems are present with overlapping fault trees. The observation marking persists until the end of the fault management exercise. At that time, the manager marks the observation EXPIRED.

It is the observations which are CLAIMED by a fault management exercise that define which error detectors to re-enable at the end of the fault management exercise. Thus when a report is made, there is an assumption that the error detector producing that report becomes disabled. If the error handler associated with the detector has already re-enabled the detector, it tags the report with a note of the re-enable time. Associated with each observation of a report is the later re-enable time—if the time is missing, the detector is presumed disabled. An error handler can autonomously re-enable detectors at any time, but, if it does, it must tell the diagnosis manager. The diagnosis manager then finds the relevant observation from that detector with no re-enable time and inserts an appropriate re-enable time. This is also done when error handlers re-enable detectors at the end of a fault management exercise, when commanded to do so by the diagnosis manager.

Tracking of detector enabling and disabling allows the diagnosis engine to see whether a required report might have been missed while a detector was turned off. This is especially important when multiple real problems are present that can cause the same reports, since without knowing when a report might have been missed, the diagnosis engine might wrongly discard a problem as impossible, and produce an incorrect diagnosis (or fail to provide a diagnosis at all).

This is also assisted by keeping EXPIRED observations after a fault management exercise has ended. The expired observations contain information about recent detector disabling, and a new problem might be just about to come to light. Diagnosis of the new problem might need that old information.

In one embodiment EXPIRED observations are discarded after a reasonable fixed time. A more accurate discard time might be determined from detailed examination of the fault tree, e.g. by ascertaining when any problem that could potentially have produced an error detectable by an error detector (except that the detector was disabled) would necessarily have led to some other report that has not in fact been received. However, this more complicated approach may not offer significant benefits over the simple use of a fixed discard time.

Note that the above approach avoids having to allocate an observation to a fault management exercise when the observation first arrives. The decision of which fault management exercise claims which observation is only made when a suspect list is published, thereby supporting the simultaneous diagnosis of multiple problems. Before a diagnosis is published, the number of suspect lists and the set of observations EXPLAINED by each list can change from call to call of the diagnosis engine. After a diagnosis is published, the observations CLAIMED by that suspect list can only increase, and the problems in that list can only decrease.

Figure 22A:
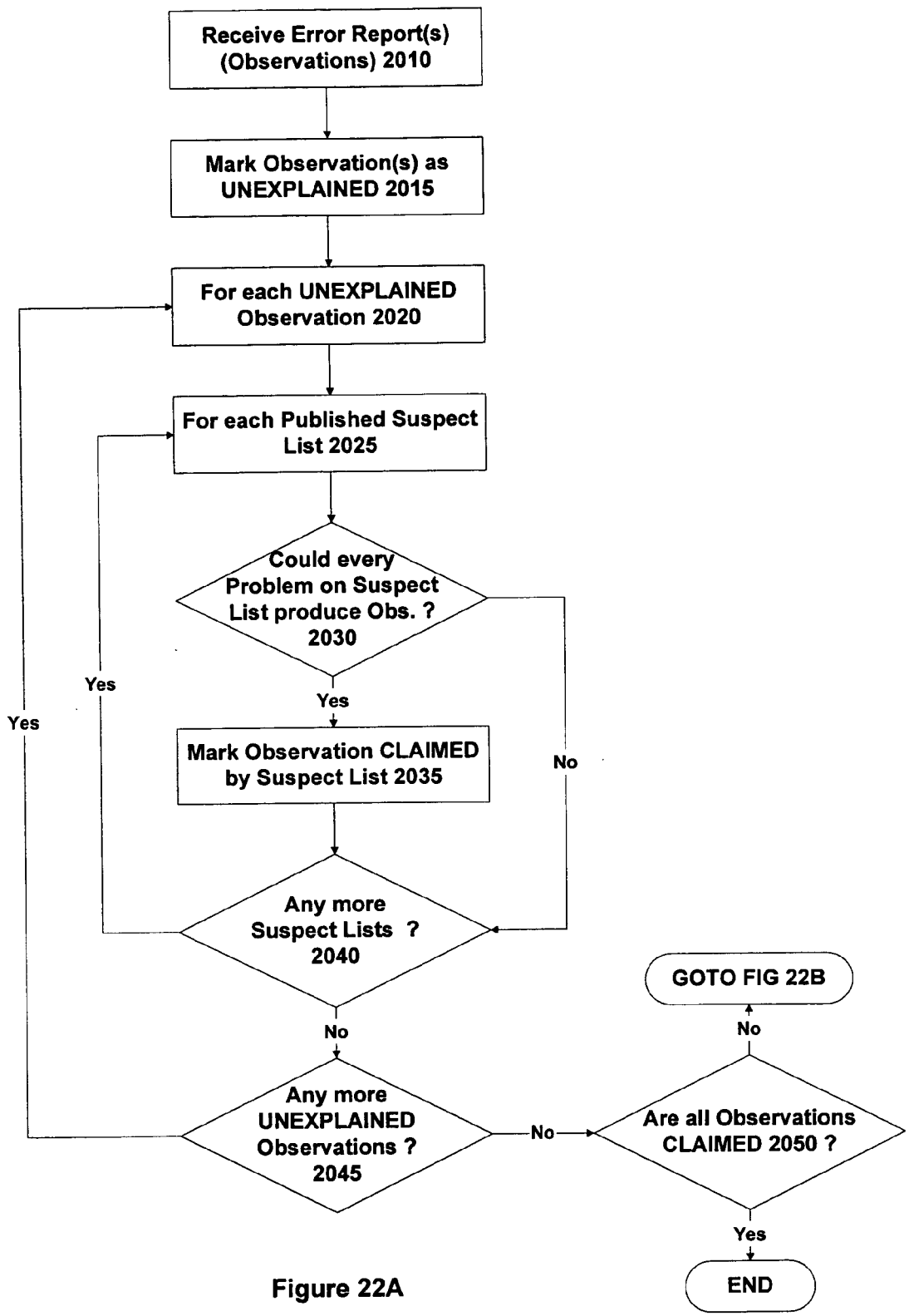
FIGS. 22A and 22B are diagrams showing the allocation of observations to a fault management exercise.
Figure 22B:
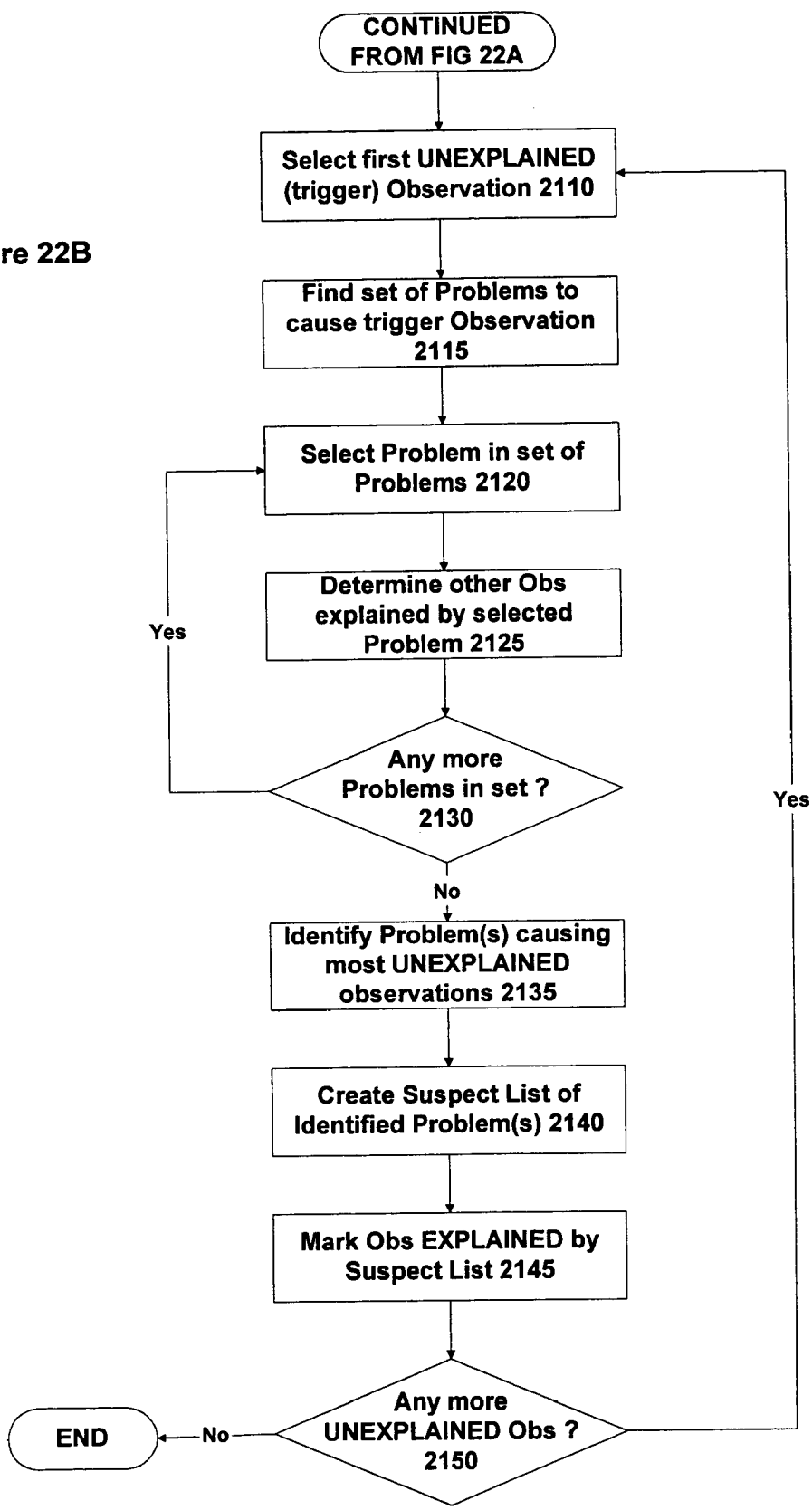

FIGS. 22A and 22B provide flowcharts depicting the handling of observations and their allocation to a fault management exercise in accordance with one embodiment of the invention. Processing starts in FIG. 22A with the receipt of one or more error reports (i.e. observations) (2010), which are all initially marked as UNEXPLAINED. The remaining processing of FIG. 22A then investigates whether these observations can be assigned to any existing fault management exercise (as defined by its published suspect list), since if so, their appearance is not considered to indicate the presence of any new (i.e. previously unrecognized) problem in the system.

As shown in FIG. 22A, processing enters two loops to look at each UNEXPLAINED observation (2020) in conjunction with each published suspect list (2025). A test is performed to determine whether each problem on a suspect list could produce the observation in question (2030). This test can be performed by using the credible router described below, and setting the number of new problems to zero. If the test of operation 2030 is positive, the observation is marked as CLAIMED by that suspect list (2035). Note that the observation is still tested against the remaining suspect lists, so it is possible for the same observation to be marked as CLAIMED by multiple different fault management exercises. (The error detector that produced the observation will then be re-enabled by the first of these multiple fault management exercises to conclude).

Once an UNEXPLAINED observation has been tested against each published suspect list (2040), and each UNEXPLAINED observation has been tested in this manner (2045), it is now investigated whether all the observations (out of those received at operation 2010) have now been marked as CLAIMED by at least one existing fault management exercise (2050). If so, all of the observations can be attributed to existing problems (as defined by existing suspect lists), and so no further diagnosis is required.

On the other hand, if any newly received observation is not marked as CLAIMED by at least one existing fault management exercise, then this indicates that some hitherto unrecognized problem is present in the system. We therefore now proceed to the flowchart of FIG. 22B, and select an UNEXPLAINED observation (2110), which is hereafter termed the trigger observation. As previously mentioned, if there are multiple UNEXPLAINED observations, it can be helpful to select the trigger observation on some objection basis—e.g. as having the earliest possible time.

The set of individual problems is now determined that could potentially have caused the trigger observation (2115). This test can again be performed by calling the credible router, this time setting the maximum number of new problems to one. We now enter a loop that selects each problem in turn (2120) from the set of problems that could have caused the trigger observation, and determines what other observations (whether UNEXPLAINED or EXPLAINED) could be explained by the selected problem (2125). Again, this investigation can be performed using the credible router.

When all the problems that could have caused the trigger observation have been investigated in this manner (2130), the problem that could have caused the largest number of the UNEXPLAINED observations is determined (2135). A suspect list is then created containing this problem (2140), as well as any other problems (from the set of problems determined as operation 2115) that could have caused the same UNEXPLAINED observations. Each problem in the suspect list could therefore have caused the same set of UNEXPLAINED observations.

The observations that could have been caused by any of the problems on this suspect list are marked as EXPLAINED by this particular suspect list (2145). The observations that may be marked in this manner include not only UNEXPLAINED observations, but also observations that are already marked as EXPLAINED by a previous suspect list. This previous suspect list cannot yet have been published, since otherwise the observations would be marked as CLAIMED instead of as EXPLAINED. Accordingly, it is possible for an observation to be marked as EXPLAINED by multiple different suspect lists.

A test is now performed to whether there are any remaining UNEXPLAINED observations (2150). If so, processing loops back to operation 2110, and a new trigger operation is selected out of the remaining UNEXPLAINED observations. On other hand, if there are no longer any UNEXPLAINED observations, then processing can conclude.

Returning to a consideration of operation 2115, it is possible that no problems are identified that might have caused the trigger operation. In this case it is necessary to re-run the credible router but allowing for the presence of two new problems. This can then identify possible pairs of problems to put on the suspect list.

(If this does not allow the trigger observation to be explained, then in principle the credible router could be run again allowing three or more new problems. However, in practice the results may not be reliable, and such circumstances may indicate instead some difficulty with the fault tree representation or diagnosis algorithm).

7.7 The Diagnosis Engine

When the diagnosis manager calls the diagnosis engine, there can be zero, one or more observations present that the engine has never seen before. The engine uses one observation as the trigger observation for diagnosis of each real problem. If there are any suspect lists already published, for which the fault management exercise has not yet ended, the engine first tries to explain a new observation as a consequence of one of the existing problems. The engine uses (and reuses) a procedure termed the "credible router" to establish whether it is credible that an error propagated from one event and arrived at the cause bubble of another, potentially far away in the tree. This procedure can called with a preference, YES or NO, which determines the exact format of the question asked of the router:

(Preference=YES)—"is it credible that such an error propagated ?"; or (Preference=NO)—"is it credible that no such error propagated ?".

This preference is then used to determine whether an optimistic or pessimistic approach is used for the constraint evaluations.

To discover the cause of an observation, the initial call to the procedure has preference = YES, to find all the possible causes. The engine transforms any additional properties specified in the observation to constraints, as defined in the declaration of the report, and uses these as an initial description of the error that propagated to cause the observation, along with the arrival time limits.

Another input to the credible router is the number of new problems permitted in the search for a cause of an observation. If the number of new problems is 0, the credible router only returns routes from the problems already presumed to exist. If the number of new problems is 1, the credible router can return a route requiring one new problem to be present (this is the normal case when building a new suspect list). If the number of new problems is 2, the credible router can return a route which requires two previously unsuspected problems to be present (this copes with most latent faults, where a second fault causes reports that one fault alone cannot explain).

The credible router is called first with this parameter set to 0, to try to explain the observations as due to existing problems from published suspect lists. If this approach fails to explain all of the observations, the credible router is called again with the number of new problems set to 1, to try to explain the observations as due to one new problem. Finally, if there are still unexplained observations, the credible router is called with number of new problems set to 2.

7.7.1 Ascending the Fault Tree

The diagnosis engine climbs the fault tree from the report corresponding to the trigger observation by recursing up the propagations between events, and iterating through the propagations to the cause bubble of each event. This finds all the routes through the tree from each problem that can cause the observation. Note that this initial stage is performed as a quick approximation, in that no detailed checks are done at each event, and it may later turn out that the route is not credible. All constraint evaluations are performed according to the preference specified at entry into the credible router.

Any parametric constraint is passed in as an initial description of the error hypothesised to have propagated. If the error is unconstrained from the observation, the initial description is {TRUE}. The hypothesis is that some error was created by a problem and propagated through various events to cause a report. As the engine climbs the tree, it may pick up further parametric constraints as an additional description of this particular error, and drops them if it has to retreat. At any point on the tree, the full description of the error being hypothesised to have propagated is the logical AND of all the constraints extracted from the original observation, AND all the picked-up parametric constraints currently being held from climbing the tree. The engine uses the optimistic evaluation specified above to determine whether a propagation could possibly have occurred.

When the engine climbs up a propagation to a causal event, it computes the limiting times for the presence at that event of the particular error hypothesised to have caused the observation. It uses the limiting times it already knows, originally from the limiting times of the observation, and the limiting propagation delays or poller run-times for that propagation. (For a polled propagation, it may well be that the poller did not run at the right time to enable the propagation, in which case the propagation can be immediately discounted and the engine must retreat). The times of the hypothetical causal and caused events allow the configuration constraints on the propagation to be requested from the configuration database.

The above approach for constraint evaluation is used to define any number of "opportunities for propagation", each characterised by a parametric constraint and a pair of limiting times. Each opportunity for propagation is investigated independently by the credible router.

If timing, configuration and parametric constraints could have allowed the particular error to propagate, the engine recurses up to the causal event and repeats the whole process, using its new estimate for the earliest and latest times that an error might have been present at the event. If the engine has to retreat, it iterates to the next opportunity to propagate for the propagation under investigation, and when these run out, the next propagation into the cause bubble of the causal event. If the credible router runs out of propagations, the engine pops a recursion level back to another event, dropping any parametric constraints that it picked up on the way. When the credible router tries to do this from the event representing the observation that it is examining, the engine has explored all possible routes from the observation to all possible causal problems.

If the engine reaches a problem in this climb, it has constructed a hypothesis that that problem was the cause of the observation, and that an error described by the whole collection of picked-up parameters propagated from the problem to the report along the particular route that the engine has just climbed. If the engine reaches a new problem, the total number of new problems in the hypothesis must meet the initial new-problem limit, or the hypothesis must be discarded and the engine must retreat. The initial time limits for this particular error at each event on the route are the ones computed on the way up.

7.7.2 Descending the Fault Tree

The hypothesis created in climbing the fault tree is that an error was initiated by the problem. The error was described by all the parametric constraints picked up on the climb, and was created at some moment between the time limits computed during the climb.

While climbing up through each event, the engine computed time limits for the presence of the error, derived from the time of the original observation, the timing constraints on propagations, and the times of any relevant configuration changes. Climbing back down the particular route, two pairs of time limits are available when the engine reaches each cause bubble, namely the pair of limits computed for the presence of an error at the event while climbing up, and the pair of limits computed for the presence of the error climbing down. If an error did propagate as hypothesised, then it must have done so at some time which was within both of these pairs of limits. This can be verified by merging the limits as described above. If the resultant interval has zero or negative size (the latest time for propagation is earlier than the earliest time), the hypothesis is disproved, and the engine must retreat. However, if the duration of the possible window is still positive, then this merged limit is used as the basis for further computation descending the tree.

Climbing up through each event, the engine collected all the parametric and configuration constraints along the route as a description of the particular error. When it reaches the top of the climb, the diagnosis engine has the best description that it is going to get, so that this description is then reused throughout the descent. The earlier descriptions obtained for the error present at each event on the climb (i.e. before the problem was reached in the climb) are superseded by this more complete description. There is no need to evaluate configuration and parametric constraints on the way down along the particular route, since the engine has already discovered an error that could have met all the constraints.

7.7.3 The Events Tests

There are three event tests that are used when descending the tree. Thus the propagation of an error by an event is defined by the cause, inhibit and effect bubbles, and each of these types of bubbles allows a different test to be applied. Each test checks whether the hypothesis that an error has been present at an event is consistent with the observations. All the tests on all the bubbles attached to an event must conclude that the hypothesis that the error was present is credible. If the test on any bubble concludes that the error could not have propagated in this manner, the hypothesis is disproved. The three event tests are the causes test, the inhibitors test and the requirements test.

The three event tests can be executed with a preference, which biasses the preference used for the credible router at the cause and inhibit bubbles. Thus setting preference = yes means that it is advantageous if the presence of an error at the event is credible, while setting preference = no means that it is advantageous if the absence of an event is credible.

The event tests are performed with the presumption that certain other events are, or may be, already present. These events are:
- all unacquitted problems in any published suspect list of an ongoing fault management exercise.
- all problems in any suspect list already created and finalised by the diagnosis engine in this visit (in the case of simultaneous diagnosis of multiple problems).
- the hypothetical problem at the top of the problem-to-effect chain being tested.
- any error already tested and found credible in the problem-to-effect chain being tested, with all the parameters and timing collected in the climb up from effect to problem.
- any event already tested and found credible as a consequence of passing any test in the problem-to-effect chain being tested, with all the parameters and timing collected in the climb up from effect to problem.

As the diagnosis engine advances down through the tree, it adds events in these last two classes to the list of hypothetically-present events presumed to be present in future events tests, as it tests and comes to rely on the presence of each new event. In contrast, if the diagnosis engine retreats and no longer relies upon the presence of an event, it subtracts the event from this list.

It is not presumed that any problems already added to the suspect list currently being created by the diagnosis engine (or the effects of such problems) are present. These problems are different hypotheses from the one being tested. If the hypothesis being tested is the cause of the observations, then the different hypotheses are not. The events tests use optimistic or pessimistic evaluation, whichever is most likely to result in demonstrating that the hypothesis (i.e. that the problem is present) is credible. This is needed to ensure that any problem that might conceivably be the cause of the observed reports is indeed added to the resultant suspect list.

The Causes Test:—the optimistic causes test asks: "is it credible that enough errors to cause this event, from any of the events presumed present, propagated to the cause bubble?", where "enough errors" is defined by the value of K in the cause bubble. When descending the tree on the particular route (i.e. the route that was climbed up), if K is 1, then no causes test is needed. Thus in this situation, the descent is following the particular route of an error hypothesised to have propagated to cause the event, and if only one error is needed to cause the event, then just reaching the event in the descent is proof that "enough errors" propagated. However, if K is greater than 1, then the causes test is required to prove that enough errors did propagate to the cause bubble.

The causes test reuses the credible routing program, with preference = YES, in order to find all the errors that might propagate to the bubble. It tries each propagation to the cause bubble in turn until it has counted up enough credible errors to cause the event. The start event list for the credible router is the list of problems and hypothetical errors, as defined above. The ending propagation is the one coming into the cause bubble being checked.

The constraints describing extra errors (beyond K=1) for the causes test are complex, in that multiple errors arriving at a cause bubble do not need to have the same parameters. One pragmatic approach is to set the initial parametric constraints of all but the first K=1 error at the cause bubble to be {TRUE}, meaning that there are no constraints on their parameters.

For K>1, enough errors must arrive at the cause bubble at the same time. Time limits have already been computed for the presence of an error at the event, using both the limits collected on the ascent and on the descent. For K>1, another error must have arrived within these same limits. Having climbed up and down looking for a second error, new limits become available for the time of this second error. If these do not overlap the first limits, then this second hypothetical error cannot have been the needed cause, and the search must then continue. On the other hand, if the limits do overlap, they can be used to form a yet more precise pair of limits for the presence of the error at the current event.

All the errors that arrive at a K>1 cause bubble, at the same time, arrive on different propagations. Starting at the effect event, the credible routing program climbs up the tree quickly, checking propagation times and constraints, but not running the three tests on each event. When, in this climb, it discovers an event which is in the list of presumed-present events, and the timing and parameters of the error at that event allow the event to propagate an error with the timing and parameters required, then it proceeds to climb down this route again, applying the three tests to every event on the chain down to the event before the effect event, until it either has to abandon the hypothesis or it reaches the event being tested. Finding no compatible time interval according the constraint evaluation methods described above implies that the propagation could not have happened, and it is time to retreat. The errors that pass the three tests are added to the list of presumed events. Not only the name of the event, but also the timing and the collected error description are specified in the list, for later comparison. Multiple entries on the list for a single event imply that multiple errors propagated through that event, which is quite feasible. If, in the process of recursion, the diagnosis engine retreats from the hypothesis that an event was present, then that event is removed from the list.

In climbing the tree during the causes (or inhibitors) test, the engine may come to an event, a problem or error, already presumed present. If the parameters and timing of an error present at an event match the description of the hypothetical error the route of which the engine is tracing, then there is be no need for the engine to go further.

As a consequence of following a chain of inhibitors (as described below), it can be necessary to ask, "Is it credible that no propagation occurred to this cause bubble?" The credible router is called with preference = no to try to prove that this is credible. For this task, the router then uses pessimistic evaluation of propagation constraints, and only if a propagation must have occurred does it return a negative response.

The Inhibitors Test:—the pessimistic inhibitors test asks, "Is it credible that not enough errors propagated, from events presumed present, to this inhibit bubble to inhibit this event?", where "enough errors" is defined by the value of K in the inhibit bubble. The inhibitors test reuses the credible routing program, with preference = no to demonstrate that is credible that errors might not propagate to the bubble. It tries each propagation to the inhibit bubble in turn until not enough propagations are left to inhibit the event.

As before, the initial call to the credible routing program specifies the list of already-presumed events, the propagation to the bubble to be checked, and the time limits required for the propagating error to the inhibit bubble. The preference = no option indicates that the error must propagate to the inhibit bubble throughout the specified time, otherwise it is possible that the event could have been caused. The time limits for use in the inhibitors test are those found for the event while climbing the tree, modified if appropriate by constraints from the climb down in the causes test. No initial parametric constraints are specified for the errors propagating to the inhibit bubble.

The credible routing program takes its usual course as previously described. It does a fast climb up to find any event on the already-presumed list, checks that the time limits and parameters for the already-presumed event allow it to propagate the correct error, and then descends, doing the three event checks on each event on the route climbed, back to the propagation to the inhibit bubble. It keeps searching until it can find no more already-presumed events to check. Any event tested as being credibly present is added to the already-presumed list. If the diagnosis engine has to retreat and no longer hypothesise that an event is present, it removes the event from the list.

The preference = no option has an effect on the subsequent event testing. The engine prefers that the answer is "no" for the causes test on any event on the chain from a presumed event to the tested inhibit bubble. That means that it would also prefer the answer to the inhibitors test on any of these events to be "yes", because it would prefer to see then inhibited. The effect of this is to invert the preference for the test for the presence of an event when running the inhibitors test—if the preference for the event test is "no", then the preference for the inhibitors test is "yes, while if the preference for the event test is "yes", then the preference for the inhibitors test is no When the preference for a propagation test is "no", the credible routing program assumes that any propagation that only may occur, as opposed to must, does not, in fact, occur.

Because of the preference inversion described above, the inhibitors test sometimes needs to ask: "is it credible that a propagation might have occurred to this inhibit bubble?" The credible routing program is called with preference =yes to determine this (this can be regarded as an optimistic version of the inhibitors test).

The matching of sought errors against presumed-present events for the inhibitors test is the same as that described for the causes test above.

The Requirements Test:—the requirements test for an event is run on each of its effect bubbles and asks: "is it credible that enough errors from this effect bubble have, in fact, propagated, assuming that this event was present?", where "enough errors" is defined by the value of N in each bubble. The test must pass for every effect bubble if the hypothesis, that an error was present at the event, is to be credible. The initial specifications for the requirements test are the constraints describing the error presumed to be present at the tested event, including the timing limits.

The requirements test iterates through each effect bubble, and iterates through each propagation from each effect bubble. At each bubble, it is trying to count up enough errors that could propagate to reach the N value. As soon as it has reached the N specified for the bubble, it can move on to the next. Any bubble with N=0 automatically passes the requirements test.

Constraints on propagations from the effect bubbles are evaluated pessimistically. It is not a requirement that an error did propagate if circumstances can conspire to prevent it happening. If an error might not have completed propagating yet because of a timing constraint, it is thought credible and counting towards N, but the event at the far end is not tested.

If the propagation of an error is a requirement, then the diagnosis engine calls for the event tests on the event at the far end of the propagation. The preference is set to NO in order to answer the question: is it credible that an error was present at this event?". This determines whether the error could have propagated without further consequence, and can thus be counted up towards meeting N. The event tests may result in recursion, a requirements test on the effect bubbles of the tested event. If, in this recursion, the requirements test reaches an event which is a report, the requirements test looks for observations of that report, instead of looking for required propagations. Causes and inhibitors tests are still run as usual. If the report has been observed with matching parametric constraints and timing, then the event is present. If the error detector for the event has been disabled at any time when the error might have propagated to it, then it is again credible that the error did propagate. Only if the detector was enabled throughout the time the error had to propagate, and has produced no report, is the propagation of the error disproved.

The requirements test can find a match against any event already presumed present, or any observation of a report demonstrably present. The method for matching is identical to that described in the causes test above.

In descending the tree looking for requirements of events, the engine takes note of whether errors are hypothetically present momentarily or continuously. The feedback loop propagation around an error can make it a requirement that it is continuously present (i.e. a stored error). As described above, the "continuously present" property of an error can be propagated from one event to another, descending the tree. The events test takes note of this and adjusts the test accordingly. An error stored at an event with a may propagation for its feedback loop is not considered to be required to be continuously present.

If an error is required to be continuously present when it arrives at the cause bubble of a report, then the method of matching the error with an observation of the report changes. The continuously present error E will be described by the usual four times, $T_{ES(E)}$, $T_{LS(E)}$, $T_{EF(E)}$, $T_{LF(E)}$. A detector R which is continuously enabled must have produced a report at time $T_{(R)}$, and the observation will give limits on $T_{(R)}$ $$T_{E(R)} <= T_{(R)} <= T_{L(R)}$$

The detector should have detected the error at latest by $T_{LS(R)}$, so the match criterion has to be:

$$(T_{E(R)} <= T_{LS(E)}) \&\& (T_{L(R)} >= T_{LS(E)})$$

If the detector was disabled at the time that the error began to be continuously present, then its disable status can be described by four times $T_{ES(R)}$, $T_{LS(R)}$, $T_{EF(R)}$, $T_{LF(R)}$. These describe the start and finish times of a period when the detector was disabled. It is reasonable that the detector saw no error if:

$$(T_{ES(R)} <= T_{LS(E)}) \&\& (T_{LF(R)} >= T_{EF(E)})$$

7.7.4 Multiple Problems

Sometimes it is necessary to hypothesise that two new problems, previously unsuspected, have become present simultaneously in order to create a report. This commonly occurs when one problem is a latent fault. In order for the engine to explain a report so produced, the credible routing program can be called with the number of allowed new problems set to 2. The quick search up will discover one of the necessary problems. Then at some point in the climb down the particular route, there will usually be a cause bubble with K=2 present. The causes test at this bubble has to find another credible route, and will find one from the other problem.

Another opportunity to make use of this occurs with false negative reports—i.e. where it is assumed that a report that should have been observed was not, due to some problem in the system. If no credible explanation can be found for a report, it may be that some other report, a requirement, has not been seen because of a false negative problem at the relevant detector. The requirements test can "use up" an extra spare problem by hypothesising that a previously-unsuspected false negative problem has prevented the other report from being observed. However, this approach has to be used with care, since the report that initiated the diagnosis could also be a false positive—i.e. where it is assumed that a report was observed despite the absence of an error, for example because of a problem at the error detector. A priori, there is no good reason to assume that a false negative problem is any more likely than a false positive problem.

7.7.5 Further Processing

The diagnosis engine discovers all the credible causes of the trigger report. To determine how many real problems exist, it is determined how many unclaimed observations of reports each credible cause can explain. Once a new problem has been discovered as a credible cause for a trigger observation, the diagnosis engine sees what other observations that problem might explain. As an optimisation, the engine starts from the new problem, and quickly climbs downwards to reach all the reports that it can. All constraint evaluations are optimistic, and event tests are not performed. Along each route, the engine collects parametric constraints and timing information that describe all the errors that can propagate along the route. If, on reaching a report, the engine finds that the report does not match (even on an optimistic basis) the parameters and timing of an observation, then it can be determined that an error taking that route did not cause that observation.

However, if a match is possible, the engine uses the credible router program to try to find a credible route back to the problem first thought of. As an optimisation, the credible route program can omit the search of routes back to the problem, because the timing and parametric constraints of the hypothetical error have already been discovered. The diagnosis engine can then start again from the problem, following the particular route established, and perform the full events tests at each stage. If the diagnosis engine credibly reaches the observation again, and the parameters and timing still match, then the problem can be considered to explain the observation.

This procedure of finding all the observations that the problem can explain is carried out for all the problems that can explain the trigger observation. The engine picks the hypothesis that explains the largest number of unclaimed observations. More particularly, the engine finds all the problems that can credibly explain the trigger observation and also explain all the other observations that this highest-count problem explains. All these problems are added to the suspect list for the real problem, while the remaining problems are discarded. If the credible router has had to hypothesise that two new real problems are present, then this stage discovers which two problems explain most observations, and creates two suspect lists accordingly. The problems on the new suspect list or lists are committed to the presumed-present list for future work in this visit to the diagnosis engine. All the observations that the highest-count problem can explain are marked as EXPLAINED in the new suspect list.

Figure 23:
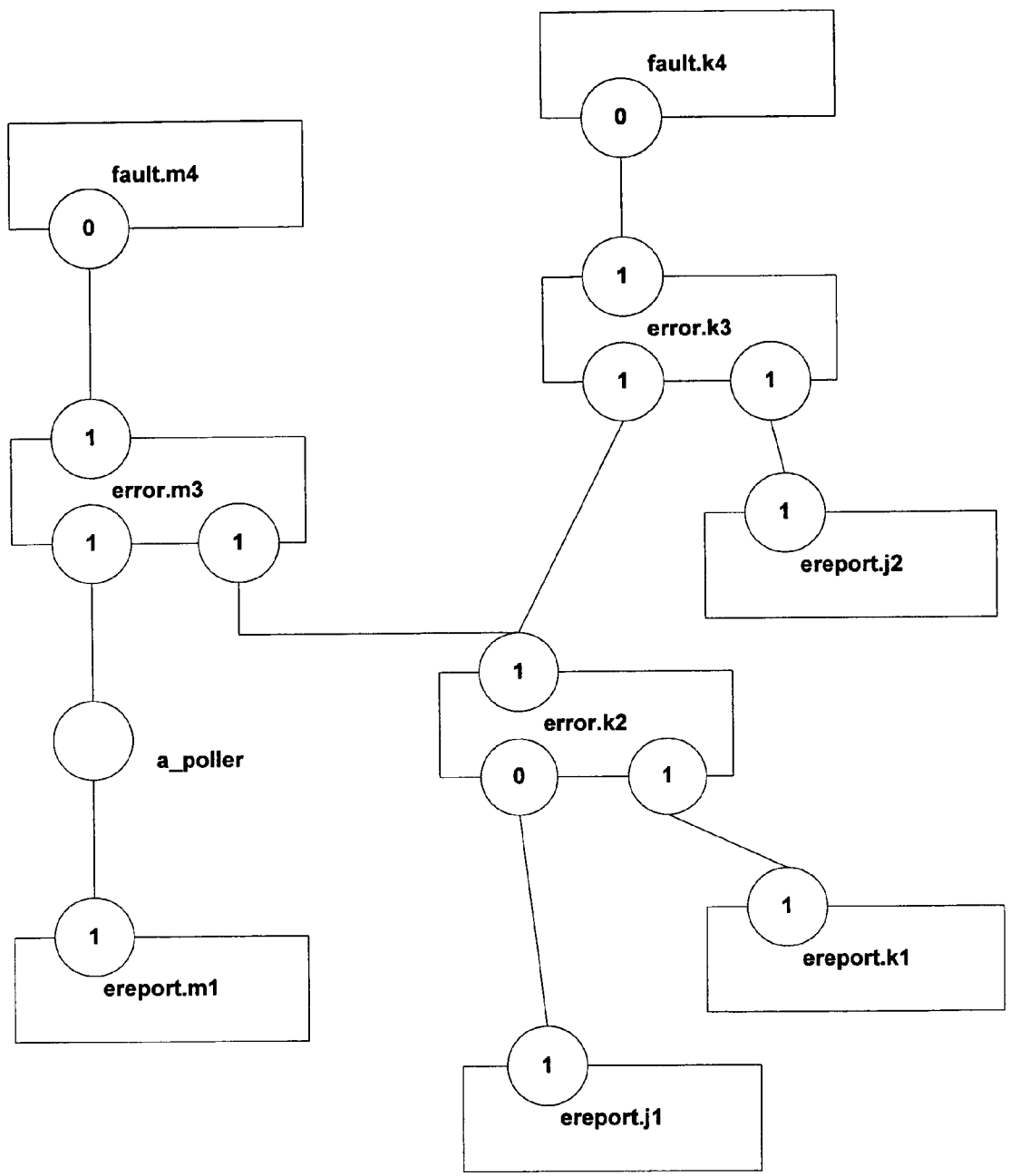
FIG. 23 is a fault tree diagram incorporating a polled propagation in accordance with one embodiment of the invention.

When there are multiple problems on a suspect list, waiting longer or running a poller might help to eliminate some. The diagnosis engine has to work out how long to wait, and what pollers to run. FIG. 23 illustrates a situation where a trigger observation is ereport.k1, and no other observation has been seen. The suspect list contains fault.k4 and fault.m4. The diagnosis engine examines the possibilities for each suspected problem in turn. Proving that each suspected problem was a credible cause of each observation explained by the suspect list leaves a trail of presumed-present events. Each of these describes an error presumed present at an event with a collection of parametric constraints and some time limits.

Each of the events that is presumed to be present is examined with the requirements test to see if it is required, at some time in the future, to propagate to a report. This is a simple extension of the requirements test, and the work can be done at the same time as running the requirements test on the events earlier. The extension requires that, instead of abandoning the search for requirements if errors are still propagating, the test assumes that the error will eventually propagate, and continues searching down the tree. If a report turns out to be an eventual requirement, the engine examines the observations of that report (if any) to see if the detector for that report is enabled and hence is able to determine if the requirement has not yet been met. If both of these conditions are true, then a "must-become-present" note is created to represent this future event, with parameters and timing described by the constraints collected on the particular route from problem to report. These notes are collected in a list of must-become-present events for the suspected problem.

Similarly, the engine builds a may-become-present event list for the hypothetical problem. The may-become-present list can be found as a side-effect of the search for observations that the problem might explain, as performed earlier. The list contains notes for each report that may be created by the problem, that has not yet been observed, and for which the detector is enabled.

The engine also looks for polled propagations that might help with the diagnosis. Thus while searching for observations that the problem might explain for the may-become-present list, the engine cut short its search at any poller that had not run. Now that search is extended, and the diagnosis engine makes the assumption that any poller might be run in the future. Accordingly, the diagnosis engine sees whether enabling a propagation can cause any observations of a report for which the error detector is currently enabled. This may require the use of multiple pollers in a chain.

If any such observations are found, a description of the possible observations is added to a useful-to-poll list. Instead of a time limit, this description specifies the topmost poller in the chain, in terms of the poller name, the polled propagation, and the description of the error to be enabled to propagate. It is not useful at this stage to list any poller other than the topmost in a chain, since running any later poller will have to wait until the topmost poller has run.

At the end of this analysis, the engine has a must-become-present list, a may-become-present list, and a useful-to-poll list of observations, in which each observation is described by time limits or poller, plus a collection of parameters. These three observation lists are created separately for each problem on the suspect list.

The engine then takes each entry in each observation list for the first problem on the suspect list, and sees if the same entry exists in the same observation list for every problem on the suspect list. If the same entry exists for every problem, even if the observation arrives, then it would not assist the diagnosis, so it is discarded.

Separate must-become-present and may-become-present lists are used. This is because the same observation could be on the must list for one problem, and the may list for another problem, which makes it useful to wait to see if that observation does (or does not) appear.

The diagnosis engine therefore produces a list of observations that might help to differentiate the problems on the suspect list. For observations not needing a poller, it finds the observation R for which the $T_{L(R)}$ is the minimum. This is the earliest time that the suspect list must change if nothing at all happens. This time is picked as the timeout for the suspect list. Only if no must- or may-become-present observations remain is the timeout omitted.

For the observations needing pollers, the diagnosis engine lists the polled propagation and the description of the error to be enabled to propagate. Running any of these pollers could help eliminate a suspected problem from the suspect list.

The overall description of this one real problem is now complete, for this visit to the diagnosis engine. There is a suspect list of problems, either a specified timeout (up to infinity) or no timeout at all, and a list of propagations it is desirable to poll. This is the information to be passed back to the diagnosis manager.

If there are any unexplained observations left, there must be another real problem present. The whole process repeats until no unexplained observations are left, creating as many suspect lists as needed. Each real problem has its suspect list, timeout and list of propagations to poll. When all this is complete, the whole lot is given back to the diagnosis manager for a decision as to how to proceed further.

7.7.6 Flowcharts

Figure 22C:
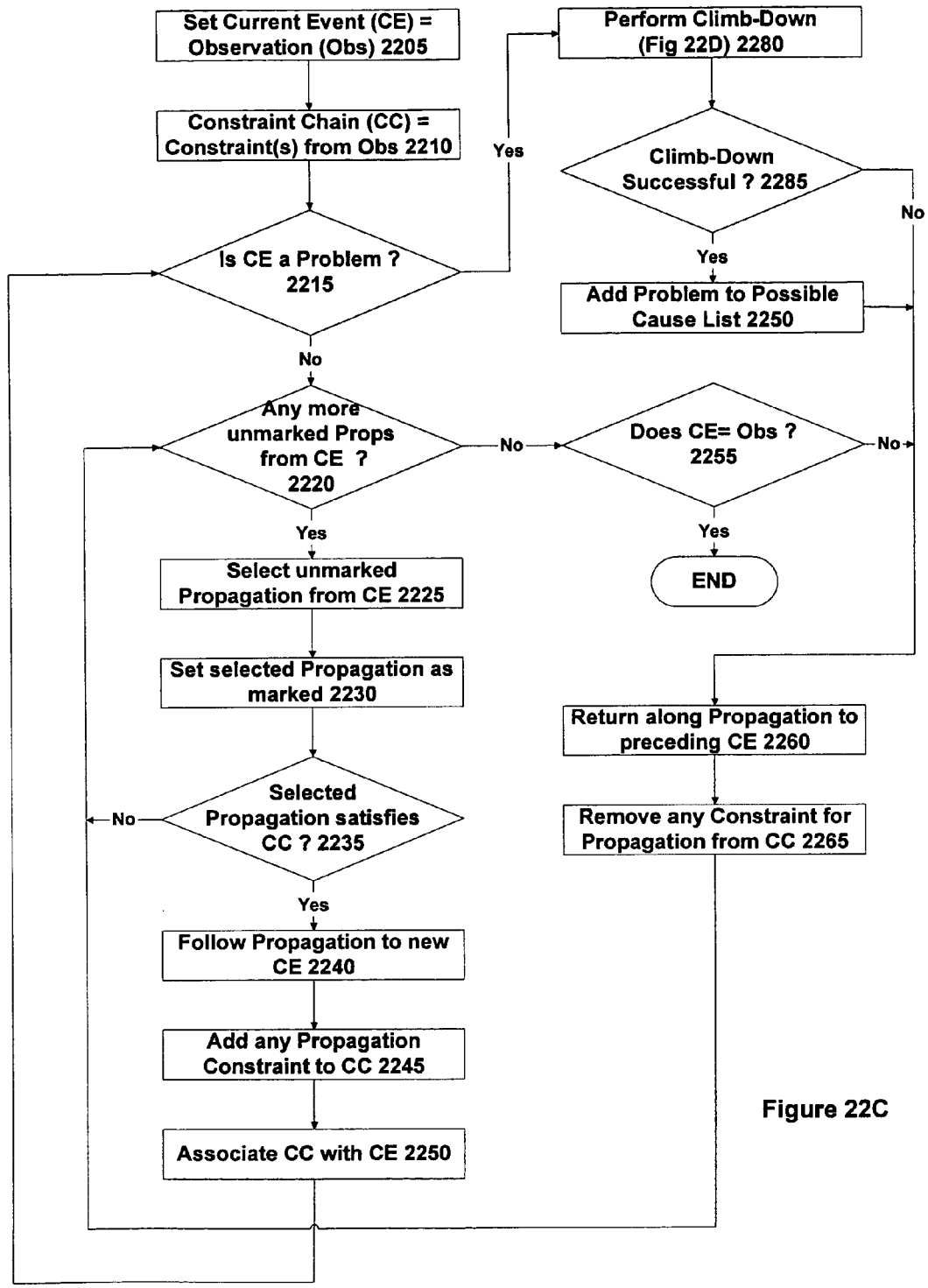
FIG. 22C is a flowchart illustrating the diagnosis algorithm ascending the fault tree in accordance with one embodiment of the invention.

FIG. 22C provides a flowchart illustrating the operation of the diagnosis algorithm in the ascending phase, when it is climbing from a received observation in order to find any problem that might possibly have caused the observation. The algorithm involves recursion and iteration, and starts by equating a nominal current event (CE) with the event (i.e. the report) corresponding to the observation in question (2205).

A constraint chain (CC) is defined that includes all the constraint information associated with the propagation to the current event. This constraint information generally includes restrictions on timing, configuration, and parameters. At the start of the analysis, this constraint chain simply reflects any information that is available from the initial observation itself (2210), such as the time of the observation, and any parameter information that is included with the observation.

We now proceed to the test of operation 2215, which determines whether the current event corresponds to a problem in the fault tree. It will be appreciated that the first time this test is reached, the current event corresponds to an observation, and so the result of the test is negative. Accordingly, processing continues to operation 2220, which looks to see if there are any unmarked propagations that ascend the fault tree from the current event. A propagation is considered as unmarked if it is not yet been explored by a diagnosis algorithm with respect to the initial observation.

There must be at least one propagation from the initial observation (otherwise the observation could not have been produced), so the first time that test 2220 is reached, we take the positive outcome. Accordingly, an unmarked propagation from the current event is selected (2225), and is then set as marked (2230), to indicate that it has been reviewed (and so would not be selected again in the future).

It is now determined whether the selected propagation ascending from the current event satisfies the current constraint chain (2235). For example it may be that the selected propagation can only arise with a particular configuration, and it is known that this configuration did not exist during the time period that the propagation might possibly have occurred. If it is found that the selected propagation is indeed prohibited by current constraint information, then we loop back to operation 2220 to select the next propagation into the cause bubble of the current event. Note that the test of operation 2235 is performed on an optimistic basis. In other words, the test only fails if it is known for certain that the propagation is forbidden by the current constraint chain.

Assuming that test 2235 is positive however, and that the propagation is consistent with the constraint chain, then we can follow the selected propagation (2240). This represents a recursion up one level in the fault tree, and the current event is now set to be the event reached by following the propagation (i.e. the event at whose effect bubble the propagation originates).

In following the selected propagation, any constraints that are applicable to the propagation are added into the constrain chain (2245). For example, if we again assume that propagation could only have occurred while a particular configuration was in existence, then the timing of the propagation is now known to be restricted to a period when the relevant configuration was in existence. The constraint chain information so far produced is then associated with the current event (2250) for use during the subsequent climb down of the fault tree (as described in more detail below).

Processing now loops back up to operation 2215, where a test is again performed to see whether the current event represents a problem. If not, then the processing just described is repeated, through the loop of operations 2215 and 2250. There are two possible exits from this loop— either because we reach a problem (a termination of recursion) at test 2215, or because we run out of propagations (a termination of iteration) at test 2220).

Assuming for the moment the former possibility, namely that we have reached a problem in the fault tree, then we proceed to operation 2280. This involves descending the fault tree to confirm the viability of the particular route that has just been followed from the initial observation up to problem corresponding to the current event. This descent or climb-down of the fault tree is described in more detail with respect to FIG. 22D below. Once the climb-down of the fault tree has finished, it is determined whether or not the climb-down was successful (2285). If so, the problem corresponding to the current event represents a possible cause of the initial observation, and so can be added to the listing of such possible causes (2250).

Irrespective of the result of the climb-down operation, a problem represents the furthest we can go in ascending this portion of the tree. Accordingly, we must now drop down a level in the recursion to continue the investigation. This is achieved by returning along the same propagation that had been followed to get to the current event (2260). The current event is now reset to the event that has just been arrived at as a result of re-tracing the propagation (i.e. the event associated with the cause bubble at which the propagation arrives). In addition, any constraints or restrictions that were added (at operation 2245) to the constraint chain as a result of ascending the propagation that has just been re-traced are removed from the constraint chain (2265). Processing now returns to operation 2220 to continue the examination of another portion of the fault tree.

The other possible mechanism for exiting the loop from operations 2220 through to 2250 is when all propagations from the current event have already been explored (this is irrespective of whether or not such propagations led to potential problems). In this case, all the propagations upwards from an event will be marked, and so the test of operation 2220 is negative.

A test is now performed to check whether the current event corresponds to the initial observation (2255). If not, processing drops back down a recursion level. This is achieved as previously described with respect to operations 2260 and 2265. On the other hand, if the test of operation 2255 is positive, this implies that all propagations into the initial observation have been fully investigated. Consequently, any problem that could possibly have caused the observation should have been detected and added to the list at operation 2250, and hence processing can terminate.

Figure 22D:
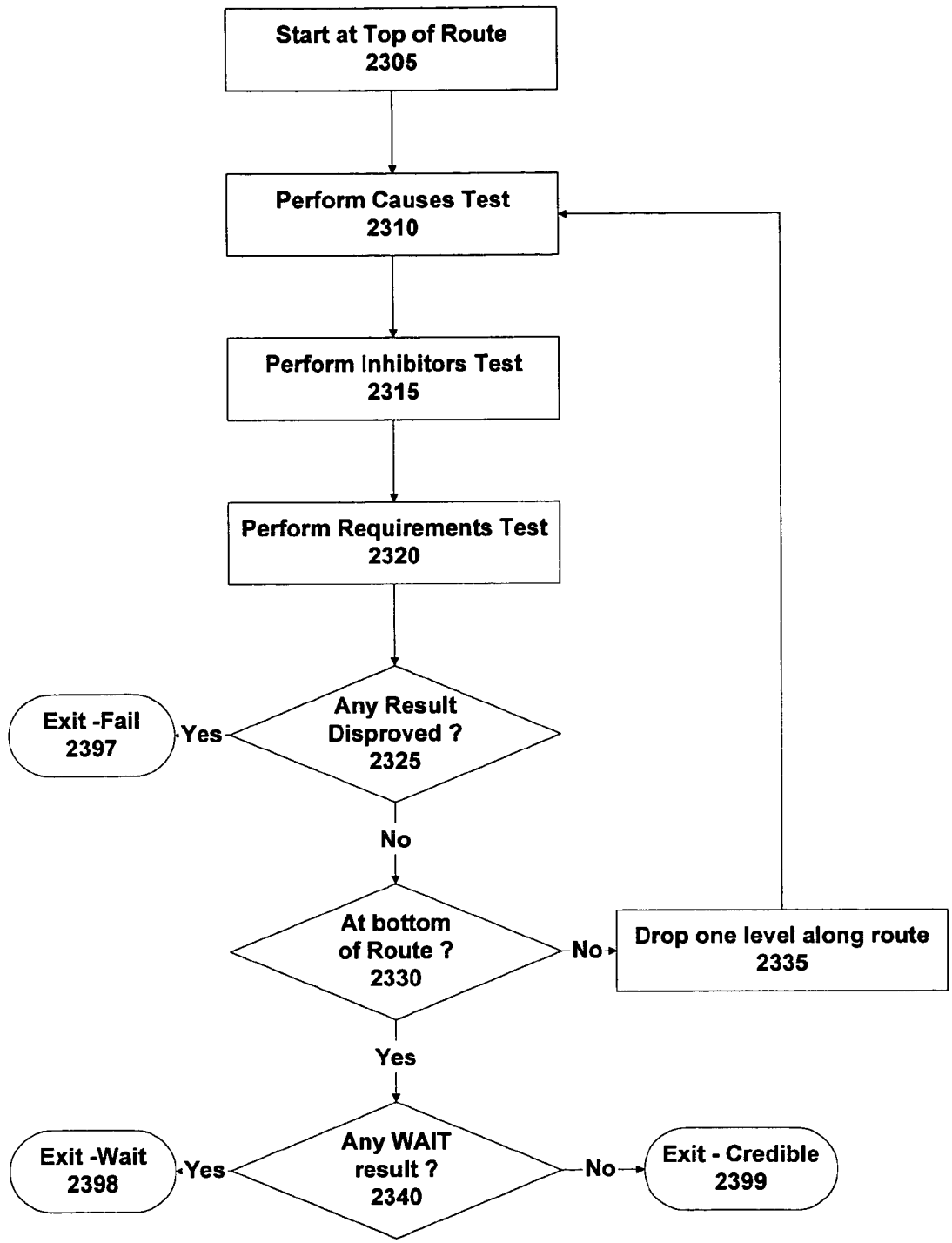
FIG. 22D is a high-level flowchart illustrating the diagnosis algorithm descending the fault tree in accordance with one embodiment of the invention.

FIG. 22D illustrates a flowchart representing the descending or climb down portion of the diagnosis algorithm (corresponding to the operation 2280 in FIG. 22C). Processing starts at the event at the top of the particular route being examined (2305) and performs three tests on this event, namely the Causes Test (2310), the Inhibitors Test (2315), and the Requirements Test (2320).

At operation 2325, the outcomes of the three tests are investigated. If any of the three tests has failed, it can be considered that the particular route has been disproved, and accordingly we exit with failure (2397). This implies that some other explanation will be needed for the observation(s) (rather than the particular route being tested).

Alternatively, if the test of operation 2330 indicates that we have indeed reached the bottom of the particular route, then it is known that none of the event tests has failed along the route. It is possible that a Requirements test produced at least one Wait result somewhere along the route. Accordingly, a test is made to determine whether any such Wait result was obtained (2340). If so, processing exits with a Wait result (2398), while otherwise processing exits with a Credible result (2399). Note that for the purposes of the processing within FIG. 22C, a Wait result is regarded as the same as a credible result, in that it is indeed possible that the particular route could have occurred. The only difference however, is that the diagnosis engine is aware that future information (whether the absence of presence of an observation) will allow a more precise assessment to be made of the credibility of this particular route.

Figure 22E:
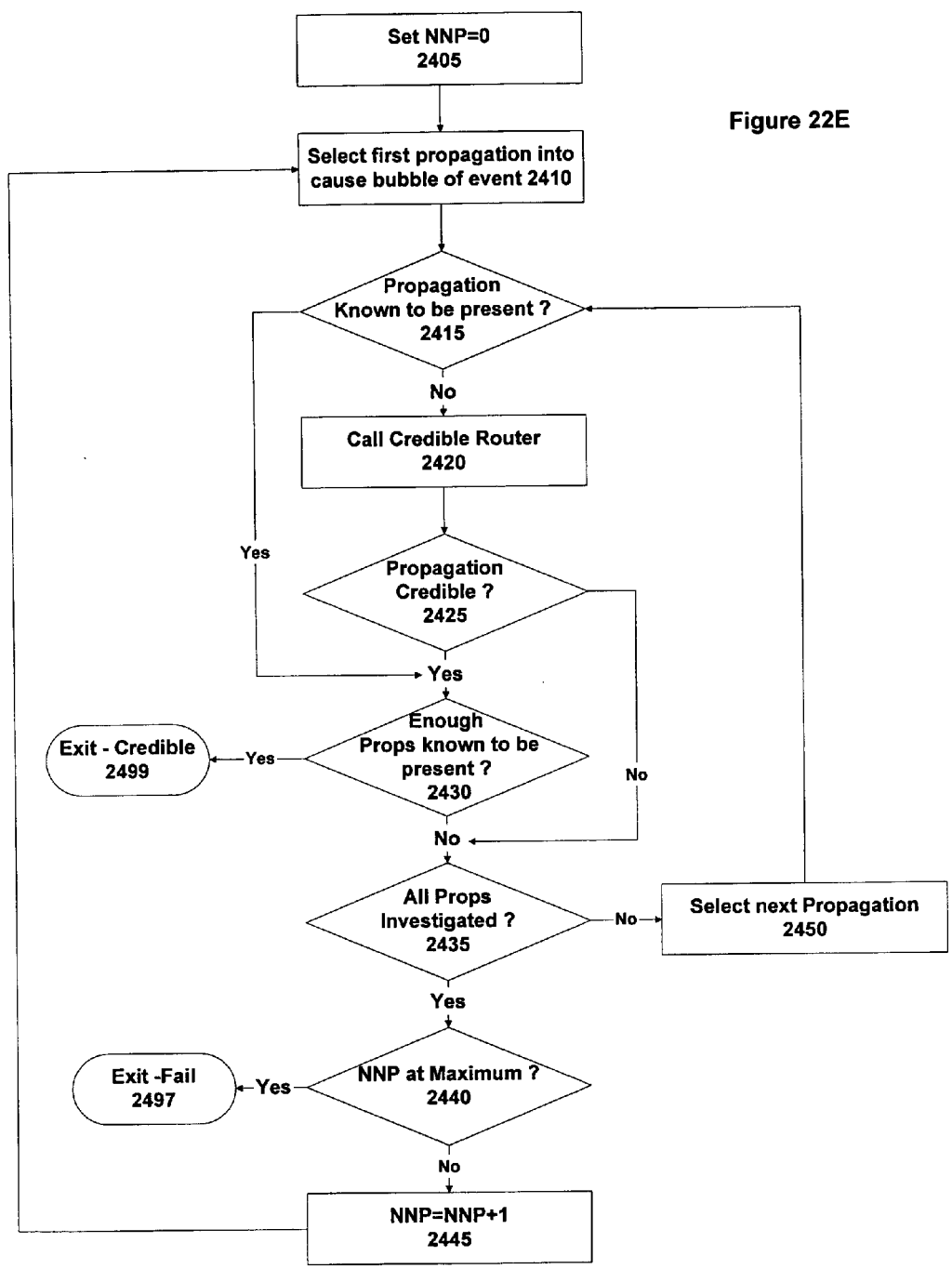
FIG. 22E is a flowchart illustrating the Causes test of the diagnosis algorithm in accordance with one embodiment of the invention.

FIG. 22E describes in more detail the Causes test corresponding to operation 2310 in FIG. 22D in accordance with one embodiment of the invention. The Causes test investigates whether it is possible that there are enough propagations into the cause bubble of an error for the error to have occurred. Note that the Causes test is always satisfied for an event having a cause bubble of K=1. This is because a propagation into the cause bubble has already been hypothesised to occur as part of the particular route being investigated. Accordingly, the full processing of the Causes test is only need for cause bubbles with values of K>1.

The processing of FIG. 22E starts by setting the number of new problems (NNP) that are allowed to exist for the purpose for the Causes test to zero (2405). In other words, the Causes test is initially performed on the assumption that the only problems present are those already known or hypothesized to be present (e.g. as part of the particular route that is being examined).

A first propagation into the cause bubble of the event is now selected (2410) and a test performed to see whether it is known that this propagation is present (2415). This test would be positive if the propagation formed part of a particular route being investigated, since it has already been hypothesized on the ascending part of the diagnosis algorithm that this particular propagation is present. However if it is not already known whether this particular propagation may be present, then the credible router is called (2420). This is used to determine whether there is a credible route from the event in question to a problem that is already known or hypothesized to be present (for example as part of a particular route being considered). The credible router algorithm is based on ascending the tree using the same approach as described in FIG. 22C, except that the starting point now represents the event being tested rather than the initial observation. (It will be appreciated that this represents another level of recursion in the diagnosis algorithm). The credible router is called here with a preference of yes. In other words an optimistic evaluation is performed to see whether it is at all possible that the propagation in question could have occurred.

If the credible router finds that the propagation being tested is indeed credible (2425), or if the propagation was already known to be present, then it is now tested to see whether enough propagations are known to have been possibly present into the cause bubble for the event to have occurred (2430). If this is the case, then the event is credible (since there are enough propagations into its cause bubble), and we can exit according (2419).

However, if it is not yet certain whether there could be sufficient propagations into the cause bubble for the event to have occurred, then we proceed to step 2435, which examines whether or not all the propagations into the cause bubble have yet been investigated. If not we select the next propagation (2450) and return to the processing of operation 2415. Accordingly, another propagation into the cause bubble is examined, and so represents another opportunity to find sufficient possible propagations into the cause bubble to permit a conclusion that it is credible that the event occurred.

On the other hand, if it is found at operation 2435 that all the propagations into the cause bubble have already been investigated, then under the currently assumed value of NNP, not enough propagations into the cause bubble of the event can have occurred to trigger the event. In these circumstances, the only possibility for the event still to have occurred is if we increase the number of problems allowed. In other words, it is hypothesised that an additional problem is present in the system, and that one or more propagations caused by this additional problem caused the event in question.

Accordingly at operation 2440 a test is made to see whether the value of NNP is already at its maximum permitted level. If NNP is already at its maximum, then the Causes test is exited with a failure (2497). This would indicate that the particular route being investigated is invalid (i.e. could not have occurred), since there could not have been sufficient propagations into the event in question for it to have occurred.

On the other hand, if NNP is not already at its maximum, then it can be raised at operation 2445 and we return to the start of the Causes test at operation 2410. The credible router algorithm can postulate one or more new problems (according to the value of NNP) for the analysis. This allows for additional propagations to occur in the fault tree, and so provides additional opportunities for the Causes test to be satisfied.

Figure 22F:
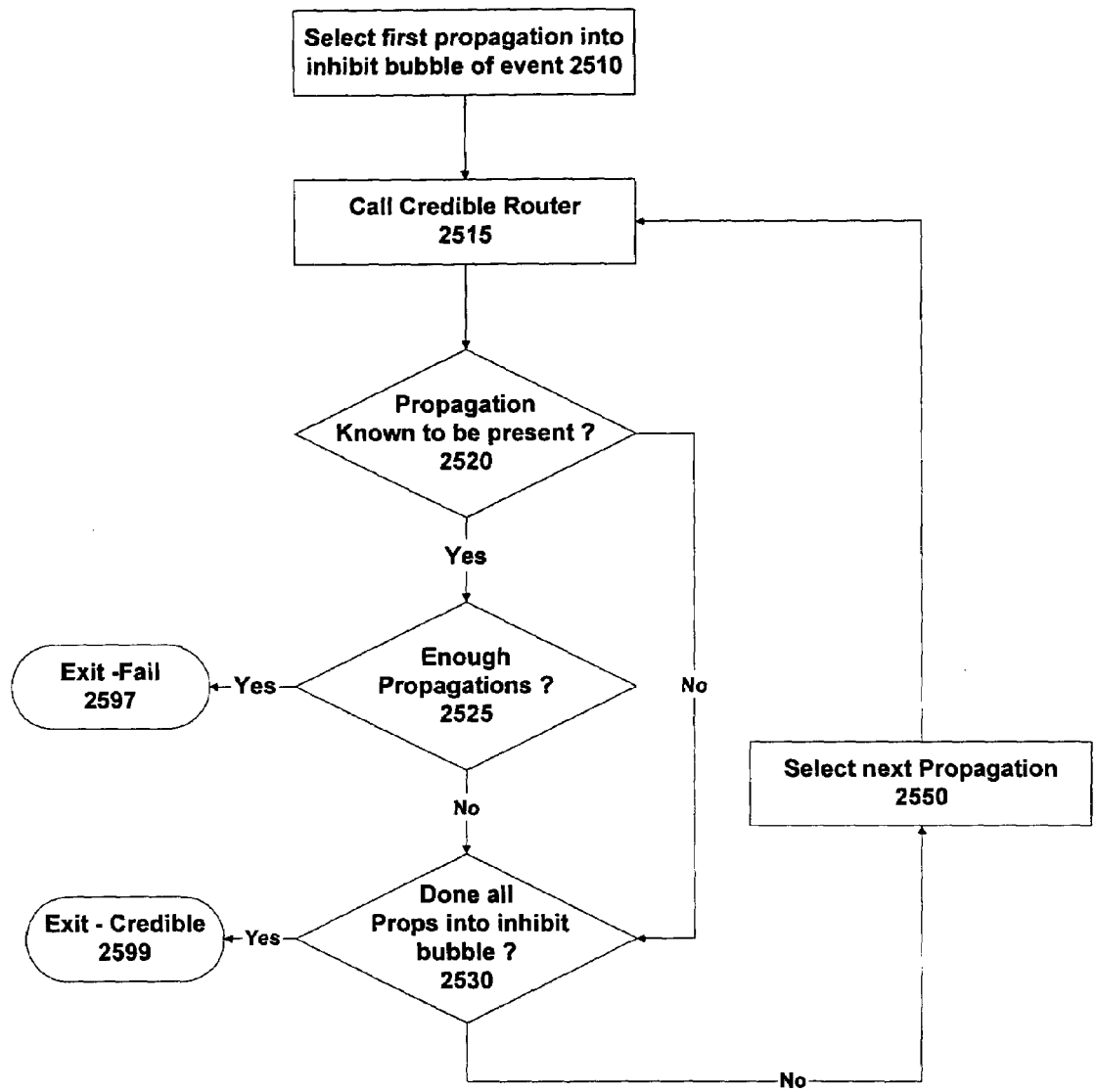
FIG. 22F is a flowchart illustrating the Inhibitors test of the diagnosis algorithm in accordance with one embodiment of the invention.

FIG. 22F illustrates the Inhibitors test (corresponding to operation 2315 in FIG. 22D). This test is only performed in respect of events that have an inhibit bubble and attempts to determine whether it is credible that inhibit bubble is not activated. If this is the case, then it is credible that the event occurred. However, if it is not credible that the inhibit bubble was not triggered, then this must have prevented (inhibited) the event, and hence the particular route, from having occurred. This situation then represents failure of the Inhibitors test.

At a broad level, there are certain similarities between the Causes test of FIG. 22E and the Inhibitors test of FIG. 22F. Note however that in the Inhibitors test we adopt a pessimistic approach to propagation, rather than the optimistic approach of the Causes test. This is because in the Inhibitors test we want to know whether there is any possibility that the event in question could have occurred. This implies that the inhibit bubble was not triggered, but the cause bubble was.

As shown in FIG. 22F, the Inhibitors test commences with the selection of a first propagation into the inhibit bubble of the event (2510). The credible router is now called to determine whether it is credible that this bubble was not activated (2515). As before, the credible router can adopt the procedure shown in FIG. 22C, except that processing now starts at the event being tested (rather than the initial observation). It will be appreciated that this represents another level of recursion in the analysis.

As mentioned above, the credible router adopts a pessimistic evaluation for the Inhibitors test, in that any propagation that could possibly not have occurred is assumed not to have occurred. This then minimises the opportunity for the inhibit bubble to be activated. In addition, the credible routing analysis is performed by setting NNP=0. In other words it is assumed that there are no new problems, other than the ones already known or hypothesised to exist for the purpose of this particular route. This represents the most conservative (pessimistic) approach.

If a propagation into the inhibit bubble is found by the credible router to necessarily be present, then a test is performed (2525) to see whether enough propagations into the inhibit bubble are known to be present in order to trigger the inhibit bubble. In other words, this tests whether the K value in the inhibit bubble has been satisfied. If enough propagations are indeed now known to be present to activate the inhibit bubble, then we exit with failure (2597). Failure of the Inhibitors test implies activation of the inhibit bubble, which in turn means that the event in question could not have occurred.

On the other hand, if it is still credible that not enough propagations into the inhibit bubble occurred to activate the inhibit bubble (i.e. the test of operation 2520 or 2525 is negative), then we proceed at operation 2530 to see if all the propagations into the inhibit bubble have been considered. If this is not the case, then we proceed to select the next propagation into the inhibit bubble (2450) and loop back up to operation 2415 to investigate this newly selected propagation. However, if the test of operation 2530 is positive, then it is now known that the inhibit bubble need not have been activated, and hence that the event was not necessarily inhibited. This then implies that the event could credibly have occurred, and we can exit accordingly (2599).

Figure 22G:
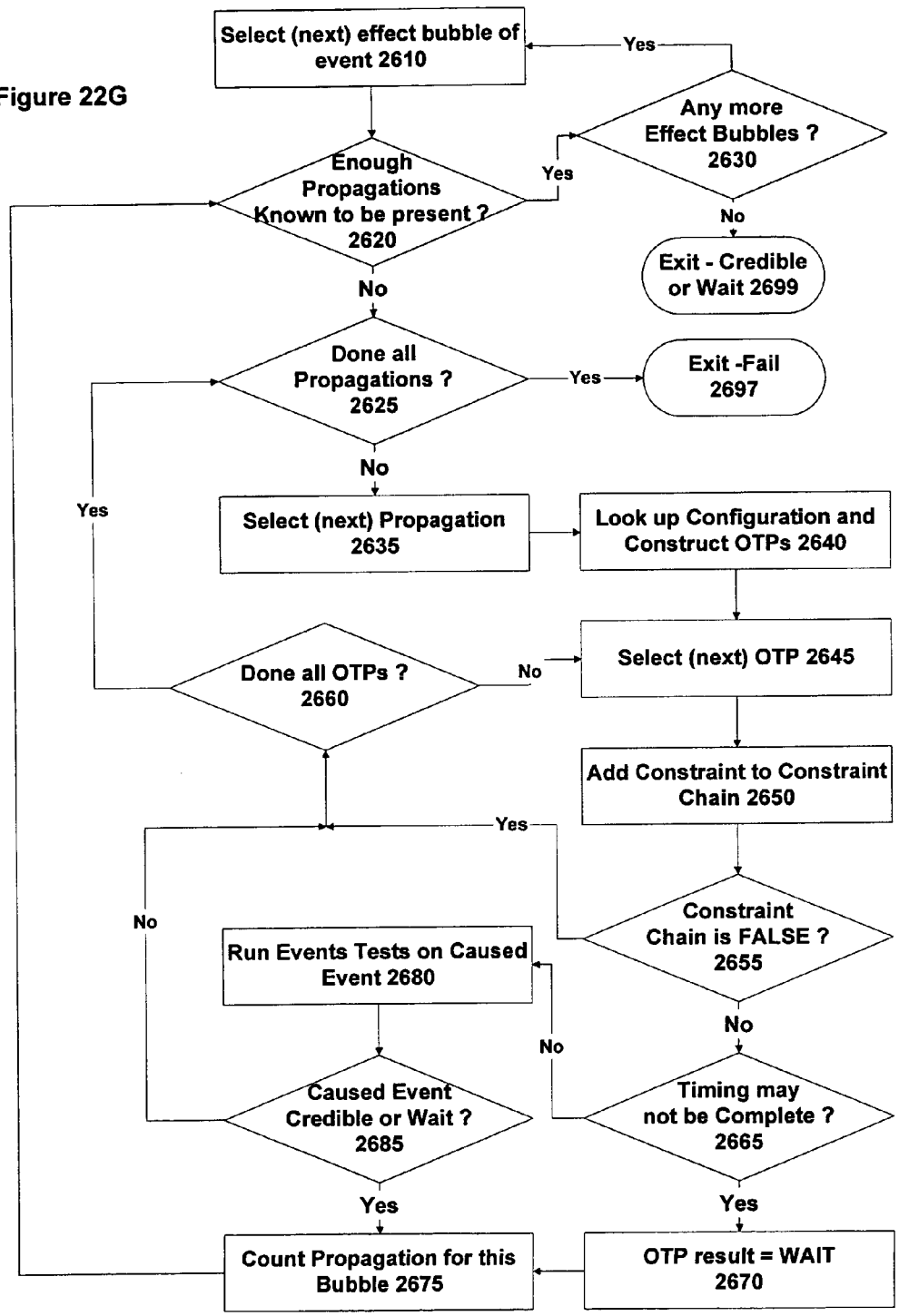
FIG. 22G is a flowchart illustrating the Requirements test of the diagnosis algorithm in accordance with one embodiment of the invention.

FIG. 22G illustrates the Requirements test (corresponding to operation 2320 in FIG. 22D) in accordance with one embodiment of the invention. The Requirements test looks at the propagations from the event in question to see whether it is credible that propagations that should have occurred from the event did in fact occur. If it is found that such propagations could not have occurred, then this implies that the event itself did not occur, and hence the particular route including the event can be regarded as disproved. Note that in performing the requirements test, we use a pessimistic evaluation for propagations, since we are only looking for propagations that must necessarily have occurred. In other words, the Requirements tests confirms that at least the minimum consequences in terms of propagations from the event in question could indeed have occurred.

The Requirements test commences with selecting an effect bubble of the event in question (2610). A test is now performed for this effect bubble to see if enough propagations to satisfy the value of N in the bubble are already known to be present (2620). A propagation is considered as present if it is part of the hypothesized particular route, or if the Requirements test shows that the propagation is consistent with the available observations (as described in more detail below).

It will be appreciated that if the effect bubble represents a may propagation (i.e. N=0) then the result from test 2620 is necessarily positive. This is because it is not required for any of the propagations from the effect bubble to have occurred. Likewise, if N=1, and the particular route through the event propagates out from this effect bubble, then again it is already known that enough propagations from the effect bubble are present, and so the test of operation 2620 will be positive.

If enough propagations are indeed known to present to satisfy the value of N in the effect bubble, then we proceed to operation 2630. This tests whether there are any more effect bubbles in the event to examine. If so, we loop back to operation 2610 to select the next effect bubble for analysis. Alternatively, if all the effect bubbles in the event have been examined, then we take the negative outcome from test 2630. To reach this stage implies that enough propagations have been found from each effect bubble in the event for the event to be credible, so that we can exit with a credible result (2699). More particularly, we exit with a credible result unless one of the propagations has been found to have a wait result (as described in more detail later), in which case we exit with a wait result (which is still regarded as a positive outcome within the context of the three events tests).

Returning to operation 2620, we now assume that not enough propagations from the event are yet known to be present. For example, the value of N in an effect bubble may equal 2, and so we need to know which two propagations from the effect bubble might credibly have occurred. Accordingly, we now proceed to operation 2625 which determines whether or not we have looked at all the propagations from the effect bubble. Assuming that this is not yet the case, we proceed to select the next propagation from the effect bubble (2635), and look up the configuration information relevant to this propagation. As described above, this allows the set of opportunities to propagate (OTP) to be defined for the propagation (2640), where each OTP represents a time window during which the configuration would have permitted the propagation to occur.

We now proceed to examine each OTP in turn by selecting an OTP to examine (2645). The constraint information associated with this OTP (timing, parameter, etc.) is added to the constraint chain for the event (2650). Note that the constraint chain for the event is based on information assembled both from the initial ascent of the fault tree along the particular route, and also from the descent back to the event that is now being examined. (It will be appreciated that the constraint information added at operation 2650 is only included in the constraint chain for investigating this particular OTP).

The constraint chain for the OTP is evaluated (2655). If the constraint chain is found to be false, then it is known that this OTP could not have occurred, and so cannot contribute to value of N in the effect bubble. Accordingly, we proceed to operation 2660 to check that not all the OTPs for this propagation have been considered, and assuming that this is not the case, we select the next OTP for examination (2645).

If the constraint chain does not evaluate false at operation 2655, then it is possible that the OTP may indeed have occurred. In this case we proceed to examine whether or not the propagation has had time to complete (2665), based on the timing information associated with the observation, plus the timing information as specified in the fault tree. If it is possible from the timing that the propagation in question may not yet have occurred, then we set the result for this OTP to Wait (2670). This Wait result is then counted towards the number of known propagations from this effect bubble (2675). This is because we cannot be certain at this time that the propagation will not occur in due course. We then return to the test of 2620 to see if we now have sufficient known propagations to satisfy the value of N in the effect bubble (and if not proceed to examine another propagation).

Returning to operation 2665, we now consider the situation where it is known from the timing information that the OTP would have completed (if the propagation had occurred). Accordingly, we look at the event at whose cause bubble the propagation arrives (the caused event), and see whether or not it is credible that this caused event has indeed occurred. This assessment is performed by running the three Events tests on caused event (2680). It will be appreciated that this represents another level of recursion in the analysis, where we proceed from the current event along the propagation being tested to the caused event, and run the Causes test, the Inhibitors test and the Requirements test, as depicted in FIGS. 22E, 22F and 22G respectively.

If the caused event is credible (including if it is found to have a Wait status) then the propagation to the caused event can be counted towards the propagation requirement from the effect bubble of the current event in question (2675). We can then return to operation 2620 to see if enough propagations are now known to be present to satisfy the value of N in the effect bubble being examined. On the other hand, if the events tests for the caused event are not positive, in other words they demonstrate that the caused event could not in fact be present, then this demonstrates that the OTP did not occur. Accordingly, we return to operation 2660 to see whether or not all the OTPs for this propagation have yet been examined, and if not proceed to select the next OTP for examination (2645).

Once all the OTPs for this propagation have been examined, i.e. the test of operation 2660 is positive, we now return to see whether or not all the propagations from the effect bubble have been examined (2625). If not, the next propagation from the effect bubble is selected for analysis (2635), to see whether this can count towards the propagation requirement from the effect bubble. However if all the propagations from the effect bubble have now been examined, so that the result from operation 2625 is positive, this indicates that all OTPs from all propagations from the effect bubble have been investigated, and not enough credible propagations from the effect bubble have been found to satisfy the value of N in the effect bubble. In other words, the required consequences, should the current event have occurred, are inconsistent with the observations and any other relevant information. Accordingly, we exit with a Fail value (2697), since the conclusion from the Requirements test is that the event in question could not have occurred. This failure of the Requirements test then disproves the particular route that is being examined.

(It will be appreciated that the above flowcharts, FIGS. 22A–22G are provided by way of illustration only of the general approach; various optimisations could be made for any particular implementation).

7.8 The Diagnosis Manager

The diagnosis manager makes a separate decision for each suspect list provided by the engine. The decision is whether to publish a diagnosis for action, or whether to wait for more evidence. The manager has a set of guidelines to examine to help make this decision. For example, if there is just one problem on the suspect list, it is reasonable to publish it. There cannot be any timeout or pollers associated with such a list. If there are multiple problems in a suspect list, but no timeout (as opposed to an infinite timeout) and no pollers that can be run, then likewise the list should be published, since no more evidence to help the diagnosis is expected. If there are pollers to run, the diagnosis manager should try to run them. The manager should have a time limit for how long it is willing to wait for a poller to complete. If there is a finite timeout, it is generally sensible to wait for it, even if it is quite long, although the system may specify some maximum wait period (since a requested wait period might conceivably run into months).

If there is an infinite timeout, the manager can choose whether or not to wait. It makes sense for the manager to set some finite time limit that it is willing to wait for an event that might happen in the infinite future. In one embodiment, the manager may choose to publish a result once the oldest observation explained by a suspect list exceeds a set age.

If the manager decides to wait, it can usefully revisit the engine whenever a timeout expires, or a poller ends, or a report arrives, although it does not have to run the engine for every separate one of these, if economy of compute resources is desired. Eventually, no pollers can run usefully, and there are no further time limits that could have been exceeded, in which case the diagnosis might as well publish the suspect list that it has. When the manager decides to publish a suspect list, it allocates the list an FME ID and sends it out. In addition, the diagnosis manager marks all the observations EXPLAINED by the list as CLAIMED by it.

In summary therefore, the diagnosis algorithm described above produces a history-free diagnosis in reasonable time. It makes pragmatic decisions to minimise complexity of results, and it understands precisely how uncertain the observations of the system are. The diagnosis algorithm deals with multiple simultaneous problems, and copes with diagnosing across configuration changes, even with stored errors created by FRUs that have already been sent back to the factory.

7.9 Policy Modules

As indicated in FIG. 1A (see operation 70), the diagnosis initially produced by the diagnosis engine 122 may be refined as appropriate. This refinement can be performed by one or more policy modules 124 (see FIG. 1B). For example, one policy module may reflect previous repair history for the system. This could then be used to record the situation where error reports appear, a diagnosis is made, and some action taken with regard to one particular problem on the suspect list—e.g. an FRU is replaced (with the other problems then marked as a field acquittal). If similar error reports continue to appear, the repair history module might indicate that a different problem on the suspect list is now the most likely source of the error reports. In other words, it may deduce that the previous repair was ineffectual, and hence priority should be given to remedying some other problem on the suspect list.

The policy modules may use a wide range of other information sources, including information about problems (and problem resolution) on other systems, information about the age of the components in the system, information about the environmental history of the system (e.g. whether it has suffered a period of excessive heat), and so on. This additional information can help the policy module pick out the most likely real problem from a suspect list, and so ensure that the most appropriate repair or other remedial action is taken.

7.10 Other forms of Diagnosis

Although one particular form of diagnosis algorithm has been described for use with a fault tree, it will be appreciated that a fault tree such as described herein could be used with other diagnosis algorithms. For example, the various outcomes in terms of patterns of error reports for each potential problem could be calculated in advance, and stored in a database. The diagnosis could then be performed by trying to match the observed error reports against the various patterns stored in the database. This approach is more suited for relatively small systems where the fault tree does not have such great complexity, since this reduces the number of error patterns to be (pre)computed and then matched. Likewise, this approach is also more suited to systems with a fixed configuration, so that the stored patterns do not need to be updated with each configuration change.

8. Testing

A system may support one or more test programs. These have the bonus that they sometimes provide extra error detection capability. For example, the expected test output may be known in advance, so that any deviation can then be regarded as an error. (Tests of this sort with extra detection capability are sometimes referred to as "diagnostic tests").

Another advantage of testing is being able to confirm the presence of a problem once it has been diagnosed at runtime (such as by using snapshot diagnosis). This can be particularly helpful for avoiding the situation where a problem is supposedly discovered in the field, but then somehow disappears by the time that the relevant FRU has been returned to a factory for repair. In these circumstances, it might be suspected that the initial diagnosis was incorrect (perhaps due to a bug in the diagnosis program or fault tree). However, if a test can be run immediately after the initial diagnosis, while the FRU is still warm and at the customer location (although typically deconfigured from the running system so as not to risk any further difficulties with the rest of the system), this gives the best chance of reproducing errors that can support the diagnosis. Such test results can then provide confirmation that the FRU does indeed need to be returned to the factory for investigation and repair.

8.1 Testing and Configuration

In many situations, it is desirable to try to demonstrate that there are no problems in a particular ASRU or FRU. The fault tree can be used to determine which tests to run in order to make such a demonstration. In particular, the tests to be run are those that act as pollers for propagations that come from problems associated with the ASRU or FRU in question. Such testing might be performed as a precaution, prior to any system (re)configuration, so as to have confidence that the new configuration will be properly functional.

If no test is specified for a particular problem, or a test is specified but is unable to run (such as due to the current configuration state), then that problem has not been covered. This information can be logged, and/or presented to the customer or service staff. The problems that cannot be covered in this way may have available FIT rate information. One possibility is to restrict any new configuration to having a maximum FIT rate for the components or problems that cannot be specifically tested in advance.

8.2 Testing and the Suspect List

Once diagnosis produces a suspect list, tests can be used to discover whether a suspected problem is present (and is reproducible, in that it continues to create errors and reports). Such testing can confirm the initial diagnosis, and may also be able to reduce the size of a suspect list by eliminating some problems that are found not to be present.

More particularly, the suspect list output from diagnosis contains a specific set of problems, some of which may cause polled propagations, with test programs as the poller. As previously described, the system can then run the relevant test pollers, which should cause propagations to other errors or to specific test reports. The set of error reports generated by this test procedure can then be examined to check if it is compatible with any of the suspected problem(s). If testing confirms that a particular problem from the suspect list definitely is present, then there is an implication that the remaining entries in the suspect list might not be the cause of the observed error reports. Certainly, the positive identification of at least one problem provides a starting point for further investigation and remedial action.

8.3 Fault Injection Testing

The testing so far described is based on examining how the system performs its normal functions. Fault injection testing in contrast involves deliberately breaking the system in some way, and checking that errors and reports are created and detected as expected.

Error Insertion: Error insertion is the creation of one or more errors in the system, i.e. one or more signals or data that are wrong, in order that the error(s) may be detected by system error detectors. This procedure tests error detector hardware and software, as well as error handling and collection, the transformation of the detected error into a report, and the diagnosis algorithm itself.

Another example of error insertion might be a facility that can insert all possible combinations of errors into ECC memory. This can be used to verify that the error detector can indeed see all of the errors.

Report Insertion: Report insertion involves writing data to an error detector to mimic the effects of the detection of an error. This exercises the error handler and collection software that transforms the raw detected error into a report for the diagnosis system.

Report Simulation: Report simulation involves creating a report from nothing and presenting it to the diagnosis system. The main use of report simulation is to test the diagnosis algorithm. Report simulation is typically employed in a simulation environment distinct from the actual software and hardware. Accordingly, it might be appropriate to regard report simulation as a way of testing the diagnosis facility rather than the rest of the computing system.

Fault Insertion: Fault insertion involves the deliberate breaking of some functionality (preferably through some reversible method). The inserted fault mimics the behaviour expected from a real fault that might appear at runtime. A typical inserted fault might make a wire always be low, thereby mimicking the fault of the wire being shorted out. Note that such a fault will not create errors until the fault is exercised. Consequently, it may also be necessary to run a particular test routine at the same time as the fault insertion is performed.

Fault insertion has a number of advantages over the other described techniques of fault injection, although it usually is the hardest to implement. For example, the errors that an inserted fault creates correspond to those that a real fault will create, as opposed to just those that the fault tree suggests the fault should create. This therefore provides a major tool for checking the correctness of the fault tree. In addition, fault insertion can cause multiple different errors to be created at once, and can also cause streams of errors to be created. This helps to check that the system can deal appropriately with all the errors appearing. (On the other hand, the use of fault insertion in the field acts to some extent as a test of the fault insertion mechanism itself, rather than as a test of the rest of the system, which potentially complicates the use of fault insertion in the field).

The various types of fault injection can therefore be summarised as follows:

Report simulation—tests no hardware and no system-specific software. Useful for lab tests and regression testing of fault trees.

Report insertion—in the field, verifies the system-specific connection between the error detectors and the diagnosis system. Has the advantage that reports do not propagate, so can be done on a small part of a running system, but has the disadvantage that it does not test the error detectors.

Error insertion in the field, tests the error detectors and the system-specific connection to the diagnosis system. Cannot be done if the error will propagate to cause an outage in a running system.

Fault insertion—in the lab, useful to verify the fault tree and that the system can handle the fault in all its manifestations, especially for regression testing Report insertion, error insertion and fault insertion can be represented as problems that are integrated into the fault tree itself. This then requires the problems to be properly annotated to describe their use during normal operation and during fault injection. For example, a problem in a fault tree that represents only fault injection must not be considered during diagnosis as a potential cause of real errors. Accordingly, problems are annotated to indicate whether or not they should be incorporated into real diagnosis. Faults that are only provided for fault insertion are marked to indicate that they should not be incorporated into diagnosis. There may be some problems that represent real faults, but where there is also some fault injection capability. In this case, the annotation defines when and how the fault injection capability is exercised.

Note that if the fault injection testing is performed in the field, it is important that errors do not propagate from a tested subsystem to a running subsystem (especially if those errors are then going to cause an outage). Accordingly, the fault tree can be used to determine what fault injection testing is available. In particular, the fault tree may be used to see how errors propagate from the tested components by simulating the presence of the problem corresponding to the planned fault injection. If any error propagates from the inserted fault into the running subsystem (or alternatively if such an error might cause an outage), then the fault injection concerned cannot be used.

9. Applications

The fault tree and diagnosis engine described herein have many applications both at design time and also in an operational system.

For example, at design time, the fault tree can be used to assess the vulnerability of the system to particular problems, by investigating error propagation should any given error occur. This can help to make the system more robust, such as by including more redundancy if appropriate.

The fault tree can also be used at design time to assist with the location of error detectors. For example, if simulations show that different problems lead to similar (or identical) error reports, or more generally, if the diagnosis algorithm is unable to discriminate between error reports produced by the different problems, then this suggests that additional error detection capability should be considered. This additional error detection capability can then be specifically designed to be able to ensure that the diagnosis algorithm can indeed discriminate between the different problems. Note that this is particularly important if the different problems do not reside in the same ASRU and/or the same FRU, since this then impacts the remedial action that the system would like to take in respect of the problems. In other words, the ability to discriminate between different problems is more valuable if this then leads to different actions in response.

The fault tree approach described herein is also very valuable at run-time for a system to provide a diagnosis capability if an operational system experiences any errors. Note that the diagnosis capability may be present on the system itself, or possibly resident on some remote system that can then receive the error report information (and the relevant fault tree if not already available). The diagnosis, whether performed locally or remotely, can then be used to drive automated repair (e.g. deconfiguration of a component determined to be faulty), and/or provided to a human engineer to assist with service action.

The fault tree can also be used to answer questions relating to configuration of the system, and vulnerability to problems. For example, if it is known that there is a certain problem already in the system (still awaiting repair), the fault tree can be used to investigate what happens should a further problem occur before the first problem has been fixed. The fault tree can also be used to predict the effect of removing or deconfiguring a particular FRU. For example, it might be used to warn a service engineer that removing a certain FRU will cause a system outage.

Although the description herein has focused on a particular implementation of a fault tree and diagnosis algorithm, many further possibilities will be apparent to the skilled person. For example, the fault tree might allow additional forms of problem, beyond a defect, error and upset (e.g. an out-of-calibration problem). Another possibility would be to allow some form of probability to be associated with a may propagation. This would not affect the identification of which problems to put into a suspect list, but it could be used to help determine which problem in the list is most likely to have caused the observed errors.

Although the fault handling approach described herein has generally been presented in the context of a computer server, it is applicable to a very wide range of electronic apparatus. This includes a broad variety of computing systems (mainframe, server, workstation, desktop, laptop, handheld, etc.), as well as a great range of other electronic systems, such as telecommunications apparatus, household electronic devices such as televisions and DVD players, subsystems for transport devices such as cars and aeroplanes, and so on. The approach can also be used for monitoring installations such as power stations, factories, office buildings, and so on.

One particular approach is where the fault tree and diagnosis engine is utilised to perform testing and diagnostic analysis of another system. For example, a computer, such as a handheld machine, workstation, etc., could be used to perform diagnosis of a device such as a car, an aeroplane, etc. using some form of data connection (wired or wireless) between the computer and the device. In this arrangement, the computer either has or obtains a copy of the fault tree for the device (potentially from the device itself), and also the error reports for the device (whether generated internally by detectors within the device, or by external monitoring apparatus). The computer can then perform diagnosis of any problems within the device, which can then be used to determine automated and/or human repair actions.

The software components described herein, such as a binary representation of the fault tree, a fault tree compiler, a diagnosis program, and so on, may comprise program instructions and/or data instructions on some fixed, non-volatile storage such as a hard disk or flash memory. These instructions and/or data structures can then be loaded for use into random access memory (RAM) for execution and use by a system processor, an application specific integrated circuit (ASIC), or by any other such device. Rather than being stored on a hard disk or other fixed device, part or all of the program instructions and/or data structures may also be stored on a removable storage medium, such as an optical (CD ROM, DVD, etc), magnetic (floppy disk, tape, etc), or semiconductor (removable flash memory) device. Alternatively, the program instructions and/or data structures may be downloaded via a transmission signal medium over a network, for example, a local area network (LAN), the Internet, and so on.

In conclusion, a variety of particular embodiments have been described in detail herein, but it will be appreciated that this is by way of exemplification only.

The skilled person will be aware of many further potential modifications and adaptations that fall within the scope of the claimed invention and its equivalents.

The invention claimed is:

1. A method for simulating the operation of a system, comprising:
providing a fault tree representation of the system, said fault tree defining a set of problems that may occur in the system, and specifying propagations of problems in the system whereby a problem may create one or more errors that may in turn be detected by one or more error detectors to produce corresponding error reports;
simulating using the fault tree representation, the presence of a problem in the system, and determining the set of error reports resulting from the simulated problem.

2. The method of claim 1, wherein said simulating is repeated for different problems to compare the sets of error reports potentially produced for the different problems.

3. The method of claim 2, further comprising comparing the error reports from different simulated problems to assist in adding error detectors to the system design.

4. The method of claim 3, wherein said comparison is performed by sending the error reports from the different simulated problems to a diagnosis algorithm to produce suspect lists for the problems.

5. The method of claim 1, further comprising sending the error reports from the simulated problem to a diagnosis algorithm.

6. The method of claim 5, further comprising detecting if the simulated problem does not appear in a suspect list of problems from the diagnosis algorithm.

7. The method of claim 5, further comprising determining a diagnosability metric based on the proportion of field replaceable units (FRUs) in a suspect list from the diagnosis algorithm that contain the simulated problem.

8. The method of claim 7, further comprising determining a diagnosability metric for all of said problems that may occur in the system.

9. The method of claim 8, further comprising weighting the metric according to predicted failure in time rate.

10. The method of claim 8, further comprising weighting the metric according to FRU cost.

11. The method of claim 8, further comprising weighting the metric by FRU repair cost.

12. The method of claim 8, further comprising weighting the metric by system downtime caused by a repair operation to fix the simulated problem.

13. Apparatus for simulating the operation of a systems comprising:
- fault tree representation of the system, said fault tree defining a set of problems that may occur in the system, and specifying propagations of problems in the system whereby a problem may create one or more errors that may in turn be detected by one or more error detectors to produce corresponding error reports;
- a simulator that uses the fault tree representation to simulate the presence of a problem in the system and to determine the set of error reports resulting from the simulated problem.

14. The apparatus of claim 13, wherein the simulating is repeated for different problems to compare the sets of error reports potentially produced for the different problems.

15. The apparatus of claim 14, wherein the error reports from different simulated problems are compared to assist in adding error detectors to the system design.

16. The apparatus of claim 15, wherein said comparison is performed by sending the error reports from the different simulated problems to a diagnosis algorithm to produce suspect lists for the problems.

17. The apparatus of claim 13, wherein the error reports are sent from the simulated problem to a diagnosis algorithm.

18. The apparatus of claim 17, wherein it is determined if the simulated problem does not appear in a suspect list of problems from the diagnosis algorithm.

19. The apparatus of claim 17, wherein a diagnosability metric is determined based on the proportion of field replaceable units (FRUs) in a suspect list from the diagnosis algorithm that contain the simulated problem.

20. The apparatus of claim 19, wherein a diagnosability metric is determined for all of said problems that may occur in the system.

21. The apparatus of claim 20, wherein the metric is weighted according to predicted failure in time rate.

22. The apparatus of claim 20, wherein the metric is weighted according to FRU cost.

23. The apparatus of claim 20, wherein the metric is weighted by FRU repair cost.

24. The apparatus of claim 20, wherein the metric is weighted by system downtime caused by a repair operation to fix the simulated problem.

25. A computer program product, comprising instructions for simulating the operation of a system comprising:
- providing a fault tree representation of the system, said fault tree defining a set of problems that may occur in the system, and specifying propagations of problems in the system whereby a problem may create one or more errors that may in turn be detected by one or more error detectors to produce corresponding error reports;
- simulating, using the fault tree representation, the presence of a problem in the system, and determining the set of error reports resulting from the simulated problem.

* * * * *